(12) United States Patent
Kimura et al.

(10) Patent No.: US 9,916,791 B2
(45) Date of Patent: Mar. 13, 2018

(54) DISPLAY DEVICE, ELECTRONIC DEVICE, AND METHOD FOR DRIVING DISPLAY DEVICE

(71) Applicant: Semiconductor Energy Laboratory Co., Ltd., Atsugi-shi, Kanagawa-ken (JP)

(72) Inventors: Hajime Kimura, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 5 days.

(21) Appl. No.: 15/095,552

(22) Filed: Apr. 11, 2016

(65) Prior Publication Data

US 2016/0307518 A1  Oct. 20, 2016

(30) Foreign Application Priority Data

Apr. 16, 2015  (JP) .................................. 2015-083860

(51) Int. Cl.
*G09G 3/32* (2016.01)
*G09G 3/3283* (2016.01)
(Continued)

(52) U.S. Cl.
CPC ......... *G09G 3/3283* (2013.01); *H01L 27/124* (2013.01); *H01L 27/1225* (2013.01);
(Continued)

(58) Field of Classification Search
CPC .. G09G 3/3283; G09G 3/3225; G09G 3/3233; G09G 3/3241; G09G 3/325;
(Continued)

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Tom Sheng
(74) *Attorney, Agent, or Firm* — Robinson Intellectual Property Law Office; Eric J. Robinson

(57) ABSTRACT

A novel display device is provided. In a display device with a 2T1C circuit configuration, a switch is provided between a current supply line and a transistor. The switch is turned off in a data voltage writing period to bring one of a source and a drain of the transistor into an electrically floating state. This configuration can prevent a potential rise on the anode side of a light-emitting element, thereby suppressing undesired light emission in the data voltage writing period.

16 Claims, 53 Drawing Sheets

(51) Int. Cl.
*H01L 27/12* (2006.01)
*H01L 29/786* (2006.01)

(52) U.S. Cl.
CPC ...... *H01L 27/1255* (2013.01); *H01L 29/7869* (2013.01); *G09G 2300/0426* (2013.01); *G09G 2300/0819* (2013.01); *G09G 2300/0842* (2013.01); *G09G 2310/06* (2013.01); *G09G 2320/0233* (2013.01); *G09G 2320/0247* (2013.01); *G09G 2320/045* (2013.01)

(58) Field of Classification Search
CPC ......... G09G 3/3258; G09G 2300/0426; G09G 2300/0819; G09G 2300/0842; G09G 2300/0809; G09G 2310/06; G09G 2320/0233; G09G 2320/0247; G09G 2320/045; G09G 2320/043; H01L 27/1225; H01L 27/124; H01L 27/1255; H01L 29/7869
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,580,094 B1 | 6/2003 | Yamazaki et al. |
| 6,727,522 B1 | 4/2004 | Kawasaki et al. |
| 6,815,901 B2 | 11/2004 | Koyama |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,088,052 B2 | 8/2006 | Kimura |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,332,742 B2 | 2/2008 | Miyake et al. |
| 7,365,713 B2 | 4/2008 | Kimura |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,456,810 B2 | 11/2008 | Kimura |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,035,109 B2 | 10/2011 | Kimura |
| 8,063,859 B2 | 11/2011 | Kimura |
| 8,305,306 B2 | 11/2012 | Kimura |
| 8,378,356 B2 | 2/2013 | Kimura |
| 8,659,027 B2 | 2/2014 | Kimura |
| 8,941,314 B2 | 1/2015 | Kimura |
| 8,994,029 B2 | 3/2015 | Kimura |
| 9,082,734 B2 | 7/2015 | Kimura |
| 9,099,036 B2 * | 8/2015 | Kitazawa ............ G09G 3/3233 |
| 9,165,505 B2 | 10/2015 | Miyazaki |
| 9,171,870 B2 | 10/2015 | Kimura |
| 9,401,111 B2 * | 7/2016 | Kishi .................. G09G 3/3233 |
| 9,449,549 B2 | 9/2016 | Kimura |
| 9,601,560 B2 | 3/2017 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang |
| 2005/0205880 A1 | 9/2005 | Anzai et al. |
| 2006/0028407 A1 * | 2/2006 | Chou .................. G09G 3/3233 345/76 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0170628 A1 * | 8/2006 | Yamashita ........... G09G 3/3233 345/76 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267884 A1 * | 11/2006 | Takahashi ............ G09G 3/3233 345/76 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0268210 A1 | 11/2007 | Uchino et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0030436 A1 | 2/2008 | Iida et al. |
| 2008/0030437 A1 | 2/2008 | Iida et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0198104 A1 * | 8/2008 | Yamashita ........... G09G 3/3233 345/77 |
| 2008/0224133 A1 | 9/2008 | Park et al. |
| 2008/0224621 A1 * | 9/2008 | Uchino ................ G09G 3/3233 315/169.3 |
| 2008/0246747 A1 | 10/2008 | Taneda et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0066616 A1 | 3/2009 | Uchino et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0219234 A1 | 9/2009 | Yamamoto et al. |
| 2009/0278122 A1 | 11/2009 | Hosono et al. |
| 2009/0280600 A1 | 11/2009 | Hosono et al. |
| 2009/0309865 A1 * | 12/2009 | Kohno ................ G09G 3/3233 345/213 |

(56) References Cited

U.S. PATENT DOCUMENTS

| | | | |
|---|---|---|---|
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0328278 A1* | 12/2010 | Ishiguro | G09G 3/3233 345/205 |
| 2011/0090208 A1* | 4/2011 | Long | G09G 3/3233 345/211 |
| 2011/0164016 A1* | 7/2011 | Kang | G09G 3/3233 345/211 |
| 2014/0035797 A1* | 2/2014 | Jinta | G09G 3/30 345/77 |
| 2014/0084932 A1* | 3/2014 | Chaji | G09G 3/3233 324/414 |
| 2014/0354622 A1* | 12/2014 | Qin | H05B 33/0896 345/212 |
| 2015/0145902 A1* | 5/2015 | Nakayama | G09G 3/3266 345/691 |
| 2015/0364496 A1 | 12/2015 | Kaneyasu | |
| 2016/0275863 A1 | 9/2016 | Kimura et al. | |
| 2017/0053594 A1 | 2/2017 | Kimura | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 4240059 | 3/2009 |
| JP | 2013-068957 A | 4/2013 |
| JP | 2013-092791 A | 5/2013 |
| JP | 5217500 | 6/2013 |
| JP | 5365734 | 12/2013 |
| WO | WO-2004/114391 | 12/2004 |
| WO | WO-2006/060902 | 6/2006 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

P14

P15

$V_{CP} = V_{TH} + \Delta V$ $\Delta V = (V_{DATA} - V_{G\text{-}INI}) \times (C_{EL}/C_{103} + C_{EL})$

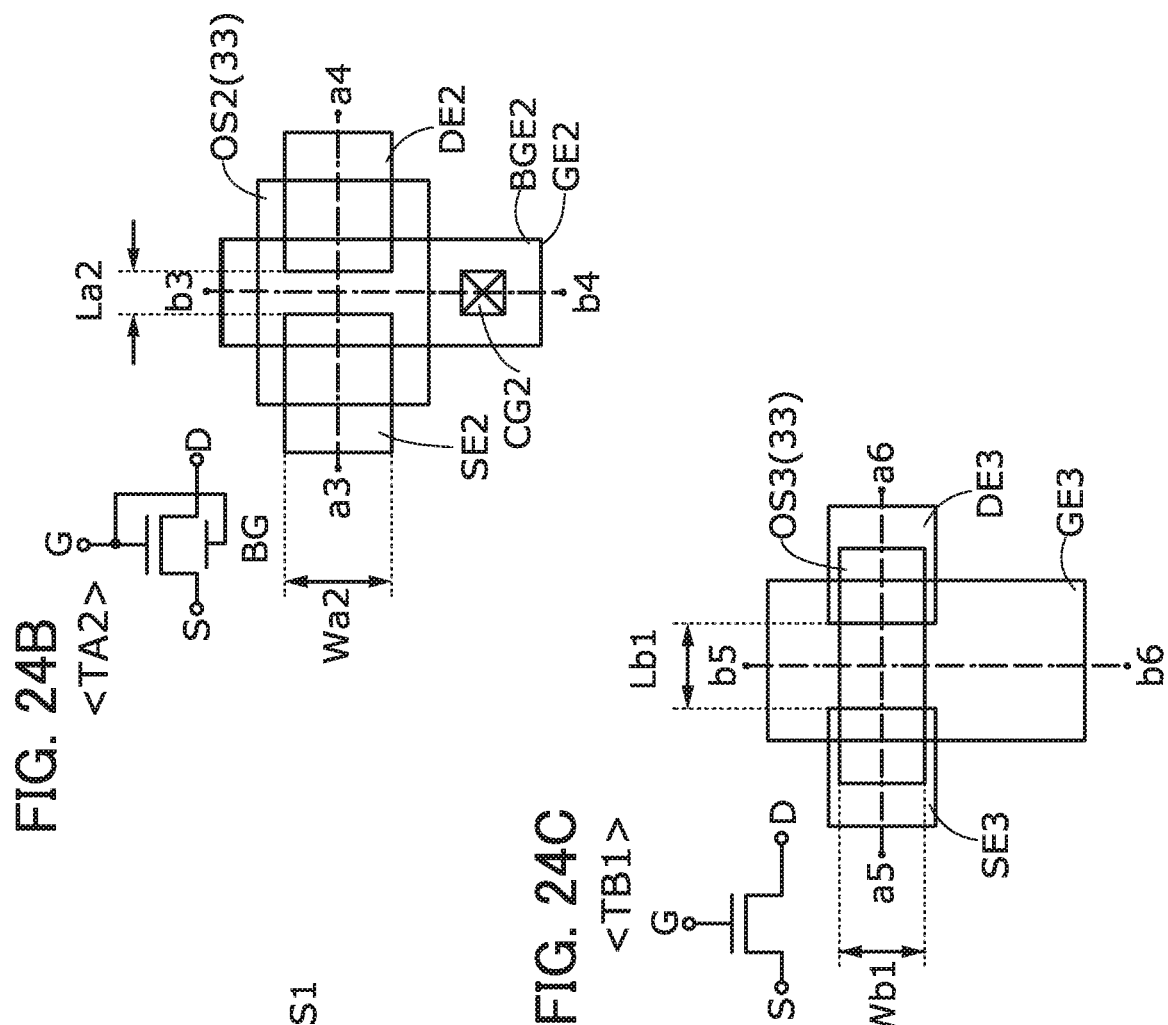
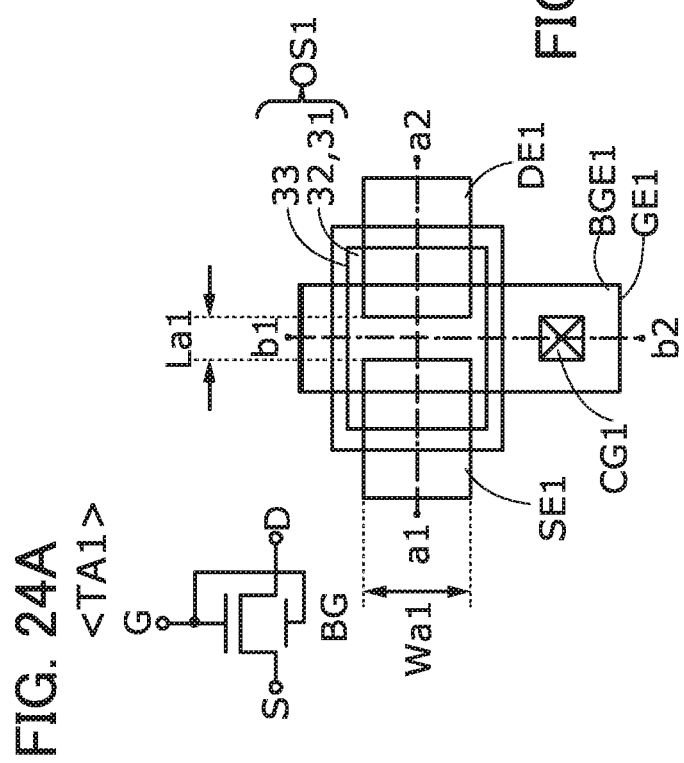
FIG. 24A <TA1>
FIG. 24B <TA2>
FIG. 24C <TB1>

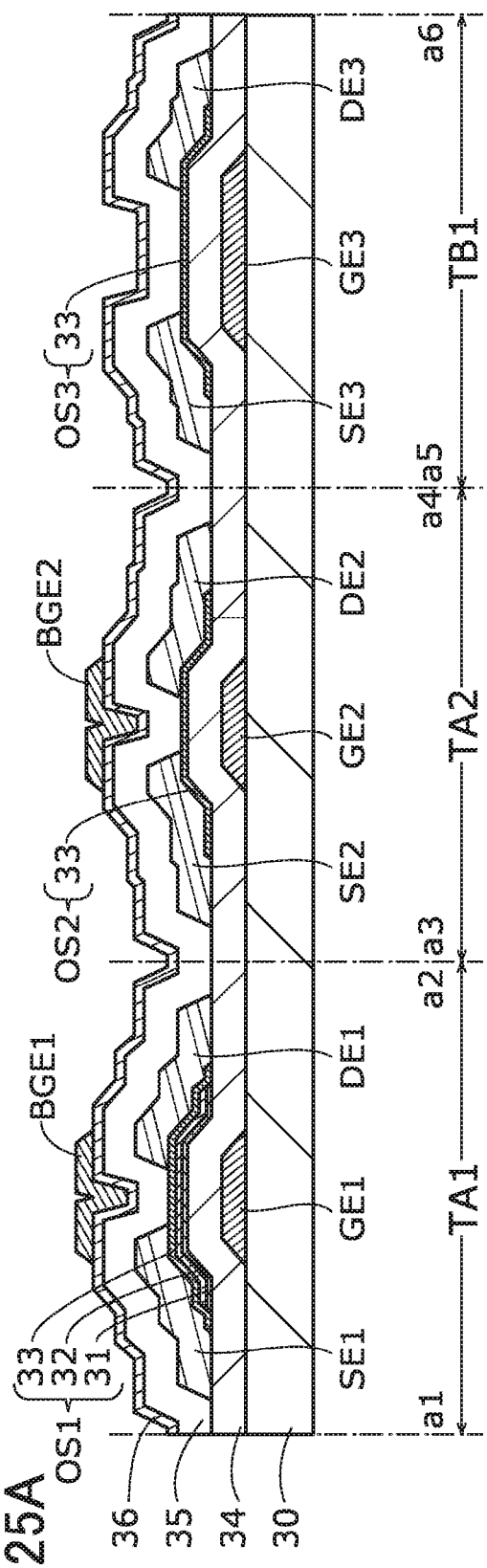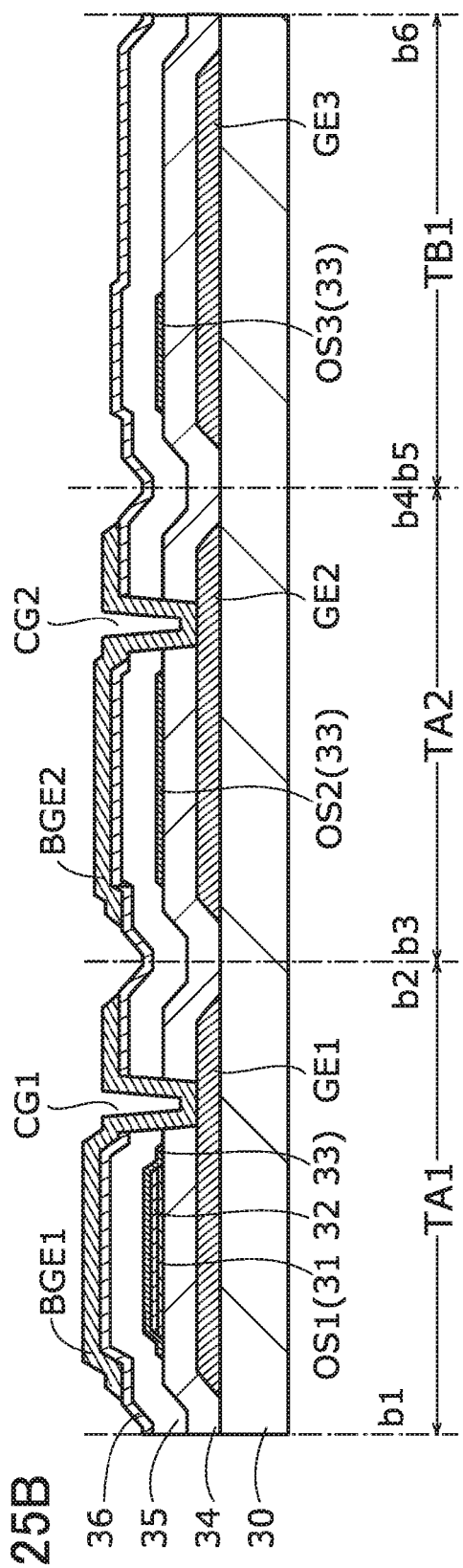

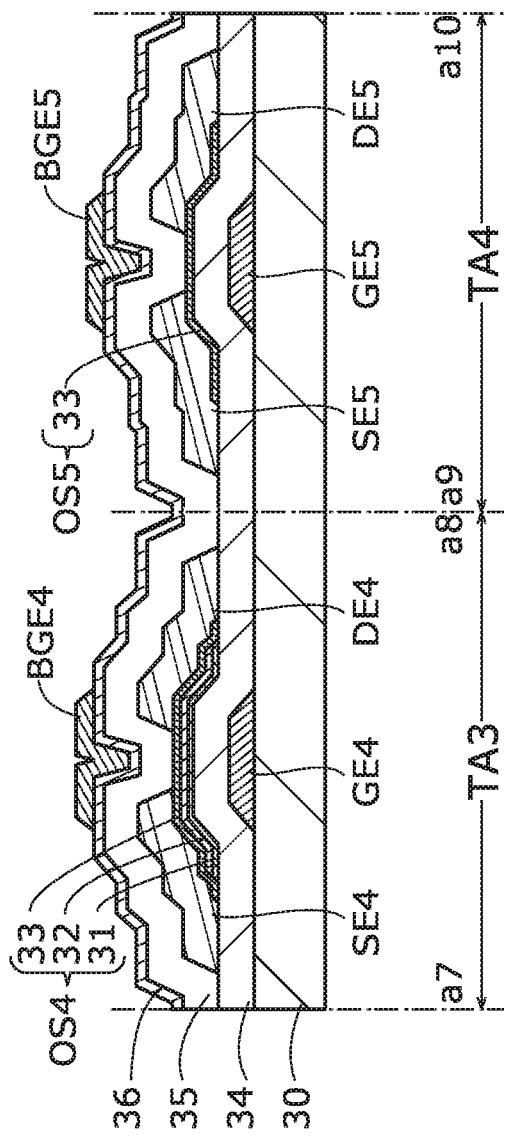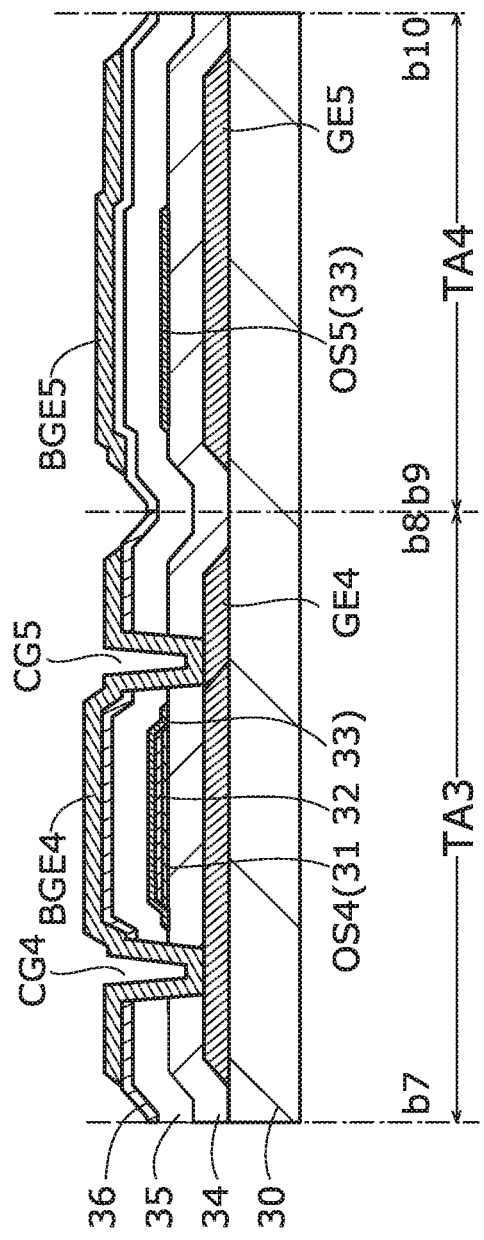

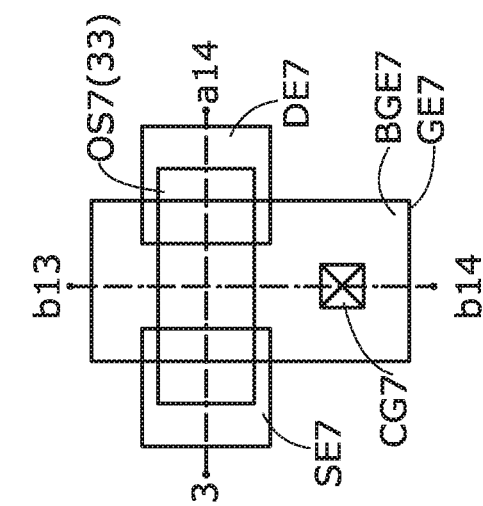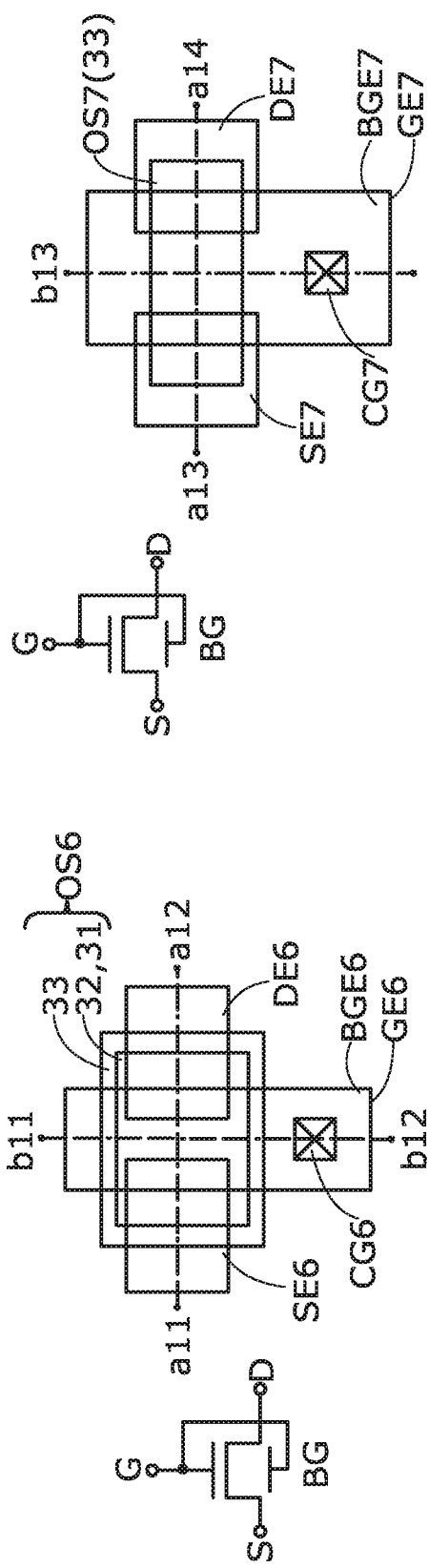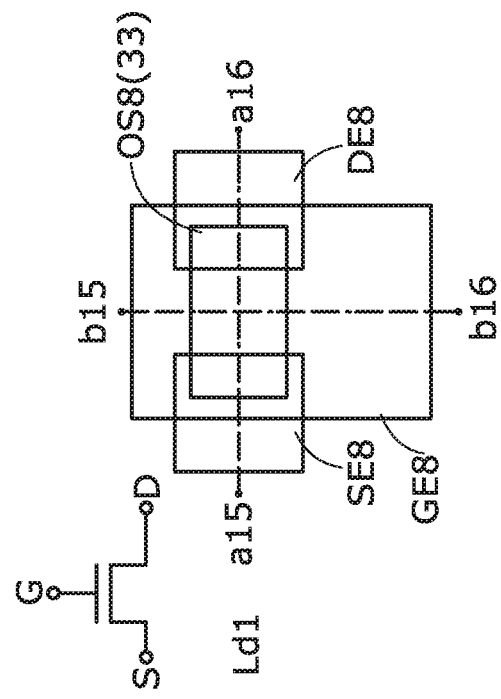
FIG. 28A <TC1>
FIG. 28B <TB2>
FIG. 28C <TD1>

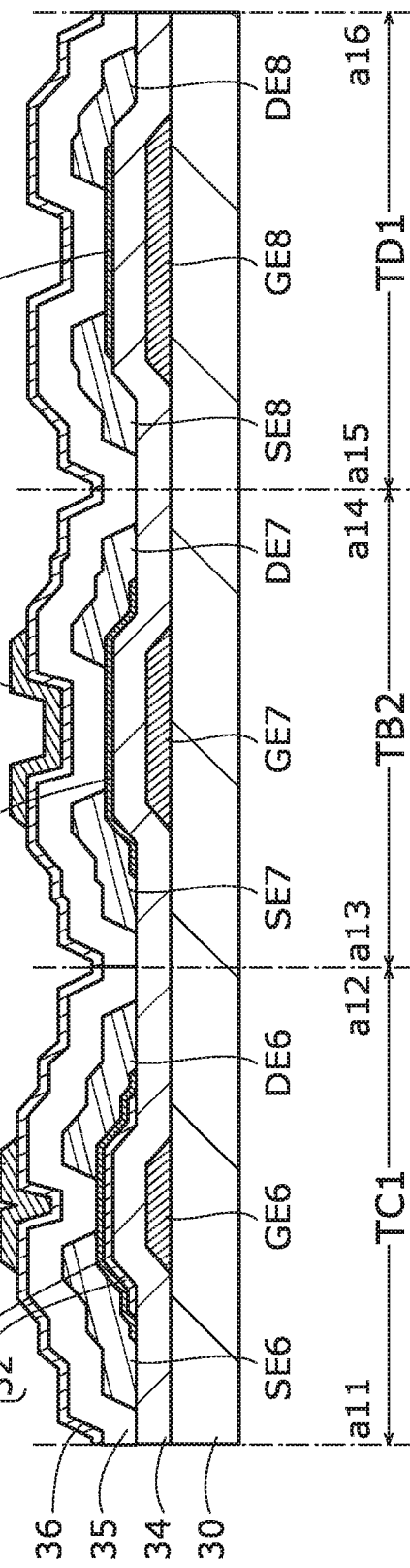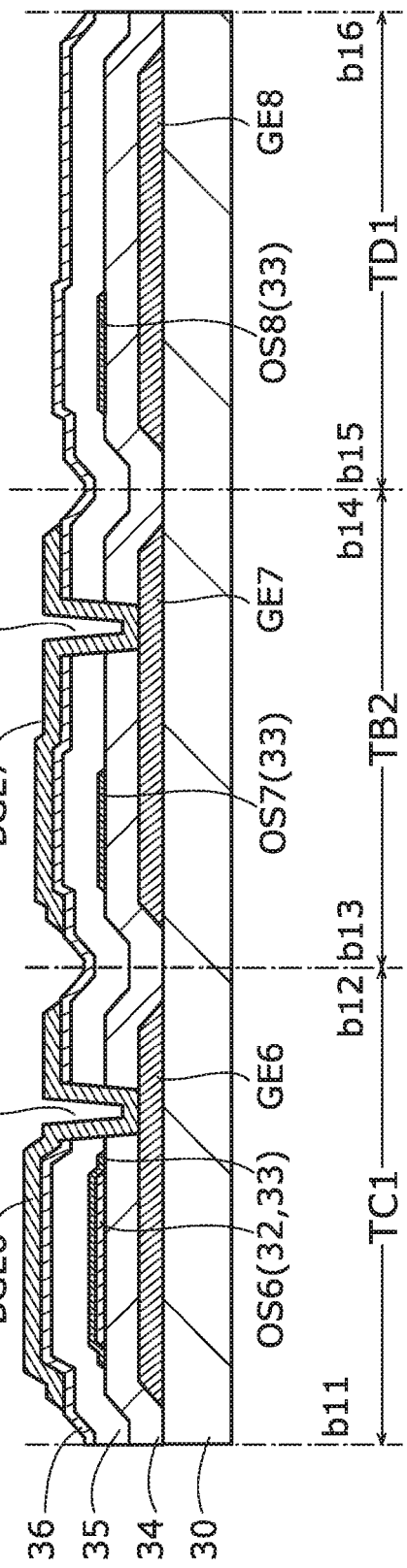

L1-L2 cross-sectional view

W1-W2 cross-sectional view

L1-L2 cross-sectional view

W1-W2 cross-sectional view

L1-L2 cross-sectional view

W1-W2 cross-sectional view

DISPLAY DEVICE, ELECTRONIC DEVICE, AND METHOD FOR DRIVING DISPLAY DEVICE

BACKGROUND OF THE INVENTION

1. Field of the Invention

One embodiment of the present invention relates to a display device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

Display devices including light-emitting elements typified by an electroluminescent element (hereinafter referred to as an EL element) have been actively developed.

For example, Patent Documents 1 to 4 each disclose a 2T1C circuit configuration in which one pixel includes two transistors and at least one capacitor.

REFERENCES

Patent Documents

[Patent Document 1] United States Patent Application Publication No. 2007/0268210
[Patent Document 2] United States Patent Application Publication No. 2009/0219234
[Patent Document 3] United States Patent Application Publication No. 2008/0030436
[Patent Document 4] PCT International Publication No. WO2006/060902

SUMMARY OF THE INVENTION

As mentioned above, a display device can have a variety of circuit configurations. Each configuration has advantages and disadvantages, and an appropriate configuration is selected depending on circumstances. Therefore, a proposal of a display device or the like having a novel configuration can expand the freedom of choice.

An object of one embodiment of the present invention is to provide a novel display device, a method for driving the novel display device, or the like.

Each of the 2T1C pixels disclosed in Patent Documents 1 to 4 has a mobility correction function which is obtained as follows: current is supplied to the transistor to adjust the voltage held between a gate and a source. The current supply to the transistor is performed by increasing the potential of a wiring (a current supply line) for supplying current to a light-emitting element. However, an increase in the potential of the current supply line in a correction period might cause undesired emission from the light-emitting element.

In view of the above description, an object of one embodiment of the present invention is to provide a display device or the like having a novel structure in which undesired emission from a light-emitting element in a correction period can be suppressed.

Note that objects of embodiments of the present invention are not limited to the aforementioned objects. The aforementioned objects do not disturb the existence of other objects. The other objects are the ones that are not mentioned above and will be described below. Those skilled in the art can easily and appropriately derive the objects that are not mentioned above from the description of the specification, the drawings, and the like. One embodiment of the present invention is to achieve at least one of the aforementioned objects and the other objects.

One embodiment of the present invention is a display device which includes a pixel including a first switch, a transistor, a capacitor, and a light-emitting element, a second switch, and a wiring electrically connected to one terminal of the second switch. A first electrode of the capacitor is electrically connected to a gate of the transistor. A second electrode of the capacitor is electrically connected to one of a source and a drain of the transistor and a first electrode of the light-emitting element. The other of the source and the drain of the transistor is electrically connected to the other terminal of the second switch. The wiring is configured to supply current to the light-emitting element. The first switch is configured to apply a data voltage to the gate of the transistor by being turned on. The second switch is configured to bring the other of the source and the drain of the transistor in an electrically floating state by being turned off in a period in which the data voltage is applied to the gate of the transistor.

In the display device of one embodiment of the present invention, a channel formation region of the transistor preferably includes an oxide semiconductor.

One embodiment of the present invention is a method for driving a display device which includes a pixel including a first switch, a transistor, a capacitor, and a light-emitting element, a second switch, and a wiring electrically connected to one terminal of the second switch. A first electrode of the capacitor is electrically connected to a gate of the transistor. A second electrode of the capacitor is electrically connected to one of a source and a drain of the transistor and a first electrode of the light-emitting element. The other of the source and the drain of the transistor is electrically connected to the other terminal of the second switch. The wiring is configured to supply current to the light-emitting element. The method includes first to third periods. In the first period, a threshold voltage of the transistor is held by the capacitor. In the second period, the sum of the threshold voltage and a voltage corresponding to a data voltage is held by the capacitor. In the third period, the light-emitting element emits light. In the second period, the second switch is turned off, so that the other of the source and the drain of the transistor is brought into an electrically floating state.

One embodiment of the present invention is a method for driving a display device which includes a pixel including a first switch, a transistor, a capacitor, and a light-emitting element, a second switch, and a wiring electrically connected to one terminal of the second switch. A first electrode of the capacitor is electrically connected to a gate of the transistor. A second electrode of the capacitor is electrically connected to one of a source and a drain of the transistor and a first electrode of the light-emitting element. The other of the source and the drain of the transistor is electrically connected to the other terminal of the second switch. The wiring is configured to supply current to the light-emitting element. The method includes first to third periods. In the first period, a threshold voltage of the transistor is held by the capacitor. In the second period, the sum of the threshold voltage and a voltage corresponding to a data voltage is held by the capacitor. In the third period, the light-emitting element emits light. In the first period, the second switch is turned on, so that a potential of the other of the source and the drain of the transistor becomes lower than a potential supplied to a second electrode of the light-emitting element. In the second period, the second switch is turned off, so that the other of the source and the drain of the transistor is brought into an electrically floating state.

It is preferable in the method for driving a display device of one embodiment of the present invention that, in the third period, the second switch be turned on, so that the potential of the other of the source and the drain of the transistor becomes higher than the potential supplied to the second electrode of the light-emitting element.

Note that other embodiments of the present invention are disclosed in the following embodiments and the drawings.

According to one embodiment of the present invention, a novel display device or the like can be provided.

According to another embodiment of the present invention, a display device or the like having a novel structure in which undesired emission from a light-emitting element in a correction period can be suppressed can be provided.

Note that effects of embodiments of the present invention are not limited to the aforementioned effects. The aforementioned effects do not disturb the existence of other effects. The other effects are the ones that are not mentioned above and will be described below. Those skilled in the art can easily and appropriately derive the effects that are not mentioned above from the description of the specification, the drawings, and the like. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

FIGS. 24A to 24C are each a top view for describing one embodiment of the present invention.

FIGS. 25A and 25B are cross-sectional views for describing one embodiment of the present invention.

FIGS. 27A and 27B are cross-sectional views for describing one embodiment of the present invention.

FIGS. 28A to 28C are each a top view for describing one embodiment of the present invention.

FIGS. 29A and 29B are cross-sectional views for describing one embodiment of the present invention.

DETAILED DESCRIPTION OF THE INVENTION

Figure 1A:
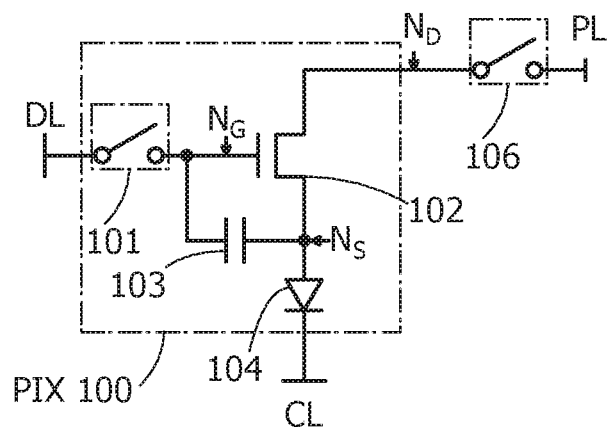
FIGS. 1A and 1B are a circuit diagram and a timing chart for describing one embodiment of the present invention.

Hereinafter, embodiments will be described with reference to the drawings. Note that embodiments can be carried out in many different modes, and it is easily understood by those skilled in the art that modes and details can be modified in various ways without departing from the spirit and the scope of the present invention. Therefore, the present invention should not be interpreted as being limited to the following description of the embodiments.

In this specification and the like, ordinal numbers such as "first", "second", and "third" are used in order to avoid confusion among components. Thus, the terms do not limit the number or order of components. For example, in this specification and the like, a "first" component in one embodiment can be referred to as a "second" component in another embodiment or a claim. As another example, in this specification and the like, a "first" component in one embodiment can be omitted in another embodiment or a claim.

In the drawings, the same elements, elements having similar functions, elements formed of the same material, elements formed at the same time, or the like are sometimes denoted by the same reference numerals, and description thereof is not repeated in some cases.

Embodiment 1

The configuration of a display device of one embodiment of the present invention will be described with reference to FIGS. 1A and 1B, FIG. 2, FIGS. 3A and 3B, FIGS. 4A and 4B, FIG. 5, FIG. 6, FIG. 7, FIGS. 8A and 8B, FIGS. 9A and 9B, FIGS. 10A to 10C, FIG. 11, FIGS. 12A and 12B, FIGS. 13A and 13B, FIGS. 14A to 14C, FIGS. 15A and 15B, FIGS. 16A to 16E, FIGS. 17A to 17C, FIG. 18, FIG. 19, FIGS. 20A and 20B, FIGS. 21A and 21B, FIGS. 22A and 22B, and FIG. 23.

<Pixel>

First, a pixel included in the display device will be described.

For example, the pixel described in this embodiment has a function of correcting variation in the threshold voltage of a transistor; such variation adversely affects a displayed image.

An example of a mechanism for correcting variation in threshold voltage will be briefly described below. First, a data voltage which has been written in the previous period and corresponds to a gray level to be displayed is initialized. That is, the data voltage is set such that a transistor is turned on (brought into a conducting state). Then, a capacitor holds the threshold voltage of the transistor or a voltage corresponding to the threshold voltage. Subsequently, the data voltage for the gray level to be displayed is added to the threshold voltage held by the capacitor. Finally, current is supplied to a light-emitting element in accordance with the sum of the threshold voltage and the data voltage. Such a mechanism can reduce the influence of the threshold voltage of a transistor on the current supplied to a light-emitting element.

The above-described operation sequence can be divided into, for example, an initialization period, a threshold voltage correction period, a data voltage writing period, and a light emission period. In each period, in many cases, a pixel is selected, and then, the voltages of a gate line, a data line, and a current supply line are switched to apply a predetermined voltage to the pixel.

In one embodiment of this embodiment, the current supply line is brought into an electrically floating state (Floating) in the data voltage writing period, for example. Alternatively, in the data voltage writing period, the current supply line is electrically disconnected from a circuit which has a function of supplying a voltage or the like to the current supply line. Then, a data voltage is applied in such a state. In the configuration of this embodiment, to bring the current supply line for supplying current to the light-emitting element into a floating state in a predetermined period, a switch is provided between the current supply line and the transistor included in the pixel, for example. In the data voltage writing period, the switch is turned off (brought into a non-conducting state) to form an electrically floating state. Such a configuration can suppress a potential rise of an anode of the light-emitting element regardless of the state of the transistor. Accordingly, undesired emission from the light-emitting element can be suppressed.

Next, an example of the circuit configuration of a pixel will be described.

FIG. 1A illustrates a pixel 100 of a display device of one embodiment of the present invention. The pixel 100 (denoted by PIX in the drawing) includes a switch 101, a transistor 102, a capacitor 103, and a light-emitting element 104. In FIG. 1A, a switch 106 is provided between a current supply line PL and the pixel 100. That is, as an example, the switch 106 is provided outside the pixel 100. Note that the display device includes a plurality of pixels. The pixel 100 is one of the plurality of pixels.

In FIG. 1A, a node $N_G$ refers to a gate of the transistor 102, a node $N_S$ refers to a node between the transistor 102 and the light-emitting element 104, and a node $N_D$ refers to a node between the transistor 102 and the switch 106. Note that the transistor 102 may also be referred to as a driver transistor.

One terminal of the switch 101 is connected to a data line DL, for example. The other terminal of the switch 101 is connected to the node $N_G$, for example. Note that the switch 101 may also be referred to as a first switch or a selection switch.

Examples of the function of the data line DL include, but not limited to, supplying (or transmitting) an initialization voltage in the initialization period and the threshold voltage correction period, supplying (or transmitting) a data voltage (also referred to as a video signal voltage, a video signal, or the like) to the pixel 100 in the data voltage writing period, and supplying (or transmitting) a precharge voltage to the pixel 100. The data line DL may be referred to simply as a wiring or a first wiring.

The data voltage supplied through the data line DL is a voltage at which the light-emitting element 104 can emit light at a desired gray level. The data voltage may be denoted by $V_{DATA}$.

The initialization voltage supplied through the data line DL is a voltage for initializing the voltage of each electrode of the capacitor 103 or for turning on the transistor 102. The initialization voltage may be denoted by $V_{G\text{-}INI}$.

The gate of the transistor 102 is connected to the node $N_G$. One of a source and a drain of the transistor 102 is connected to the node $N_S$. The other of the source and the drain of the transistor 102 is connected to the node $N_D$. Note that the source and the drain of the transistor are replaced with each other depending on their potentials. For example, the potential of the current supply line PL is higher than that of a cathode line CL in the light emission period; in this case, the source of the transistor 102 is connected to the node $N_S$. In the following description, the transistor 102 is an n-channel transistor. In addition, the threshold voltage of the transistor 102 is denoted by $V_{TH}$, for example.

One terminal of the switch 106 is connected to the node $N_D$. The other terminal of the switch 106 is connected to the current supply line PL, for example. Note that the switch 106 may also be referred to as a first switch or a second switch.

Examples of the function of the current supply line PL include, but not limited to, supplying an initialization voltage for initializing the voltage of each electrode of the capacitor 103 in the initialization period, supplying an initialization voltage for initializing the voltage of the node $N_S$ in the initialization period, supplying (or transmitting) a voltage for supplying current in accordance with the voltage between the gate and the source (also referred to as $V_{GS}$) of the transistor 102 in the threshold voltage correction period, and supplying a voltage for supplying current to the light-emitting element 104 in accordance with $V_{GS}$ of the transistor 102 in the light emission period. The current supply line PL may be referred to simply as a wiring, a first wiring, or the like.

The initialization voltage supplied through the current supply line PL is a voltage for initializing the voltage of each electrode of the capacitor 103 or for turning on the transistor 102. The initialization voltage may be denoted by $V_{P\text{-}INI}$. As an example, $V_{P\text{-}INI}$ is a voltage different from $V_{G\text{-}INI}$, but they can be the same voltage depending on circumstances.

For example, when the voltage for supplying current in accordance with $V_{GS}$ of the transistor 102 is supplied through the current supply line PL, the voltage held at each electrode of the capacitor 103 becomes equal to the threshold voltage of the transistor 102, so that the light-emitting element 104 emits light. The voltage for supplying current in accordance with $V_{GS}$ of the transistor 102 may be denoted by $V_{P\text{-}EMI}$.

Note that the voltage of the current supply line PL for making the light-emitting element 104 emit light may be different in level from that for acquiring the threshold voltage of the transistor 102. However, these voltages preferably have the same level because a circuit that supplies the voltages can have a simple configuration.

The cathode line CL is a wiring which has a function of supplying a constant voltage to an electrode of the light-emitting element 104 such that current flows through the light-emitting element 104, for example. The voltage supplied through the cathode line CL may be denoted by $V_{CS}$. Note that the function of the cathode line CL is not limited thereto. The cathode line CL may be referred to simply as a wiring, a first wiring, or the like.

One electrode of the capacitor 103 is connected to the node $N_G$. The other electrode of the capacitor 103 is connected to the node $N_S$.

One electrode of the light-emitting element 104 is connected to the node $N_S$. The other electrode of the light-emitting element 104 is connected to the cathode line CL through which $V_{CS}$ is supplied. Note that the capacitor 103 can be omitted in the case where the gate capacitance (parasitic capacitance) of the transistor 102 is utilized as in a pixel 100I, whose circuit diagram is shown as an example in FIG. 2.

<Operation of Pixel>

Next, an example of the operation of the pixel 100 in FIG. 1A will be described.

Figure 1B:
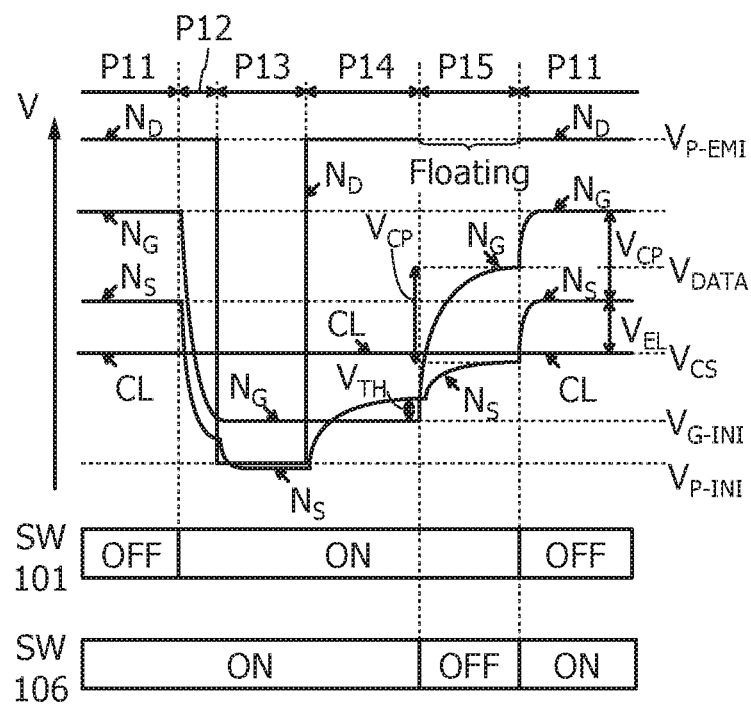
Figure 2:
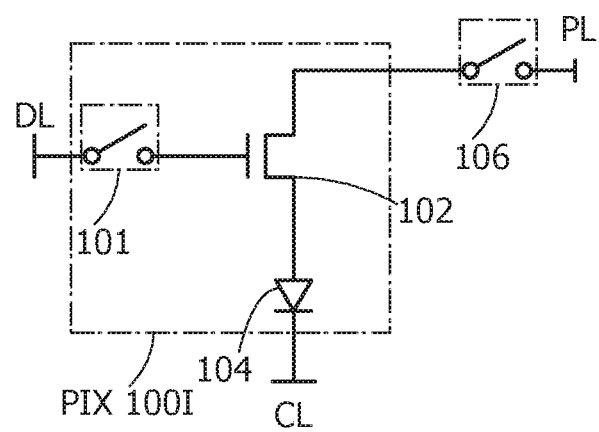
FIG. 2 is a circuit diagram for describing one embodiment of the present invention.

FIG. 1B shows an example of a timing chart of the operation of the pixel 100. FIGS. 3A and 3B, FIGS. 4A and 4B, and FIG. 5 show circuit diagrams illustrating the voltages of the wirings, the operation of the switches, and the voltages of the nodes in respective periods in FIG. 1B.

The timing chart in FIG. 1B includes a light emission period P11, an initialization period P12, an initialization completion period P13, a threshold voltage correction period P14, and a data voltage writing period P15. The initialization period P12 and the initialization completion period P13 correspond to the above-described initialization period.

Note that one embodiment of the present invention is not limited to the example shown here, in which the light emission period P11, the initialization period P12, the initialization completion period P13, the threshold voltage correction period P14, and the data voltage writing period P15 are provided. For example, one embodiment of the present invention may include a period that is different from these periods. Alternatively, for example, at least one of these periods may be omitted in one embodiment of the present invention. As an example, the initialization period P12 is not necessarily provided in the case where the transistor 102 is in an on state.

The timing chart in FIG. 1B illustrates an example of changes in the voltages of the node $N_D$, the cathode line CL, the node $N_G$, and the node $N_S$ in the above periods. FIG. 1B, in which the vertical axis represents the voltage, illustrates an example of the magnitude relationship between $V_{P\text{-}EMI}$, $V_{DATA}$, $V_{CS}$, $V_{G\text{-}INI}$, and $V_{P\text{-}INI}$ that the wirings and the nodes can have. FIG. 1B also illustrates the threshold voltage $V_{TH}$ of the transistor 102, a voltage $V_{CP}$ held at each electrode of the capacitor 103, and a voltage $V_{EL}$ applied between the electrodes of the light-emitting element 104. FIG. 1B also illustrates the on/off state of each of the switches 101 and 106. In the description of FIG. 1B, the transistor 102 is assumed to be normally on, that is, have a negative threshold voltage $V_{TH}$. Note that a normal operation can be performed regardless of whether the transistor 102 is normally on or normally off.

To show the changes in the voltages of the wirings and the nodes clearly, FIG. 1B separately illustrates even voltages which change at the same time or have the same potential. Therefore, the actual magnitude relationship between the voltages and the actual temporal order of the changes may be different from those in FIG. 1B.

Figure 3A:
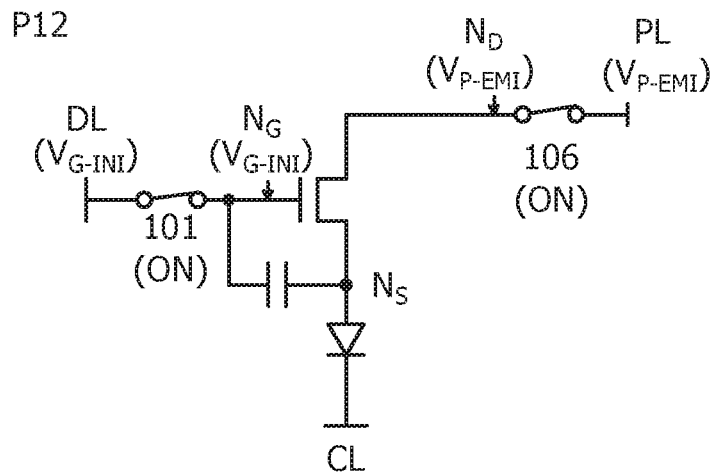
FIGS. 3A and 3B are circuit diagrams for describing one embodiment of the present invention.

In the initialization period P12, the voltage that has been held at the gate of the transistor 102 in the preceding light emission period P11 is initialized, the transistor 102 is turned on, or the voltage of the node $N_S$ is initialized. Therefore, in the case where the transistor 102 has already been turned on, the initialization period P12 may be omitted. For example, firstly, the switch 101 is turned on, so that the voltage of the node $N_G$ decreases to $V_{G\text{-}INI}$. Owing to capacitive coupling, the voltage of the node $N_S$ decreases together with the voltage of the node $N_G$. Although the voltage of the cathode line CL is kept at $V_{CS}$ after the initialization period P12, it may be changed depending on circumstances. Through the operation in the initialization period P12, the voltage of the node $N_G$ becomes $V_{G-INI}$. FIG. 3A illustrates the voltages of the wirings and the nodes at the end of the initialization period P12. In the initialization period P12, the switch 106 may also be in an off state.

Note that the operation in the initialization period P12 of one embodiment of the present invention is not limited to that described above. For example, in one embodiment of the present invention, various operations may be performed in the initialization period P12. Therefore, the initialization period P12 may be referred to simply as a period, a first period, or the like.

Figure 3B:
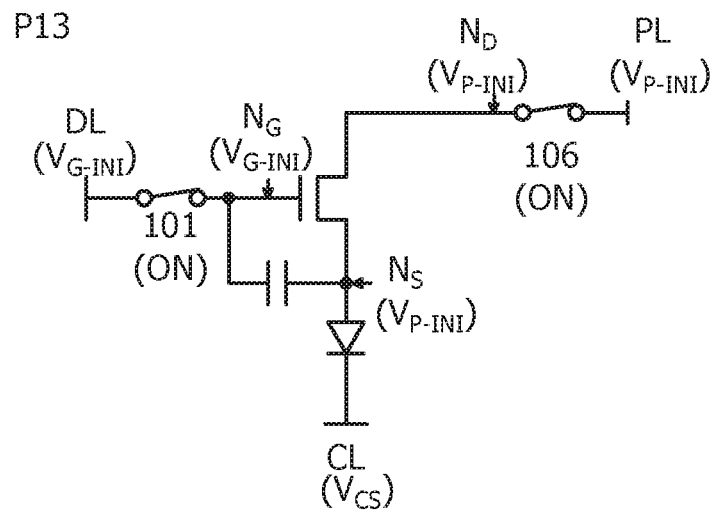

In the subsequent initialization completion period P13, the voltage held at the node $N_S$ is initialized. For example, the voltage of the current supply line PL is $V_{P-INI}$, and the switch 106 is in an on state. As current flows through the transistor 102 along with a decrease in the voltage of the node $N_D$, the voltage of the node $N_S$ further decreases. Through the operation in the initialization completion period P13, the voltage of the node $N_S$ becomes $V_{P-INI}$. FIG. 3B illustrates the voltages of the wirings and the nodes at the end of the initialization completion period P13.

Note that, for example, the voltage $V_{P-INI}$ is set lower than $V_{CS}$ to prevent current from flowing through the light-emitting element 104. The voltage $V_{G-INI}$ is set higher than $V_{P-INI}$, so that current flows through the transistor 102 and the voltage of the node $N_S$ can be initialized. However, depending on the threshold voltage of the transistor 102, current may flow through the transistor 102 even when the voltage of the node $N_S$ is higher than that of the node $N_G$. In such a case, the voltage of the node $N_S$ may be higher than that of the node $N_G$. In the initialization completion period P13, the switch 101 may also be in an off state.

Note that the operation in the initialization completion period P13 of one embodiment of the present invention is not limited to that described above. For example, in one embodiment of the present invention, various operations may be performed in the initialization completion period P13. Therefore, the initialization completion period P13 may be referred to simply as a period, a first period, or the like.

Figure 4A:
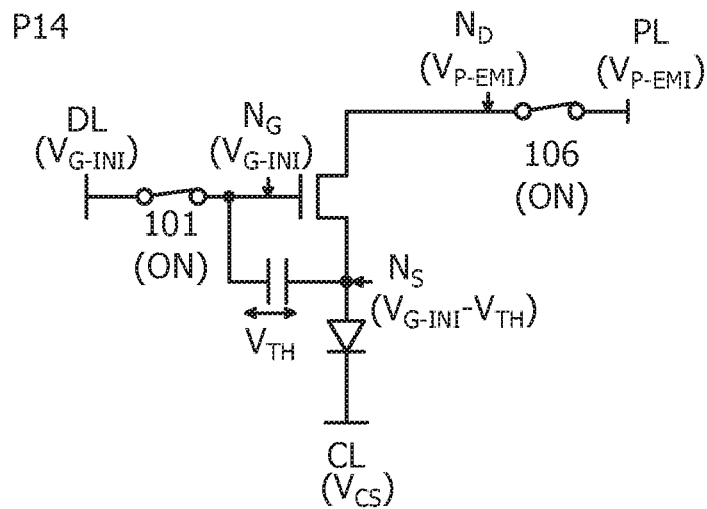
FIGS. 4A and 4B are circuit diagrams for describing one embodiment of the present invention.

In the subsequent threshold voltage correction period P14, $V_{TH}$ or a voltage corresponding to $V_{TH}$ is held at each electrode of the capacitor 103 as follows: current is supplied to the transistor 102 to increase the voltage of the node $N_S$. Note that there is no need to acquire the threshold voltage of the transistor 102 if variation in the characteristics of the transistor 102 is small or if the variation has a negligible influence as in the case where a moving image is displayed. Thus, the threshold voltage compensation period P13 does not need to be provided depending on circumstances. The voltage of the current supply line PL is $V_{P-EMI}$, and the switch 101 and the switch 106 are in an on state. The increase in the voltage of the node $N_D$ allows current to flow through the transistor 102, so that the voltage of the node $N_S$ increases and charge accumulated in the capacitor 103 is released. Since the switch 101 is in an on state, the voltage of the node $N_G$ does not change. The voltage of the node $N_S$ stops increasing when $V_{GS}$ of the transistor 102 becomes equal to $V_{TH}$ because current flowing through the transistor 102 decreases and then stops. In other words, the voltage of the node $N_S$ becomes a voltage ($V_{G-INI}-V_{TH}$). Thus, the voltage $V_{TH}$ is held by the capacitor 103. That is, $V_{TH}$ of the transistor 102 can be acquired. In the case where the transistor 102 is normally on, the voltage of the node $N_S$ is higher than that of the node $N_G$. Although the voltage of the node $N_S$ is the voltage ($V_{G-INI}-V_{TH}$), the actual voltage of the node $N_S$ is higher than that of the node $N_G$ because $V_{TH}$ is a negative value. In other words, such an operation can ensure the acquisition of the threshold voltage even if the transistor 102 is normally on. FIG. 4A illustrates the voltages of the wirings and the nodes at the end of the threshold voltage correction period P14. Note that the voltage of the current supply line PL is not limited to $V_{P-EMI}$ as long as the voltage of the current supply line PL is higher than the increased voltage of the node $N_S$, for example.

Although $V_{GS}$ of the transistor 102 becomes equal to $V_{TH}$ in the above description, charge accumulated in the capacitor 103 is not necessarily released until $V_{GS}$ becomes equal to $V_{TH}$. For example, the acquisition operation of the threshold voltage may be terminated when $V_{GS}$ of the transistor 102 is substantially close to $V_{TH}$. In this case, the acquired voltage corresponds to $V_{TH}$ of the transistor 102.

Note that the operation in the threshold voltage correction period P14 of one embodiment of the present invention is not limited to that described above. For example, in one embodiment of the present invention, various operations may be performed in the threshold voltage correction period P14. Therefore, the threshold voltage correction period P14 may be referred to simply as a period, a first period, or the like.

In the subsequent data voltage writing period P15, $V_{DATA}$ is supplied through the data line DL. The switch 101 is in an on state. The voltage of the node $N_G$ is changed from $V_{G-INI}$ to $V_{DATA}$. Meanwhile, the switch 106 is turned off. Accordingly, the node $N_D$ is brought into an electrically floating state (Floating). Owing to capacitive coupling of the capacitor 103, the voltage of the node $N_S$ changes along with the voltage of the node $N_G$.

Figure 6:
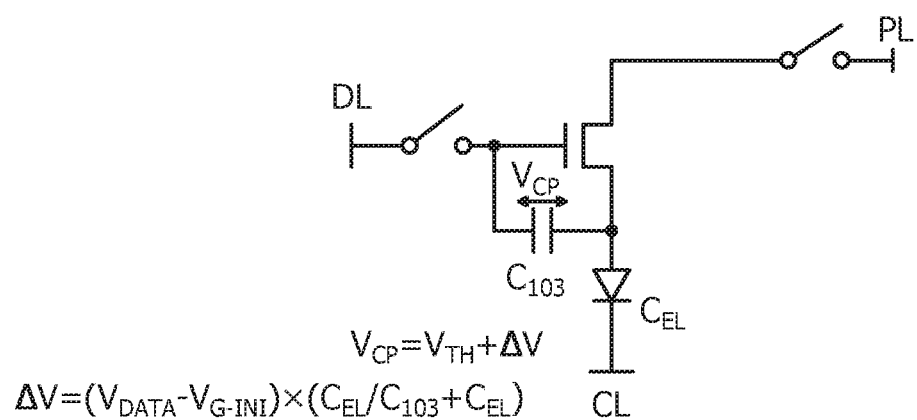
FIG. 6 is a circuit diagram for describing one embodiment of the present invention.

The voltage of the capacitor 103 is denoted by $V_{CP}$. The capacitance of the capacitor 103 is denoted by $C_{103}$. The capacitance of the light-emitting element 104 is denoted by $C_{EL}$. FIG. 6 illustrates the relationship between the voltages and capacitances of the elements. The voltage $V_{CP}$ held at each electrode of the capacitor becomes ($V_{TH}+\Delta V$) owing to the capacitive coupling, where $\Delta V$ is the product of the amount of change in the voltage of the node $N_G$ ($V_{DATA}-V_{G-INI}$) and the capacitance ratio of the light-emitting element 104 to the capacitor 103 ($C_{EL}/(C_{103}+C_{EL})$).

Figure 4B:
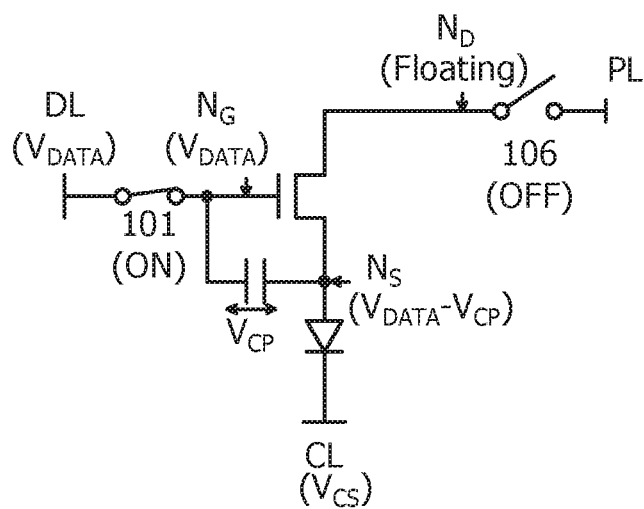

In other words, the voltage of the node $N_S$ increases to ($V_{DATA}-V_{CP}$) in the data voltage writing period P15; however, this increase can be suppressed by increasing the capacitance $C_{EL}$ of the light-emitting element 104. Since the node $N_D$ is in an electrically floating state in the data voltage writing period P15, current does not flow from the current supply line PL through the transistor 102 to the light-emitting element 104 even when the voltage of the node $N_S$ increases. Thus, undesired emission from the light-emitting element 104 can be suppressed. FIG. 4B illustrates the voltages of the wirings and the nodes at the end of the data voltage writing period P15.

Note that the operation in the data voltage writing period P15 of one embodiment of the present invention is not limited to that described above. For example, in one embodiment of the present invention, various operations may be performed in the data voltage writing period P15. Therefore, the data voltage writing period P15 may be referred to simply as a period, a first period, or the like.

In the configuration of this embodiment, the switch 106 is in an off state and the node $N_D$ is in an electrically floating state in the data voltage writing period P15. Therefore, the voltage change of the node $N_S$ in the data voltage writing period can be suppressed. Thus, undesired emission from the light-emitting element 104 can be suppressed. Even if the data voltage writing period P15 is long, the voltage change of the node $N_S$ can be suppressed because the node $N_D$ is in an electrically floating state.

If the switch 106 is in an on state in the data voltage writing period P15, current flows from the current supply line PL through the transistor 102 to the node $N_S$. As a result, the potential of the node $N_S$ rises. If the data voltage writing period P15 is long in this situation, the potential of the node $N_S$ keeps rising until the voltage of the capacitor 103 becomes equal to $V_{TH}$. Consequently, the transistor 102 is turned off, so that the supplied $V_{DATA}$ is lost. Accordingly, the switch 106 is preferably in an off state in the data voltage writing period P15. Note that one embodiment of the present invention is not limited thereto.

Figure 5:
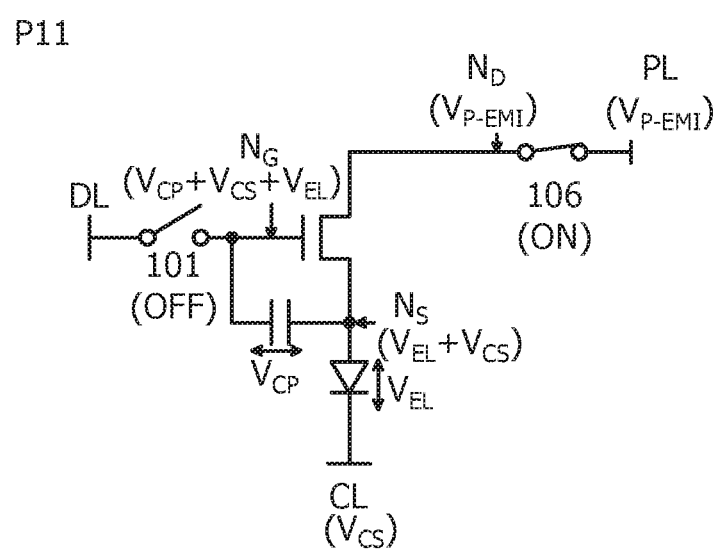
FIG. 5 is a circuit diagram for describing one embodiment of the present invention.

In the subsequent light emission period P11, the voltage of the current supply line PL is set to $V_{P-EMI}$, the switch 106 is turned on, and the switch 101 is turned off. Since the node $N_G$ is in a floating state when the voltage is supplied to the node $N_D$, current flows through the transistor 102 and the voltage of the node $N_S$ increases. Furthermore, since the node $N_G$ is in a floating state, the voltage of the node $N_G$ increases together with the voltage of the node $N_S$. The voltage $V_{GS}$ of the transistor remains $V_{CP}$ that has been set in the data voltage writing period. Since $V_{CP}$ is a voltage obtained by adding a term including $V_{DATA}$ to $V_{TH}$, current corresponding to $V_{DATA}$ can be supplied to the light-emitting element 104 regardless of the level of $V_{TH}$. That is, the influence of variation in $V_{TH}$ can be reduced. The voltage of the node $N_S$ becomes a voltage ($V_{EL}+V_{CS}$), which is higher than $V_{CS}$ by $V_{EL}$. The voltage of the node $N_G$ becomes a voltage ($V_{CP}+V_{CS}+V_{EL}$), which is higher than ($V_{EL}+V_{CS}$) by $V_{CP}$. FIG. 5 illustrates the voltages of the wirings and the nodes at the end of the light emission period P11.

Note that the operation in the light emission period P11 of one embodiment of the present invention is not limited to that described above. For example, in one embodiment of the present invention, various operations may be performed in the light emission period P11. Therefore, the light emission period P11 may be referred to simply as a period, a first period, or the like.

In the above-described configuration of one embodiment of the present invention, the switch 106 is connected to the source or the drain of the transistor 102, namely, the terminal positioned on the current supply line PL side. The switch 106 is turned off in the data voltage writing period to electrically disconnect the pixel 100 from the current supply line PL, whereby the wiring for supplying current to the pixel 100 is brought into an electrically floating state. This configuration can suppress an increase in the voltage of the node $N_S$, which is on the anode side of the light-emitting element, thereby suppressing undesired light emission in the data voltage writing period. Note that one embodiment of the present invention is not limited thereto.

<Modification Examples of Pixel>

Next, modification examples of the circuit configuration of a pixel in FIG. 1A will be described.

Figure 7:
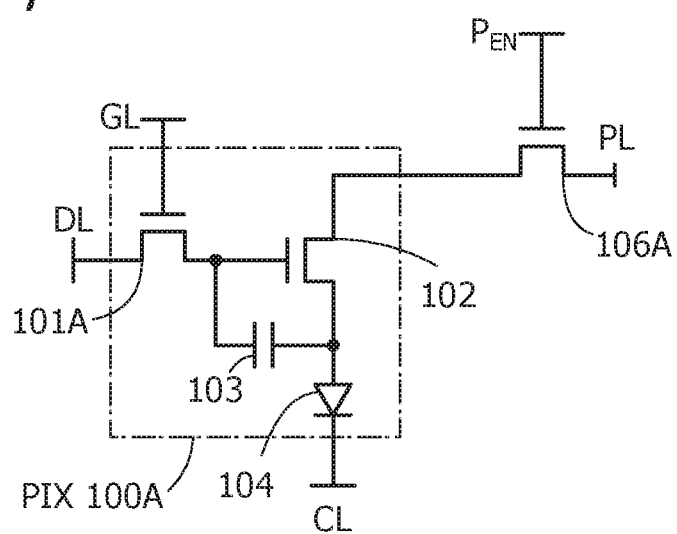
FIG. 7 is a circuit diagram for describing one embodiment of the present invention.

Transistors can be used as the switch 101 and the switch 106 which are included in the pixel 100 in FIG. 1A. FIG. 7 illustrates a circuit diagram in this case. A pixel 100A in FIG. 7 includes a transistor 101A instead of the switch 101 in FIG. 1A. Note that the transistor 101A can be turned on or off by the potential supplied through a gate line GL. The transistor 101A may also be referred to as a selection transistor.

FIG. 7 illustrates a transistor 106A instead of the switch 106. Note that the transistor 106A can be turned on or off by the potential supplied through a power supply control line $P_{EN}$.

Each of the transistors 101A and 106A is preferably a transistor including an oxide semiconductor in a channel formation region (OS transistor), for example. The off-state current of the OS transistor can be low. Therefore, variation in the potential of the node $N_G$ can be reduced by turning off the transistor 101A functioning as a switch. Furthermore, variation in the potential of the node $N_D$ can be reduced by turning off the transistor 106A functioning as a switch. Alternatively, each of the transistors 101A and 106A may be a transistor including silicon in a channel formation region (Si transistor). It is preferable that the transistor 102 also be a transistor including an oxide semiconductor in a channel formation region (OS transistor). Note that one embodiment of the present invention is not limited thereto. For example, the transistor 102 may also be a transistor including silicon in a channel formation region (Si transistor). The channel formation region of the Si transistor may be formed using polycrystalline silicon, amorphous silicon, or single crystal silicon.

Figure 8A:
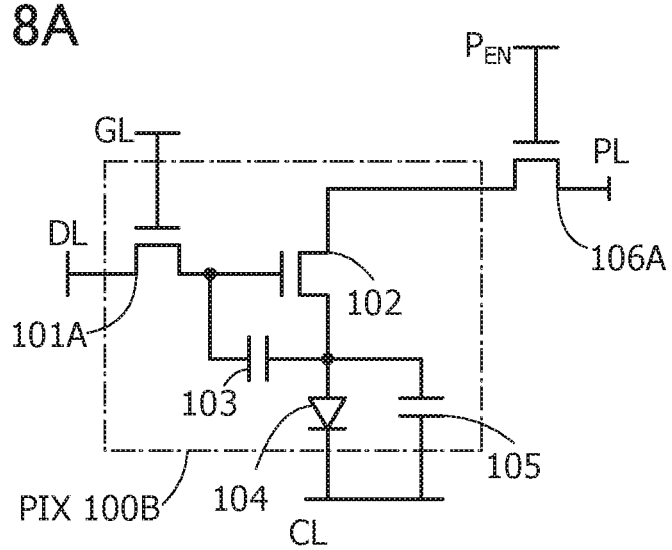
FIGS. 8A and 8B are each a circuit diagram for describing one embodiment of the present invention.

For example, the pixel 100 in FIG. 1A preferably includes a capacitor in parallel to the light-emitting element 104. FIG. 8A illustrates a circuit diagram in this case. A pixel 100B in FIG. 8A includes a capacitor 105 in addition to the components in FIG. 1A.

The above-described embodiment of the present invention utilizes the capacitance ratio of the light-emitting element 104 to the capacitor 103. If the capacitance of the capacitor 103 is larger than that of the light-emitting element 104, the potential of the node $N_S$ might increase too much in the data voltage writing period P15, resulting in undesired emission from the light-emitting element. To prevent this, the capacitor 105 is preferably provided. Note that the configuration in FIG. 8A is preferable because the capacitor can be provided without increasing the number of wirings.

Figure 8B:
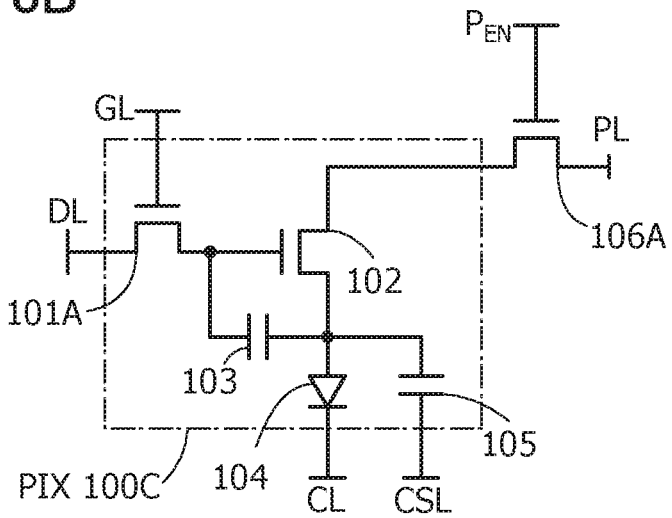

An additional capacitor line may be provided for the capacitor 105. FIG. 8B illustrates a circuit diagram in this case. A pixel 100C in FIG. 8B includes, in addition to the components in FIG. 8A, a capacitor line CSL connected to one electrode of the capacitor 105.

Although the number of wirings is increased, the configuration in FIG. 8B can be easily obtained without a complicated step, such as a step of connecting a cathode of the light-emitting element 104 to an electrode layer of the transistor 102.

Figure 9A:
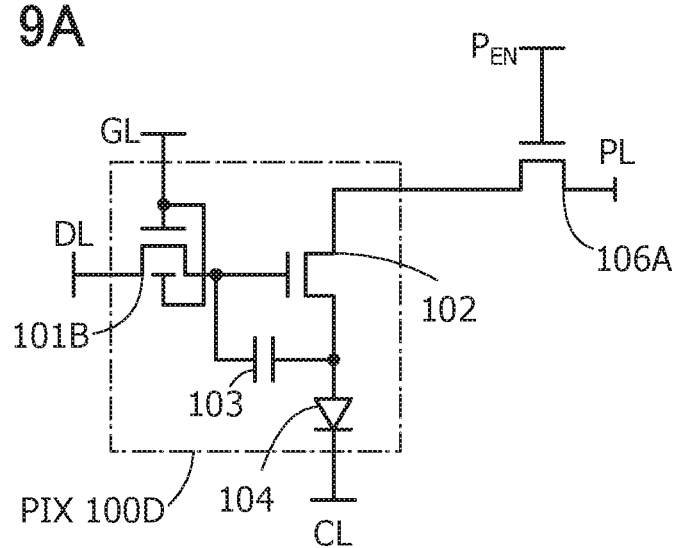
FIGS. 9A and 9B are each a circuit diagram for describing one embodiment of the present invention.

FIG. 9A illustrates a pixel 100D as a modification example of the pixel 100A in FIG. 7. In the pixel 100D, a transistor 101B having a backgate functions as a switch. Note that the transistor 106A can have a structure similar to that of the transistor 101B.

Figure 9B:
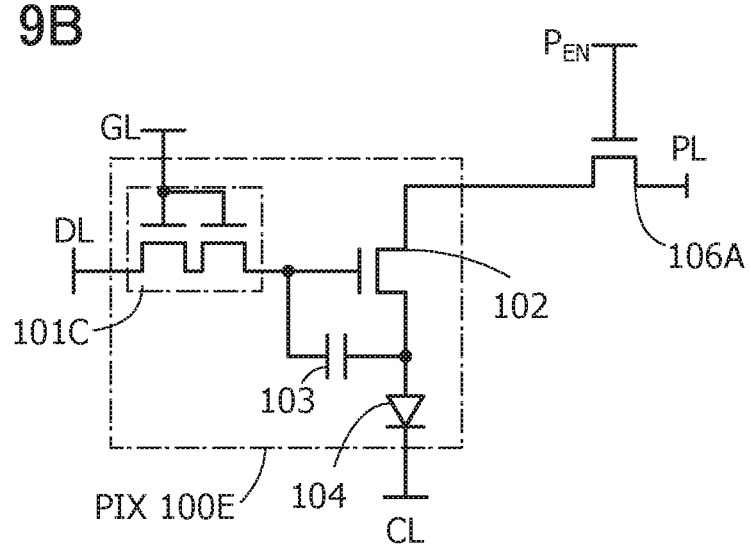

FIG. 9B illustrates a pixel 100E as a modification example of the pixel 100A in FIG. 7. In the pixel 100E, a series-connected transistor 101C functions as a switch. Note that the transistor 106A can have a structure similar to that of the transistor 101C.

Figure 10A:
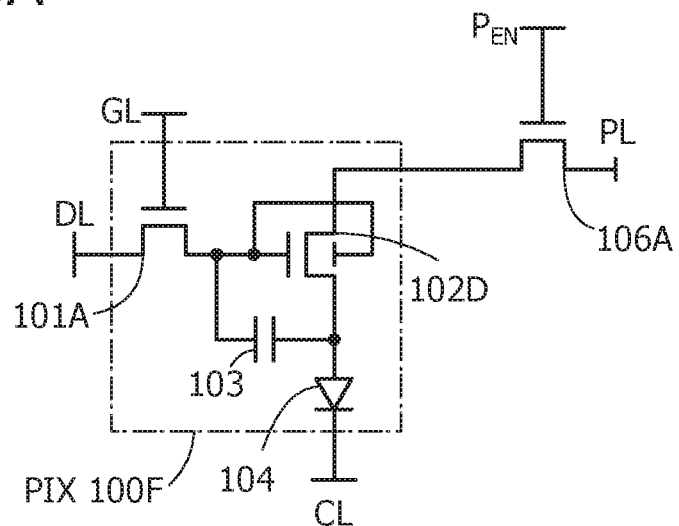
FIGS. 10A to 10C are each a circuit diagram for describing one embodiment of the present invention.

FIG. 10A illustrates a pixel 100F as a modification example of the pixel 100A in FIG. 7. The pixel 100F includes a transistor 102D having a backgate instead of the transistor 102. The gates of the transistor 102D are supplied with the same potential.

Figure 10B:
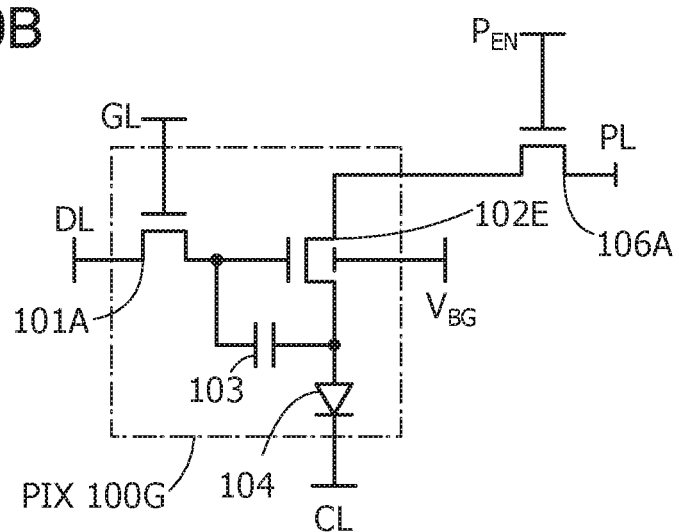

FIG. 10B illustrates a pixel 100G as a modification example of the pixel 100A in FIG. 7. The pixel 100G includes a transistor 102E having a backgate instead of the transistor 102. The gates of the transistor 102E are supplied with different potentials. A voltage $V_{BG}$ is applied to the backgate to control the threshold voltage of the transistor 102E.

Figure 10C:
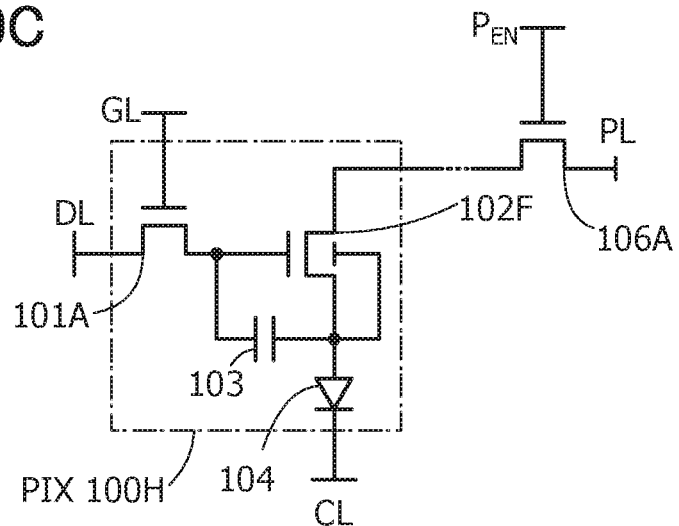
Figure 11:
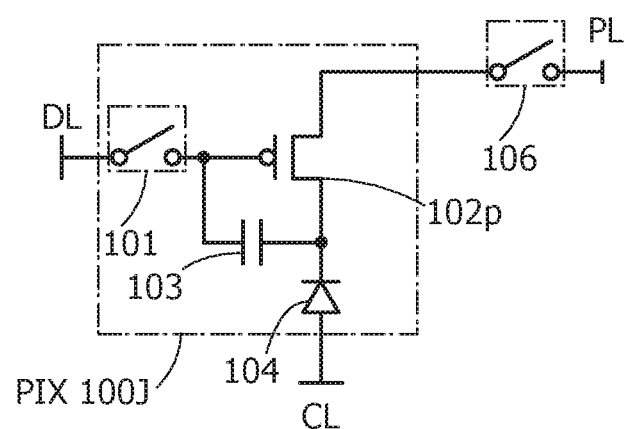
FIG. 11 is a circuit diagram for describing one embodiment of the present invention.

FIG. 10C illustrates a pixel 100H as a modification example of the pixel 100A in FIG. 7. The pixel 100H includes a transistor 102F having a backgate instead of the transistor 102. The gates of the transistor 102F are supplied with different potentials. The voltage of the node $N_S$ is applied to the backgate.

Although the transistor 102 in the pixel 100 in FIG. 1A is an n-channel transistor, one embodiment of the present invention is not limited thereto. A pixel 100J in FIG. 11 has a configuration different from that of the pixel 100 in FIG. 1A in that a p-channel transistor 102p is provided instead of the transistor 102.

Figure 12A:
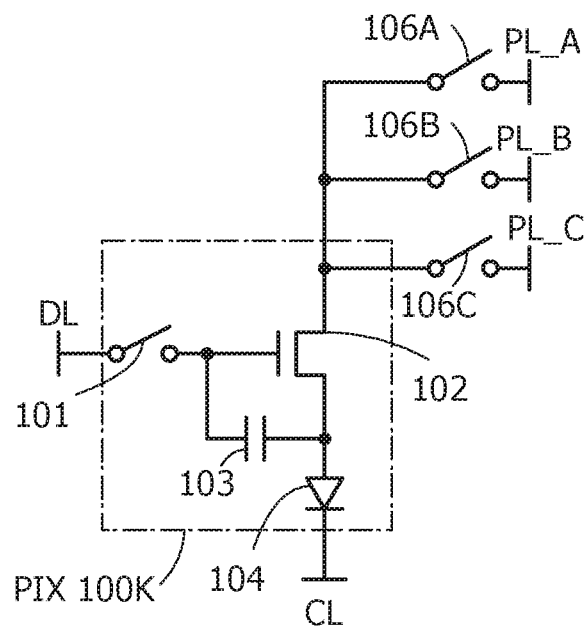
FIGS. 12A and 12B are each a circuit diagram for describing one embodiment of the present invention.

Although the transistor 102 is connected to the current supply line PL via the switch 106, one embodiment of the present invention is not limited thereto. For example, a pixel 100K in FIG. 12A has a configuration different from that of the pixel 100 in FIG. 1A. In FIG. 12A, the transistor 102 is connected to separate wirings, namely, a current supply line PL_A via a switch 106F, a current supply line PL_B via a switch 106B, and a current supply line PL_C via a switch 106C. The voltages $V_{P-EMI}$, $V_{CS}$, and $V_{P-INI}$ are supplied through the current supply lines PL_A, PL_B, and PL_C, respectively, and the switches 106F, 106B, and 106C are turned on or off as appropriate; thus, the level of the voltage applied to the transistor 102 can be controlled. These switches enable operation similar to that of the pixel 100 without changing the potentials of the current supply lines PL_A, PL_B, and PL_C.

Figure 12B:
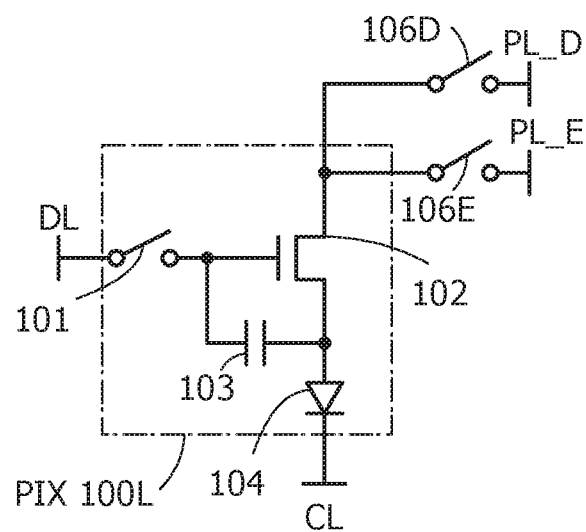

Although the pixel 100K in FIG. 12A has a configuration in which different voltages are supplied through the current supply lines PL_A, PL_B, and PL_C, a wiring for supplying a constant voltage and a wiring for supplying different voltages may be separately provided. FIG. 12B illustrates a circuit diagram of a pixel in this case. In a pixel 100L in FIG. 12B, the transistor 102 is connected to separate wirings, namely, a current supply line PL_D via a switch 106D and a current supply line PL_E via a switch 106E. The voltage $V_{P-EMI}$ is supplied through the current supply line PL_D and the voltage $V_{CS}$ or $V_{P-INI}$ is supplied through the current supply line PL_E, and the switches 106D and 106E are turned on or off as appropriate; thus, the level of the voltage applied to the transistor 102 can be controlled.

Figure 13A:
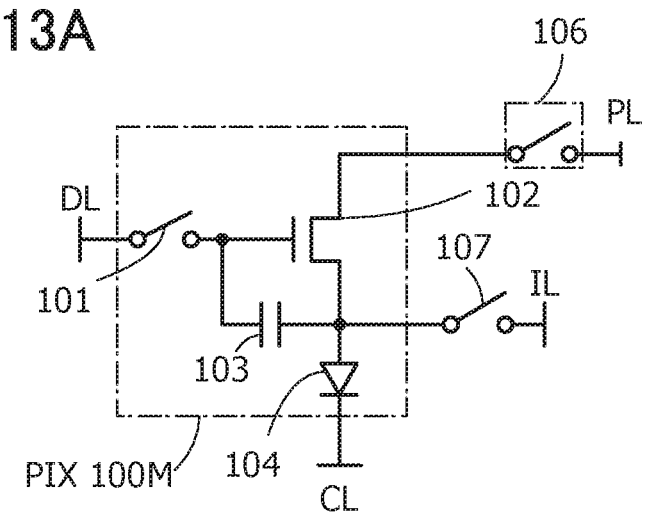
FIGS. 13A and 13B are each a circuit diagram for describing one embodiment of the present invention.

Note that a pixel 100M in FIG. 13A has a configuration different from that of the pixel 100 in FIG. 1A. In FIG. 13A, the node $N_S$ is connected to a wiring IL via a switch 107. The initialization voltage $V_{P-INI}$ is supplied through the wiring IL. The switch 107 is in an on state at least in the initialization period P12, so that the voltage of the node $N_S$ can be kept low without lowering the voltage of the current supply line PL. The switch 107 is preferably in an off state in periods other than the initialization period P12. Note that one embodiment of the present invention is not limited thereto.

Figure 13B:
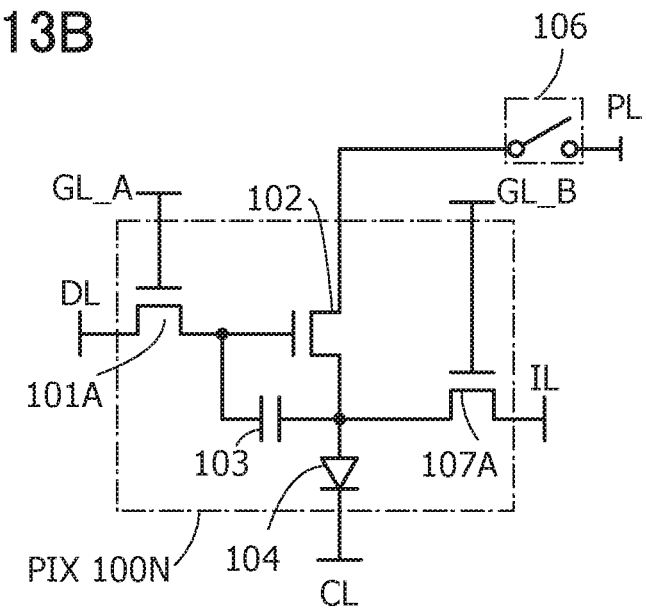

Note that the switches 101 and 107 in the pixel 100M in FIG. 13A can be replaced with transistors. FIG. 13B illustrates a circuit diagram of a pixel in this case. A pixel 100N in FIG. 13B includes the transistor 101A and a transistor 107A. The transistor 101A and the transistor 107A can be controlled by a gate line GL_A and a gate line GL_B, respectively.

Figure 14A:
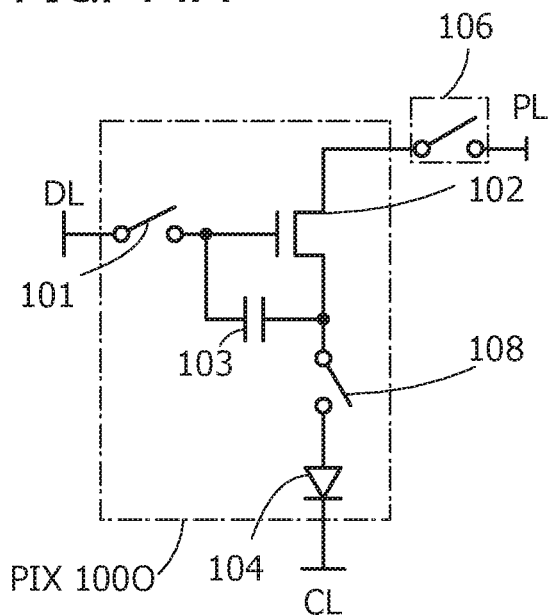
FIGS. 14A to 14C are each a circuit diagram for describing one embodiment of the present invention.

A pixel 100O in FIG. 14A has a configuration different from that of the pixel 100 in FIG. 1A. As illustrated in FIG. 14A, a switch 108 may be provided between the node $N_S$ and the light-emitting element 104. For example, the switch 108 may be in an off state at least in one period except the light emission period P11 and in an on state at least in the light emission period P11. As an example, the switch 108 may be in an on state in the data voltage writing period P15. Thus, undesired emission from the light-emitting element 104 can be suppressed. Note that the switch 108 may be in an on state in the initialization completion period P13 as well.

Figure 14B:
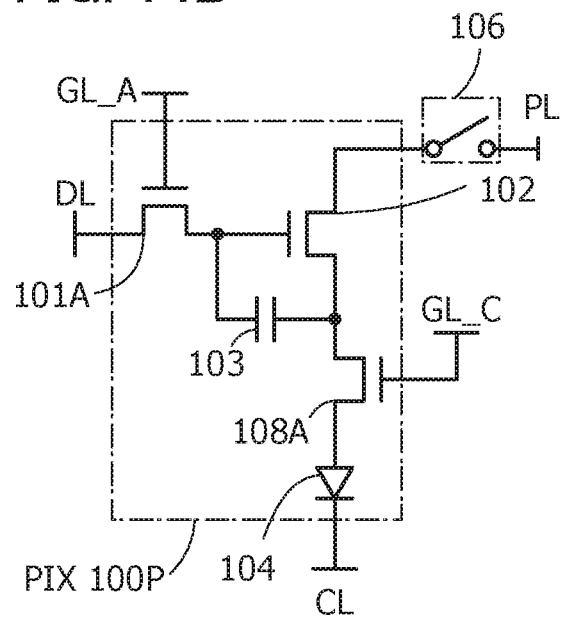

Note that the switches 101 and 108 in the pixel 100O in FIG. 14A can be replaced with transistors. FIG. 14B illustrates a circuit diagram of a pixel in this case. A pixel 100P in FIG. 14B includes the transistor 101A and a transistor 108A. The transistor 101A and the transistor 108A can be controlled by the gate line GL_A and a gate line GL_C, respectively.

Figure 14C:
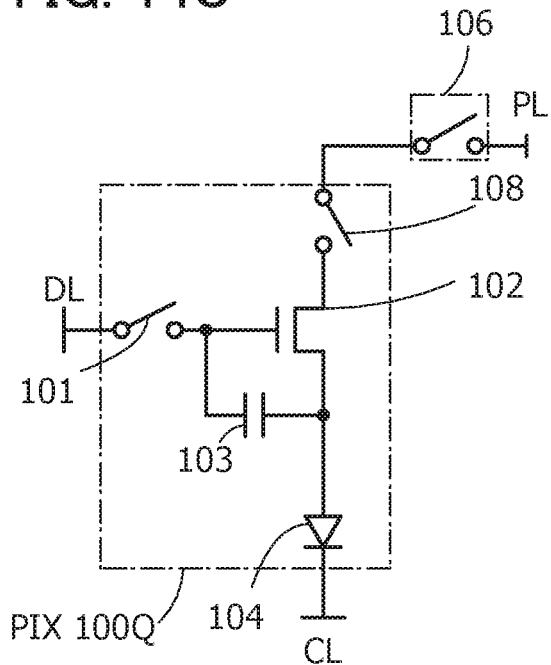

A pixel 100Q in FIG. 14C has a configuration different from that of the pixel 100O in FIG. 14A. In FIG. 14C, the switch 108 is provided not between the node $N_S$ and the light-emitting element 104 but between the transistor 102 and the switch 106.

In such a configuration, the switch can be controlled in each pixel.

Figure 15A:
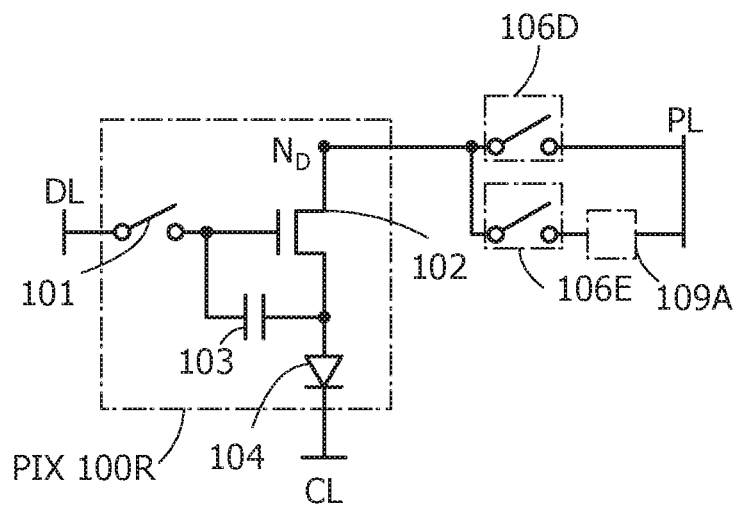
FIGS. 15A and 15B are a circuit diagram and a timing chart for describing one embodiment of the present invention.

A pixel 100R in FIG. 15A has a configuration different from that of the pixel 100 in FIG. 1A. In FIG. 15A, a switch 106D, a circuit 109A, and a switch 106E are provided between the transistor 102 and the current supply line PL. The circuit 109A has a function of distorting the waveform of a voltage supplied through the current supply line PL to the node $N_D$. Note that the circuit 109A may be provided either inside or outside the pixel 100R.

Figure 15B:
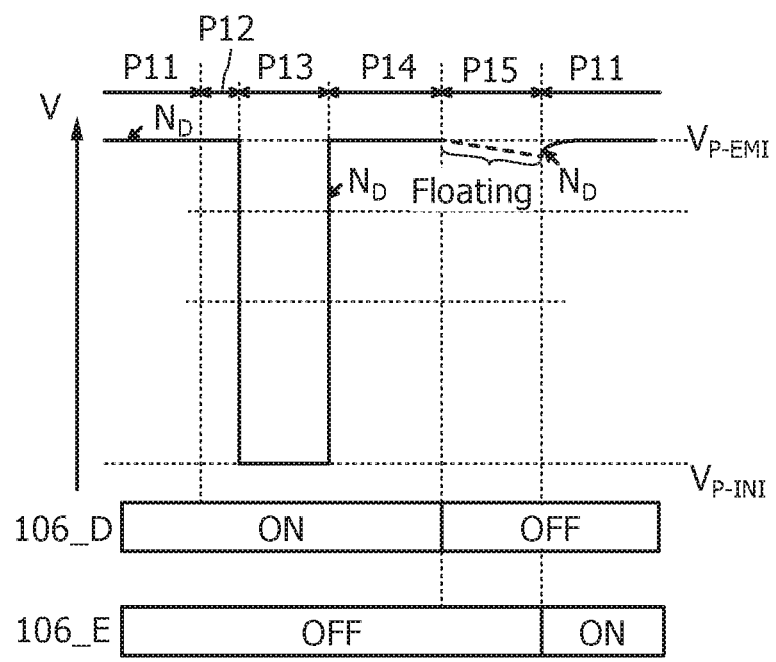

Whether the circuit 109A is active or inactive is preferably controlled by turning on or off the switches 106D and 106E. For example, the circuit 109A is active when the waveform of the voltage of the node $N_D$ needs to be distorted. Such a need arises, for example, in the light emission period P11. In the transition to the light emission period P11, the waveform of the voltage of the node $N_D$ is distorted by turning on the switch 106E while the switch 106D remains off as illustrated in FIG. 15B, whereby the luminance can be gradually changed. Thus, a reduction in glare or flicker in use of the display device can be expected. Accordingly, an eye-friendly display device which causes less eye fatigue can be provided.

Figure 16A:
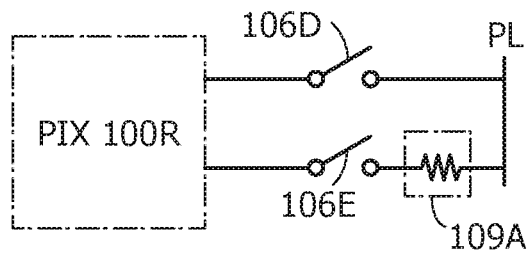
FIGS. 16A to 16E are each a circuit diagram for describing one embodiment of the present invention.
Figure 16B:
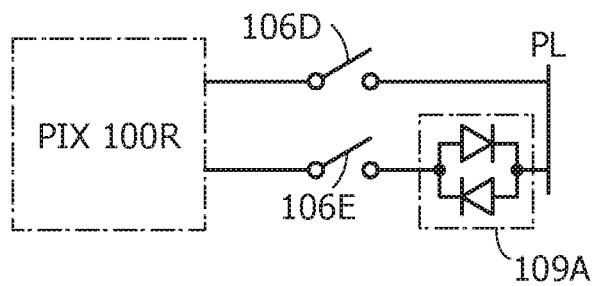
Figure 16C:
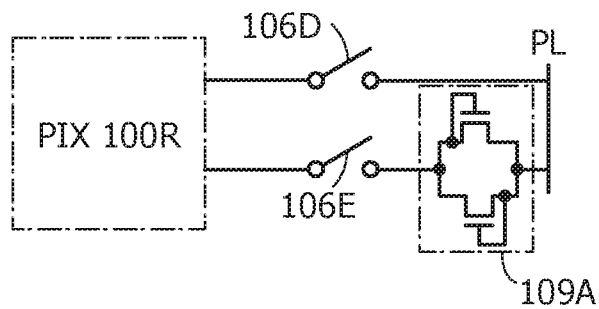

For example, the circuit 109A may be a resistor as illustrated in FIG. 16A, may be diodes as illustrated in FIG. 16B, or may be diode-connected transistors as illustrated in FIG. 16C.

Figure 16D:
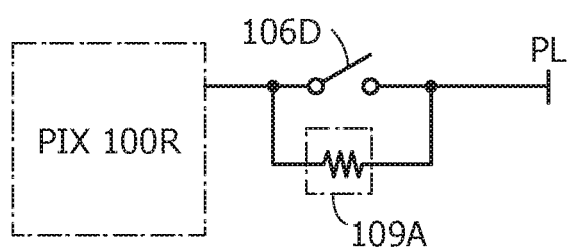
Figure 16E:
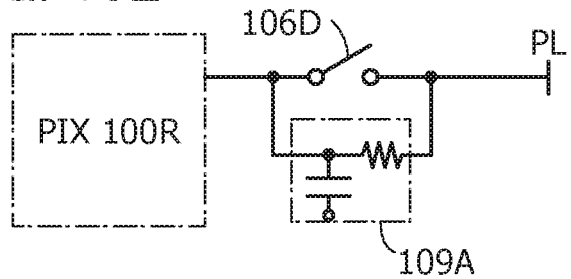

As illustrated in FIG. 16D, the circuit 109A may be active when the switch 106D is in an off state and inactive when the switch 106D is in an on state. As illustrated in FIG. 16E, the circuit 109A may be a circuit in which a resistor and a capacitor are combined.

Figure 17A:
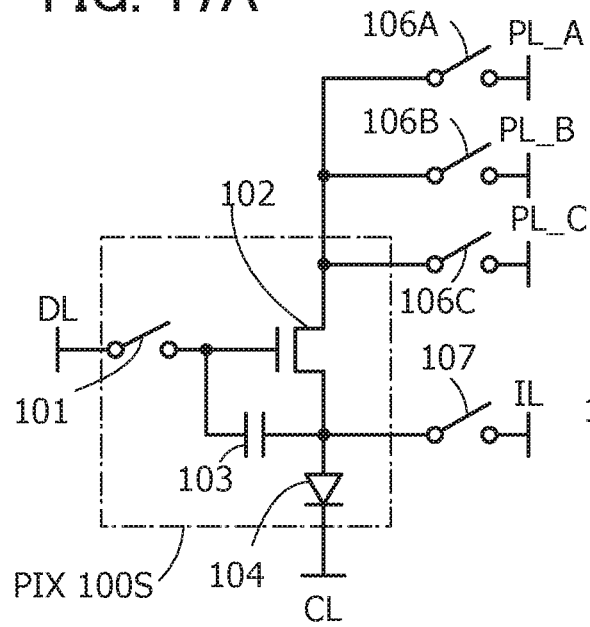
FIGS. 17A to 17C are each a circuit diagram for describing one embodiment of the present invention.
Figure 17B:
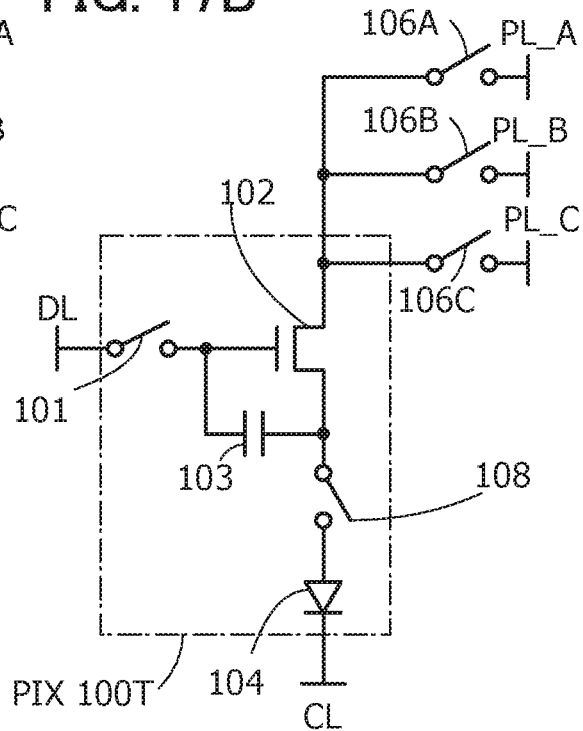
Figure 17C:
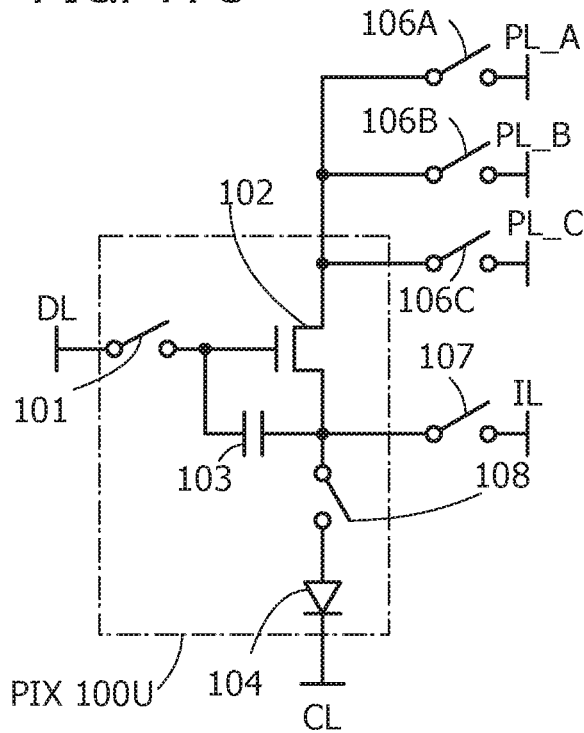

Note that the circuits in FIGS. 12A and 12B, FIGS. 13A and 13B, FIGS. 14A to 14C, FIG. 15A, and the like can be combined as appropriate. For example, FIG. 17A illustrates a pixel 100S obtained by combining FIG. 12A with FIG. 13A. FIG. 17B illustrates a pixel 100T obtained by combining FIG. 12A with FIG. 14A. FIG. 17C illustrates a pixel 100U obtained by combining FIG. 12A with FIG. 13A and FIG. 14A. In this manner, a configuration in which circuits are combined as appropriate can also be employed.

As described above, a variety of modification examples can be employed as one embodiment of the present invention.

<Block Diagram of Display Device>

Next, an example of a block diagram of a display device in which the pixel in FIG. 1A can be used will be described.

Figure 18:
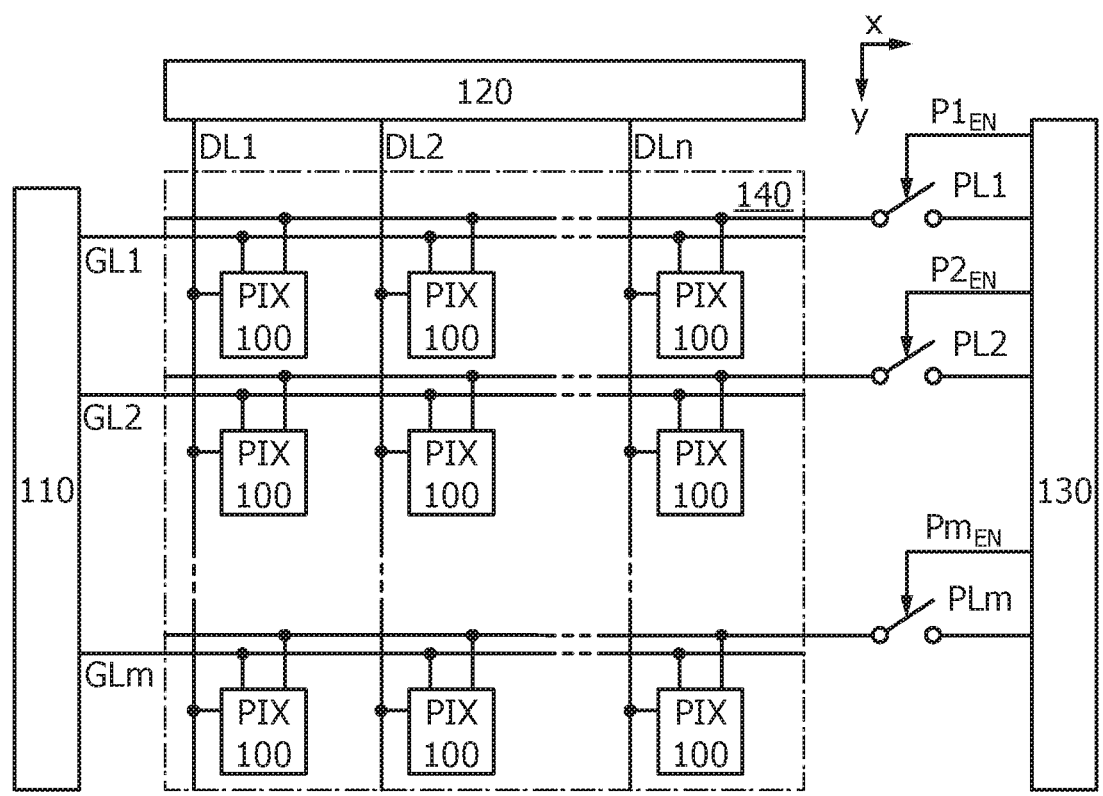
FIG. 18 is a block diagram for describing one embodiment of the present invention.

FIG. 18 is an example of a block diagram of a display device and illustrates a gate line driver circuit 110, a data line driver circuit 120, a current supply line control circuit 130, and a pixel portion 140 including pixels 100.

The plurality of pixels 100 in the pixel portion 140 is arranged in the x and y directions in matrix. In the pixel portion 140, gate lines GL1 to GLm (m is a natural number) connected to the gate line driver circuit 110 extend in the x direction and are connected to the respective pixels 100. For example, the gate line GL in FIG. 7 is connected to the gate line driver circuit 110. In the pixel portion 140, data lines DL1 to DLn (n is a natural number) connected to the data line driver circuit 120 extend in the y direction and are connected to the respective pixels 100. For example, the data line DL in FIG. 7 is connected to the data line driver circuit 120.

As the current supply lines PL, current supply lines PL1 to PLm connected to the current supply line control circuit 130 can be provided; as illustrated in FIG. 18, the current supply lines PL1 to PLm extend in the x direction and are connected to the respective pixels 100. For example, the node $N_D$ in FIG. 7 is connected to the current supply line control circuit 130.

The current supply line control circuit 130 can scan the current supply lines PL1 to PLm row by row. With the use of power supply control lines $P1_{EN}$ to $Pm_{EN}$, the current supply line control circuit 130 can turn on or off switches in the respective rows. The power supply control lines $P1_{EN}$ to $Pm_{EN}$ can separately turn off the respective switches provided on the current supply lines PL1 to PLm to form an electrically floating state. The switches provided on the current supply lines PL1 to PLm correspond to the switch 106 in FIGS. 1A and 1B, for example.

Figure 19:
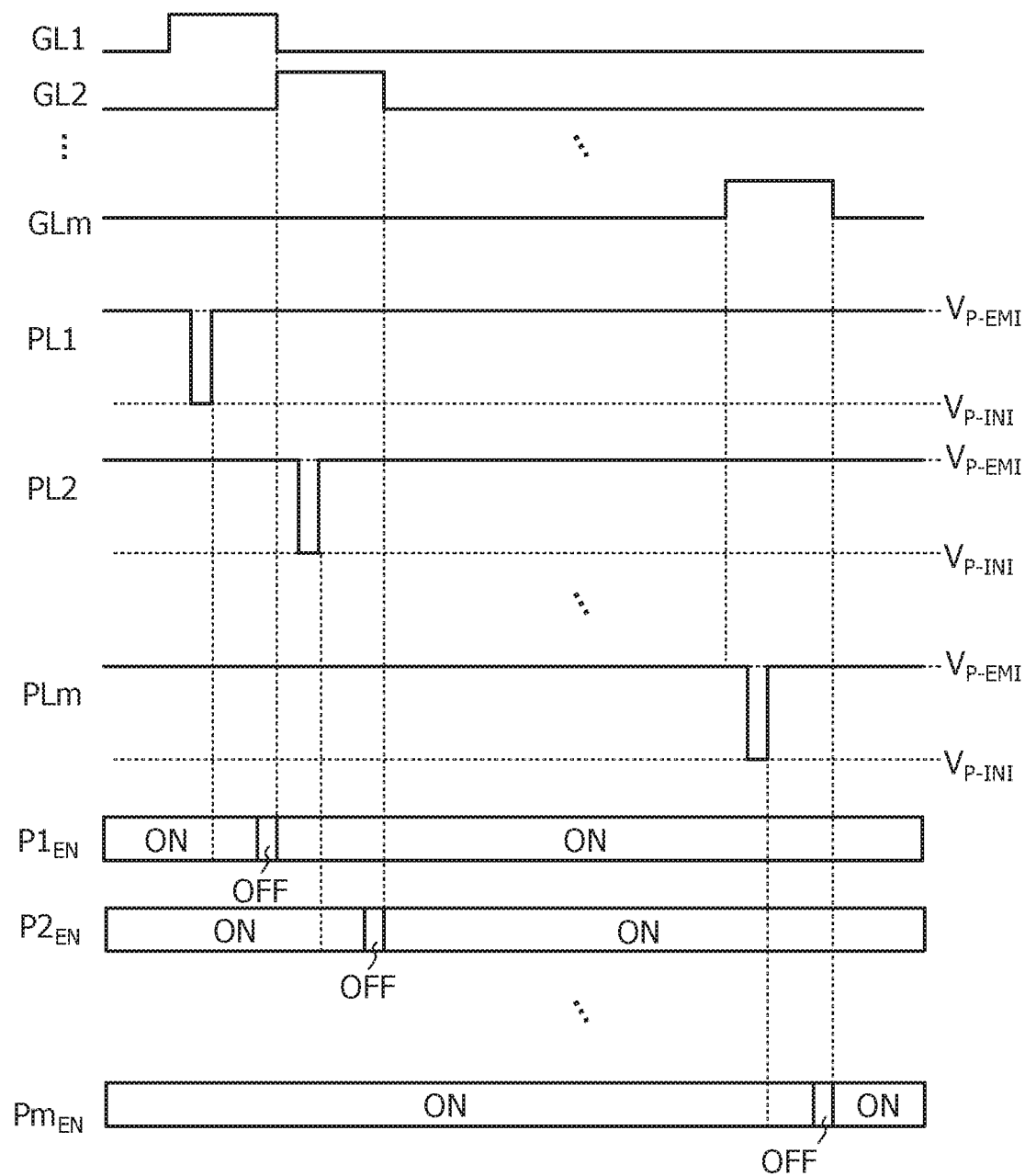
FIG. 19 is a timing chart for describing one embodiment of the present invention.

FIG. 19 shows a timing chart of the following operation: the switches controlled by the gate lines GL1 to GLm, the current supply lines PL1 to PLm, and the power supply control lines $P1_{EN}$ to $Pm_{EN}$ are scanned row by row.

<Modification Example of Operation of Pixel>

Next, a modification example of the operation of the pixel 100 in FIG. 1A will be described.

Figure 20A:
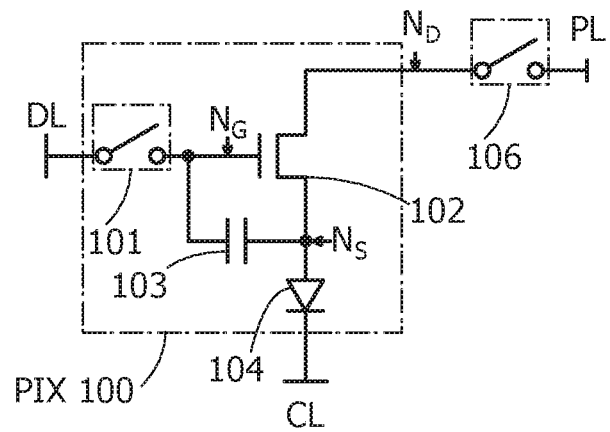
FIGS. 20A and 20B are a circuit diagram and a timing chart for describing one embodiment of the present invention.
Figure 20B:
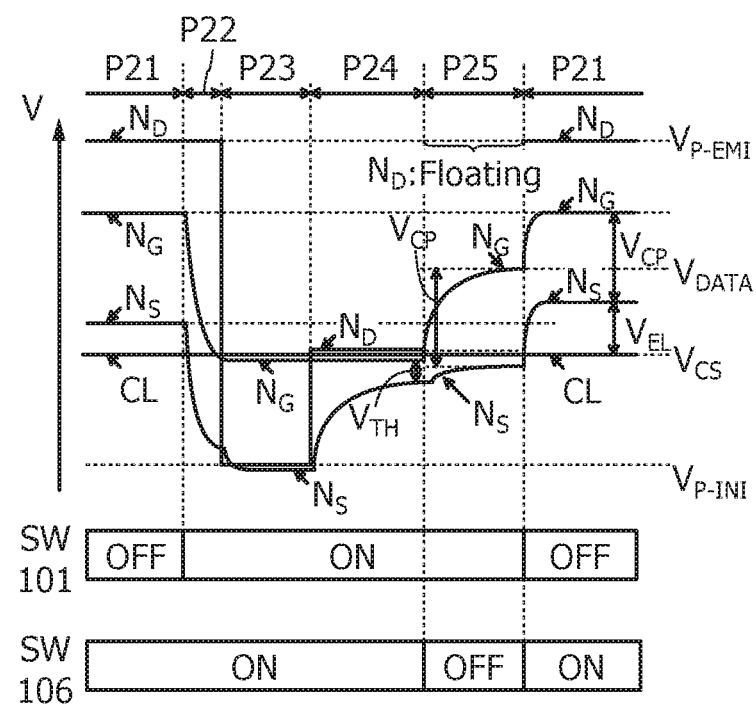

FIG. 20A shows the circuit diagram of the pixel 100 and is identical to FIG. 1A. A timing chart in FIG. 20B is different from that in FIG. 1B and illustrates a modification example of the operation of the pixel 100. FIGS. 21A and 21B, FIGS. 22A and 22B, and FIG. 23 show circuit diagrams illustrating the voltages of the wirings, the operation of the switches, and the voltages of the nodes in respective periods in FIG. 20B.

In the description of FIG. 20B, unlike that of FIG. 1B, the transistor 102 is assumed to be normally off, that is, have a positive threshold voltage $V_{TH}$. In the following description, differences from FIG. 1B will be detailed. The description of FIG. 1B can be referred to for similar points, the description of which is omitted in some cases.

The timing chart in FIG. 20B includes a light emission period P21, an initialization period P22, an initialization completion period P23, a threshold voltage correction period P24, and a data voltage writing period P25. The initialization period P22 and the initialization completion period P23 correspond to the above-described initialization period.

The timing chart in FIG. 20B illustrates an example of changes in the voltages of the node $N_D$, the cathode line CL, the node $N_G$, and the node $N_S$ in the above periods. FIG. 20B, in which the vertical axis represents the voltage, illustrates the magnitude relationship between $V_{P-EMI}$, $V_{DATA}$, $V_{CS}$, and $V_{P-INI}$ that the wirings and the nodes can have. FIG. 20B also illustrates the threshold voltage $V_{TH}$ of the transistor 102, the voltage $V_{CP}$ held at each electrode of the capacitor 103, and the voltage $V_{EL}$ applied between the electrodes of the light-emitting element 104. FIG. 20B also illustrates the on/off state of each of the switches 101 and 106.

Figure 21A:
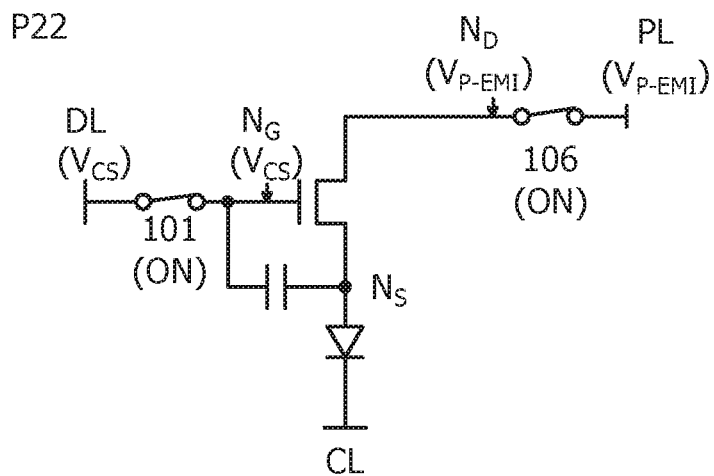
FIGS. 21A and 21B are circuit diagrams for describing one embodiment of the present invention.

In the initialization period P22, the voltage that has been held at the gate of the transistor 102 in the preceding light emission period P21 is initialized. The voltage of the data line DL is $V_{CS}$, which is a difference from the initialization period P12. Thus, the voltage of the node $N_G$ becomes $V_{CS}$. FIG. 21A illustrates the voltages of the wirings and the nodes at the end of the initialization period P22.

Figure 21B:
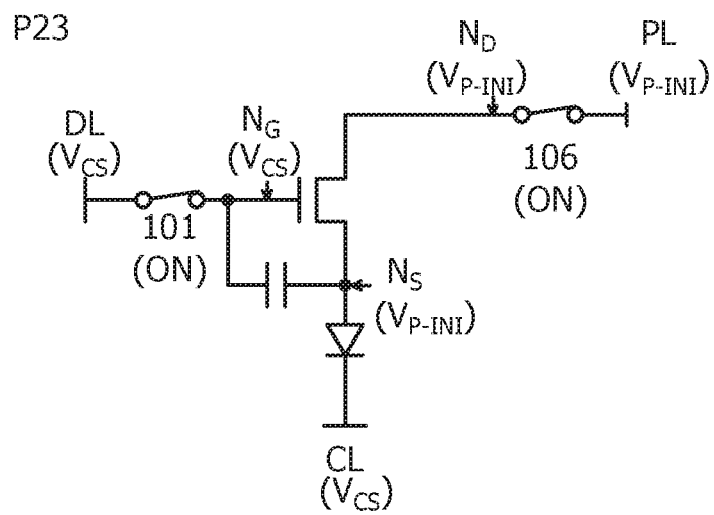

In the subsequent initialization completion period P23, the voltage held at the node $N_S$ is initialized. The voltage of the data line DL is $V_{CS}$, which is a difference from the initialization completion period P13. The voltage $V_{CS}$ of the node $N_G$ is higher than $V_{P-INI}$. Therefore, the transistor 102 is turned on, and the voltage of the node $N_S$ decreases to $V_{P-INI}$. FIG. 21B illustrates the voltages of the wirings and the nodes at the end of the initialization completion period P23.

Figure 22A:
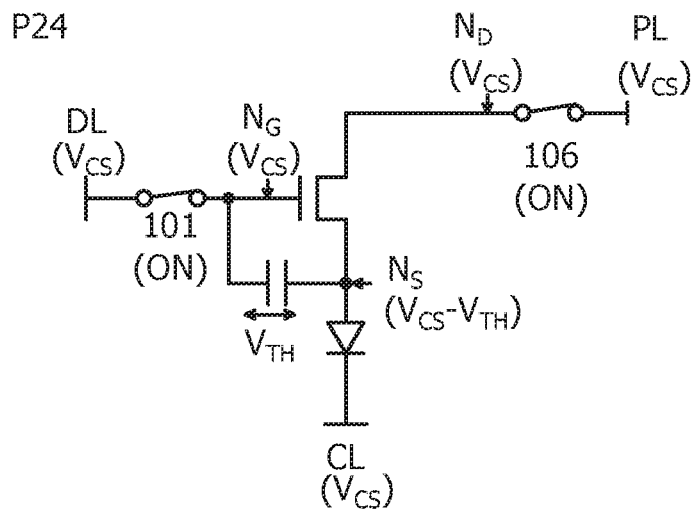
FIGS. 22A and 22B are circuit diagrams for describing one embodiment of the present invention.

In the subsequent threshold voltage correction period P24, $V_{TH}$ is held at each electrode of the capacitor 103 as follows: current is supplied to the transistor 102 to increase the voltage of the node $N_S$. The voltage of the data line DL is $V_{CS}$, which is a difference from the threshold voltage correction period P14. The voltage of the node $N_G$ is also $V_{CS}$. The voltage of the current supply line PL is set to $V_{CS}$, whereby the voltage of the node $N_S$ increases. The voltage of the node $N_S$ stops increasing when $V_{GS}$ of the transistor 102 becomes equal to $V_{TH}$ because current flowing through the transistor 102 decreases and then stops. In other words, the voltage of the node $N_S$ becomes a voltage ($V_{CS}-V_{TH}$). In FIG. 20B, the increase in the voltage of the node Ns stops at a voltage which is lower than the voltage of the node $N_G$ by $V_{TH}$. This is because the transistor 102 is normally off. FIG. 22A illustrates the voltages of the wirings and the nodes at the end of the threshold voltage correction period P24.

Figure 22B:
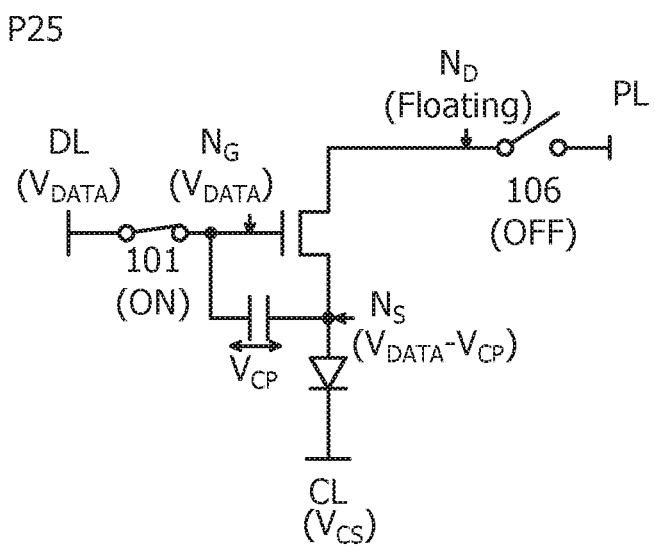

In the subsequent data voltage writing period P25, the voltage of the data line DL is set to $V_{DATA}$, and the switch 101 is in the on state. The switch 106 is turned off, so that the node $N_D$ is brought into an electrically floating state (Floating). The operation in the data voltage writing period P25 is the same as that in the data voltage writing period P15. Since the voltage of the node $N_S$ in FIG. 20B is higher than that in FIG. 1B and does not exceed $V_{CS}$, the increase in the voltage of the node $N_S$ in FIG. 20B is smaller than that in FIG. 1B. This is because the transistor 102 is normally off. In this case, the low voltage of the node $N_S$ prevents the light-emitting element 104 from emitting light. FIG. 22B illustrates the voltages of the wirings and the nodes at the end of the data voltage writing period P25.

Figure 23:
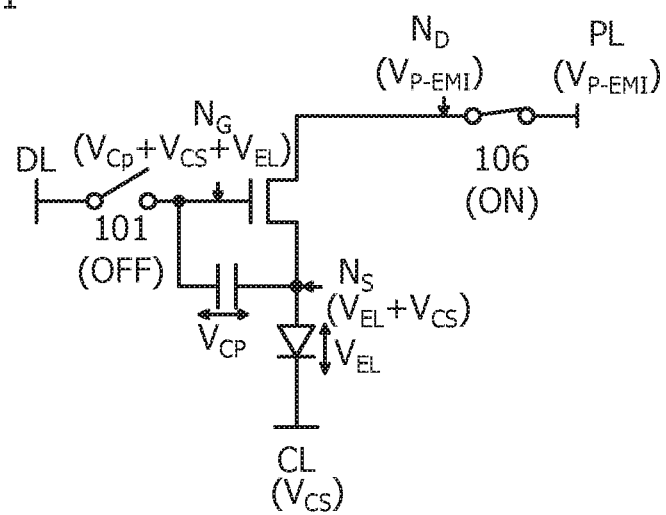
FIG. 23 is a circuit diagram for describing one embodiment of the present invention.

In the subsequent light emission period P21, the voltage of the current supply line PL is set to $V_{P-EMI}$. The operation in the light emission period P21 is the same as that in the light emission period P11. FIG. 23 illustrates the voltages of the wirings and the nodes at the end of the light emission period P21.

In the above-described configuration of one embodiment of the present invention, the time for acquiring the threshold voltage of the transistor 102 can be increased regardless of whether the threshold voltage is positive or negative. Moreover, this configuration can suppress an increase in the voltage of the node $N_S$, which is on the anode side of the light-emitting element, thereby suppressing undesired light emission in the data voltage writing period.

In this embodiment, one embodiment of the present invention has been described. Other embodiments of the present invention will be described in other embodiments. Note that one embodiment of the present invention is not limited thereto. That is, since various embodiments of the invention are disclosed in this embodiment and the other embodiments, one embodiment of the present invention is not limited to a specific embodiment. For example, one embodiment of the present invention is not limited the example described in this embodiment, in which a variable threshold voltage of a transistor is corrected. Depending on circumstances or conditions, other variable characteristics may be corrected in one embodiment of the present invention. Depending on circumstances or conditions, the variable threshold voltage of a transistor is not necessarily corrected in one embodiment of the present invention.

Embodiment 2

In this embodiment, a transistor whose channel formation region is formed in an oxide semiconductor film (OS transistor) and a transistor whose channel formation region is formed of silicon (Si transistor) will be described as examples of the transistor in the pixel described in the above embodiment.

<Structural Example 1 of Transistor>

First, a transistor whose channel formation region is formed in an oxide semiconductor film (OS transistor) will be described.

FIGS. 24A, 24B, and 24C show top views (layouts) and circuit symbols of three transistors TA1, TA2, and TB1, respectively, which are different in device structure. FIGS. 25A and 25B show cross-sectional views of the transistor TA1 along line a1-a2 and line b1-b2, cross-sectional views of the transistor TA2 along line a3-a4 and line b3-b4, and cross-sectional views of the transistor TB1 along line a5-a6 and line b5-b6. FIGS. 25A and 25B illustrate cross-sectional structures of the transistors in the channel length direction and the channel width direction, respectively.

As illustrated in FIGS. 25A and 25B, the transistors TA1, TA2, and TB1 are integrated over the same insulating surface and can be formed in the same manufacturing process. For clarity of the device structure, electrical connection to wirings for supplying potentials or power to a gate (G), a source (S), and a drain (D) of each transistor is not illustrated here.

The transistor TA1 (FIG. 24A) and the transistor TA2 (FIG. 24B) each include a gate (G) and a backgate (BG). One of the gate (G) and the backgate (BG) corresponds to a first gate, and the other corresponds to a second gate. In each of the transistors TA1 and TA2, the backgate is connected to the gate. The transistor TB1 (FIG. 24C) does not include a backgate. As illustrated in FIGS. 25A and 25B, the transistors TA1, TA2, and TB1 are formed over a substrate 30. The structures of these transistors will be described below with reference to FIGS. 24A to 24C and FIGS. 25A and 25B.

[Transistor TA1]

The transistor TA1 includes a gate electrode GE1, a source electrode SE1, a drain electrode DE1, a backgate electrode BGE1, and an oxide semiconductor film OS1.

In the following description, the names of elements and components of the elements may be abbreviated; for example, the transistor TA1 is referred to as TA1, the backgate is referred to as BG, or the oxide semiconductor film OS1 is referred to as OS1 or a film OS1. The names of signals, potentials, circuits, and the like may also be abbreviated in a similar manner.

In this embodiment, the channel length of an OS transistor corresponds to the distance between a source electrode and a drain electrode. The channel width of the OS transistor corresponds to the width of the source electrode or the drain electrode in a region in which an oxide semiconductor film and a gate electrode overlap with each other. The channel length and the channel width of the transistor TA1 are denoted by La1 and Wa1, respectively.

The film OS1 overlaps with the electrode GE1 with an insulating film 34 positioned therebetween. The pair of electrodes SE1 and DE1 is formed in contact with a top surface and side surfaces of the film OS1. As illustrated in FIG. 24A, the film OS1 includes a region overlapping with neither the electrode GE1 nor the pair of electrodes SE1 and DE1. The length of the film OS1 in the channel length direction is longer than the channel length La1, and the length of the film OS1 in the channel width direction is longer than the channel width Wa1.

An insulating film 35 and an insulating film 36 are formed to cover the film OS1, the electrode GE1, the electrode SE1, and the electrode DE1. The electrode BGE1 is formed over the insulating film 36. The electrode BGE1 is provided to overlap with the film OS1 and the electrode GE1. In the example shown here, the electrode BGE1 has the same shape as the electrode GE1 and is located in the same position as the electrode GE1. The electrode BGE1 is in contact with the electrode GE1 through an opening CG1 in the insulating film 34, the insulating film 35, and the insulating film 36. In the transistor TA1 having this structure, the gate and the backgate are electrically connected to each other.

The backgate electrode BGE1 is connected to the gate electrode GE1, whereby the on-state current of the transistor TA1 can be increased. With the backgate electrode BGE1, the strength of the transistor TA1 can be improved. When the substrate 30 is deformed by bending or the like, the electrode BGE1 serves as a reinforcement member to prevent the transistor TA1 from being damaged.

The film OS1 including a channel formation region has a multilayer structure, here, a three-layer structure including three oxide semiconductor films 31, 32, and 33. The oxide semiconductor films forming the film OS1 are preferably metal oxide films containing at least one common metal element, further preferably metal oxide films containing In. Typical examples of a metal oxide film which contains In and can be used as the semiconductor film of the transistor are an In—Ga oxide film and an In-M-Zn oxide film (M is Al, Ga, Y, Zr, La, Ce, or Nd). Another element or material can be added to such a metal oxide film.

In the transistor TA1, "32" includes a channel formation region. In each of the transistors TA2 and TB1 described later, "33" includes a channel formation region. Therefore, an oxide semiconductor film with an appropriate composition may be used in accordance with electrical characteristics (e.g., field-effect mobility and threshold voltage) required for the transistor TA2 and the transistor TB1. For example, the compositions of main component metal elements of the oxide semiconductor films 31 to 33 are preferably adjusted such that a channel is formed in "32".

Since a channel is formed in "32" of the transistor TA1, the channel formation region is not in contact with the insulating films 34 and 35. When the oxide semiconductor films 31 to 33 are metal oxide films containing at least one common metal element, interface scattering is less likely to occur at the interface between "32" and "31" and the interface between "32" and "33". Accordingly, the transistor TA1 can have higher field-effect mobility than the transistor TA2 and the transistor TB1, and the drain current in an on-state (on-state current) of the transistor TA1 can be increased.

[Transistor TA2]

The transistor TA2 includes a gate electrode GE2, a source electrode SE2, a drain electrode DE2, a backgate electrode BGE2, and an oxide semiconductor film OS2. The electrode BGE2 is in contact with the electrode GE2 through an opening CG2 in the insulating films 34 to 36. The transistor TA2 is a modification example of the transistor TA1 and is the same as the transistor TA1 except that the film OS2 has a single-layer structure of the oxide semiconductor film 33. Here, a channel length La2 and a channel width Wa2 of the transistor TA2 are equal to the channel length La1 and the channel width Wa1 of the transistor TA1, respectively.

[Transistor TB1]

The transistor TB1 includes a gate electrode GE3, a source electrode SE3, a drain electrode DE3, and an oxide semiconductor film OS3. The transistor TB1 is a modification example of the transistor TA2. As in the transistor TA2, the film OS3 of the transistor TB1 has a single-layer structure of the oxide semiconductor film 33. Unlike the transistor TA2, the transistor TB1 does not include a backgate electrode. In addition, the layout of the film OS3 and the electrodes GE3, SE3, and DE3 is different from that in the transistor TA2. As illustrated in FIG. 24C, a region of the film OS3 which does not overlap with the electrode GE3 overlaps with the electrode SE3 or the electrode DE3. Therefore, a channel width Wb1 of the transistor TB1 is determined by the width of the film OS3. A channel length Lb1 is determined by the distance between the electrode SE3 and the electrode DE3 as in the transistor TA2 and is longer than the channel length La2 of the transistor TA2.

[Insulating Film]

The insulating film 34, the insulating film 35, and the insulating film 36 are formed over the entire substrate 30 over which the transistors TA1, TA2, and TB1 are formed. The insulating film 34, the insulating film 35, and the insulating film 36 are each a single insulating film or a multilayer insulating film. The insulating film 34 serves as a gate insulating film of the transistors TA1, TA2, and TB1. The insulating film 35 and the insulating film 36 each serve as a gate insulating film on the backchannel side of the transistors TA1, TA2, and TB1. The uppermost insulating film 36 is preferably formed using a material that allows it to function as a protective film of the transistors over the substrate 30. The insulating film 36 is provided as needed. To insulate the electrode BGE1 in the third layer from the electrodes SE1 and DE1 in the second layer, at least one insulating film may exist therebetween.

The insulating films 34 to 36 can each be formed using a single insulating film or two or more insulating films. Examples of the insulating film used for the insulating films 34 to 36 include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. These insulating films can be formed by a sputtering method, a chemical vapor deposition (CVD) method, an MBE method, an atomic layer deposition (ALD) method, or a pulsed laser deposition (PLD) method.

[Oxide Semiconductor Film]

An oxide semiconductor film forming a semiconductor film of an OS transistor will be described. In the case where the semiconductor film is a multilayer film like the film OS1, oxide semiconductor films forming the multilayer semiconductor film are preferably metal oxide films containing at least one common metal element, further preferably metal oxide films containing In.

In the case where "31" is an In—Ga oxide film, for example, the atomic proportion of In is set lower than that of Ga. In the case where "31" is an In-M-Zn oxide film (M is Al, Ga, Y, Zr, La, Ce, or Nd), the atomic proportion of In is set higher than that of M. In this case, Zn can have the highest atomic proportion.

In the case where "32" is an In—Ga oxide film, for example, the atomic proportion of In is set higher than that of Ga. In the case where "32" is an In-M-Zn oxide film, the atomic proportion of In is set higher than that of M. In the In-M-Zn oxide film, In preferably has a higher atomic proportion than M and Zn.

In the case where "33" is an In—Ga oxide film, for example, the atomic proportion of In is set equal to or smaller than that of Ga. In the case where "33" is an In-M-Zn oxide film, the atomic proportion of In is set equal to that of M. In this case, Zn can have a higher atomic proportion than In and M. Here, "33" is also a film including the channel formation regions of the transistor TA2 and the transistor TB1, which will be described later.

The atomic ratio of each of the oxide semiconductor films 31 to 33 deposited by a sputtering method can be controlled by adjusting the atomic ratio of constituents of a target, for example. In the case where deposition is performed by a CVD method, the atomic ratio can be controlled by adjusting the flow rates of source gases or the like. Targets used for depositing In-M-Zn oxide films as the oxide semiconductor films 31 to 33 by a sputtering method will be described below as an example. In-M-Zn oxide targets are used for the deposition of these films.

When the atomic ratio of metal elements in a target for "31" is In:M:Zn=x1:y1:z1, x1/y1 is preferably greater than or equal to $\frac{1}{6}$ and less than 1, and z1/y1 is preferably greater than or equal to $\frac{1}{3}$ and less than or equal to 6, further preferably greater than or equal to 1 and less than or equal to 6.

Typical examples of the atomic ratio of the metal elements in the target are In:M:Zn=1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, and 1:6:8.

When the atomic ratio of metal elements in a target for "31" is In:M:Zn=x2:y2:z2, x2/y2 is preferably greater than 1 and less than or equal to 6, and z2/y2 is preferably greater than 1 and less than or equal to 6. Typical examples of the atomic ratio of the metal elements in the target are In:M:Zn=2:1:1.5, 2:1:2.3, 2:1:3, 3:1:2, 3:1:3, and 3:1:4.

When the atomic ratio of metal elements in a target for "33" is In:M:Zn=x3:y3:z3, x3/y3 is preferably greater than or equal to $\frac{1}{6}$ and less than or equal to 1, and z3/y3 is preferably greater than or equal to $\frac{1}{3}$ and less than or equal to 6, further preferably greater than or equal to 1 and less than or equal to 6. Typical examples of the atomic ratio of the metal elements in the target are In:M:Zn=1:1:1, 1:1:1.2, 1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, and 1:6:8.

In the case where the atomic ratio of metal elements in a target for depositing an In-M-Zn oxide film is In:M:Zn=x: y:z, $1 \leq z/y \leq 6$ is preferably satisfied because a CAAC-OS film is easily formed as the In-M-Zn oxide film. Note that the CAAC-OS film will be described later.

Oxide semiconductor films with low carrier density are used as the oxide semiconductor films 31 to 33. For example, an oxide semiconductor film whose carrier density is $1 \times 10^{17}/cm^3$ or lower, preferably $1 \times 10^{15}/cm^3$ or lower, further preferably $1\times10^{13}/cm^3$ or lower is used as each of the oxide semiconductor films 31 to 33. It particular, the carrier density of the oxide semiconductor film used as each of the oxide semiconductor films 31 to 33 is preferably lower than $8\times10^{11}/cm^3$, further preferably lower than $1\times10^{11}/cm^3$, still further preferably lower than $1\times10^{10}/cm^3$, and higher than or equal to $1\times10^{-9}/cm^3$.

When an oxide semiconductor having a low impurity concentration and a low density of defect states is used as each of the oxide semiconductor films 31 to 33, the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources and thus can have a low carrier density in some cases. Thus, a transistor whose channel region is formed in the oxide semiconductor film rarely has a negative threshold voltage (is rarely normally-on). A highly purified intrinsic or substantially highly purified intrinsic oxide semiconductor film has a low density of defect states and thus has a low density of trap states in some cases. Furthermore, the highly purified intrinsic or substantially highly purified intrinsic oxide semiconductor film has extremely low off-state current; even when an element has a channel width of $1\times10^6$ μm and a channel length L of 10 μm, the off-state current can be lower than or equal to the measurement limit of a semiconductor parameter analyzer, i.e., lower than or equal to $1\times10^{-13}$ A, at a voltage (drain voltage) between a source electrode and a drain electrode of 1 V to 10 V. Thus, the transistor whose channel region is formed in the oxide semiconductor film has little variation in electrical characteristics and is highly reliable. As examples of the impurity, hydrogen, nitrogen, alkali metal, and alkaline earth metal are given.

Hydrogen contained in the oxide semiconductor film reacts with oxygen bonded to a metal atom to form water, and in addition, an oxygen vacancy is formed in a lattice from which oxygen is released (or a portion from which oxygen is released). Entry of hydrogen into the oxygen vacancy generates an electron as a carrier in some cases. In some cases, part of hydrogen that is bonded to oxygen forming a bond with a metal element generates an electron as a carrier. Thus, a transistor including a hydrogen-containing oxide semiconductor is likely to be normally on.

Accordingly, hydrogen as well as oxygen vacancies in the oxide semiconductor films 31 to 33 is preferably reduced as much as possible. Specifically, the hydrogen concentration in each of the oxide semiconductor films 31 to 33, which is measured by secondary ion mass spectrometry (SIMS), is lower than or equal to $5\times10^{19}$ atoms/cm$^3$, preferably lower than or equal to $1\times10^{19}$ atoms/cm$^3$, lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

If silicon or carbon, which are Group 14 elements, is contained in the oxide semiconductor films 31 to 33, the number of oxygen vacancies is increased in the films, and these films become n-type films. To prevent this, the concentration of silicon or carbon (the concentration is measured by SIMS) in each of the oxide semiconductor films 31 to 33 is set to $2\times10^{18}$ atoms/cm$^3$ or lower, preferably $2\times10^{17}$ atoms/cm$^3$ or lower.

The concentration of alkali metal or alkaline earth metal in each of the oxide semiconductor films 31 to 33, which is measured by SIMS, is set to $1\times10^{18}$ atoms/cm$^3$ or lower, preferably $2\times10^{16}$ atoms/cm$^3$ or lower. Alkali metal and alkaline earth metal might generate carriers when bonded to an oxide semiconductor, in which case the off-state current of the transistor might increase. Therefore, it is preferable to reduce the concentration of alkali metal or alkaline earth metal in the oxide semiconductor films 31 to 33.

If nitrogen is contained in the oxide semiconductor films 31 to 33, electrons serving as carriers are generated and the carrier density increases, so that the oxide semiconductor films 31 to 33 easily become n-type films. Thus, a transistor including a nitrogen-containing oxide semiconductor is likely to be normally on; therefore, the nitrogen content in the oxide semiconductor films 31 to 33 is preferably reduced as much as possible. For example, the nitrogen concentration measured by SIMS is preferably set to $5\times10^{18}$ atoms/cm$^3$ or lower, for example.

Without being limited to the oxide semiconductor films 31 to 33 described above, another oxide semiconductor film with an appropriate composition may be used in accordance with semiconductor characteristics and electrical characteristics (e.g., field-effect mobility and threshold voltage) required for the transistor. To obtain the semiconductor characteristics and electrical characteristics required for the transistor, the carrier density, the impurity concentration, the defect density, the atomic ratio of a metal element to oxygen, the interatomic distance, the density, and the like of each of the oxide semiconductor films 31 to 33 are preferably set as appropriate.

The transistor TA1 can have high field-effect mobility because a channel is formed in the oxide semiconductor film 32 in which the atomic proportion of In is higher than that of Ga or M (M is Al, Ga, Y, Zr, La, Ce, or Nd). Typical example of the field-effect mobility is higher than 10 cm$^2$/Vs and lower than 60 cm$^2$/Vs, preferably higher than or equal to 15 cm$^2$/Vs and lower than 50 cm$^2$/Vs. Therefore, the transistor TA1 is favorably used for a driver circuit which needs to operate at high speed in an active matrix display device.

The transistor TA1 is preferably provided in a region shielded from light. Furthermore, the driving frequency of a driver circuit including the transistor TA1 with high field-effect mobility can be increased, so that a display device with higher resolution can be achieved.

The field-effect mobility of each of the transistors TA2 and TB1, whose channel formation regions are formed in the oxide semiconductor film 33, is lower than that of the transistor TA1 and is approximately 3 cm$^2$/Vs or higher and 10 cm$^2$/Vs or lower. The transistors TA2 and TB1, which do not include the oxide semiconductor film 32, are less likely to be degraded by light than the transistor TA1, and thus, the amount of off-state current increased by light irradiation is small. For this reason, the transistors TA2 and TB1, whose channel formation regions are formed in the oxide semiconductor film 33, are favorably used for a pixel portion, which may be irradiated with light.

The amount of off-state current increased by light irradiation is more likely to increase in the transistor TA1 than in the transistor TA2, which does not include the oxide semiconductor film 32. This is one of reasons why the transistor TA1 is suitable for a peripheral driver circuit, which is less influenced by light than a pixel portion, which is difficult to shield from light sufficiently. Needless to say, a transistor like the transistor TA2 or TB1 can also be provided in a driver circuit.

The structure of a transistor and an oxide semiconductor film used for the transistor are not limited to the structures of the transistors TA1, TA2, and TB1 and the oxide semiconductor films 31 to 33 described above, and the structure of the transistor may be changed in accordance with semiconductor characteristics and electrical characteristics required for the transistor. For example, the presence or absence of a backgate electrode, the stacked-layer structure of an oxide semiconductor film, and the shapes and positions of an oxide semiconductor film, a gate electrode, a source electrode, and a drain electrode can be appropriately changed.

[Structure of Oxide Semiconductor]

Next, the structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single-crystal oxide semiconductor film. Furthermore, an oxide semiconductor is classified into, for example, a crystalline oxide semiconductor and an amorphous oxide semiconductor.

Examples of the non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of the crystalline oxide semiconductor include a single-crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films and includes a plurality of c-axis aligned crystal parts.

In an image which is obtained by the combined analysis of a bright-field image and a diffraction pattern of a CAAC-OS film taken with a transmission electron microscope (TEM) (such an image is also referred to as a high-resolution TEM image), a plurality of crystal parts can be observed. However, even in the high-resolution TEM image, a boundary between crystal parts, that is, a grain boundary is not clearly observed. Thus, in the CAAC-OS film, a reduction in electron mobility due to the grain boundary is less likely to occur.

According to a high-resolution cross-sectional TEM image of the CAAC-OS film observed in the direction substantially parallel to a sample surface, metal atoms are arranged in a layered manner in the crystal parts. Each metal atom layer has a morphology reflecting unevenness of a surface over which the CAAC-OS film is formed (also referred to as a formation surface) or a top surface of the CAAC-OS film, and is arranged parallel to the formation surface or the top surface of the CAAC-OS film.

On the other hand, according to a high-resolution plan-view TEM image of the CAAC-OS film observed in the direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when a CAAC-OS film including an $InGaZnO_4$ crystal is analyzed by an out-of-plane method, a peak may appear when the diffraction angle (2θ) is around 31°. This peak is derived from the (009) plane of the $InGaZnO_4$ crystal, which indicates that crystals in the CAAC-OS film have c-axis alignment and that the c-axes are aligned in the direction substantially perpendicular to the formation surface or the top surface of the CAAC-OS film.

When the CAAC-OS film including an $InGaZnO_4$ crystal is analyzed by an out-of-plane method, a peak at 2θ of around 36° may also be observed in addition to the peak at 2θ of around 31°. The peak at 2θ of around 36° indicates that a crystal having no c-axis alignment is included in part of the CAAC-OS film. It is preferable that, in the CAAC-OS film, a peak appear when 2θ is around 31° and no peak appear when 2θ is around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a constituent metal element of the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus, such an impurity contained in the oxide semiconductor film disturbs the atomic arrangement of the oxide semiconductor film and causes a decrease in crystallinity. Note that the impurity contained in the oxide semiconductor film might serve as a carrier trap or a carrier generation source.

The CAAC-OS film is an oxide semiconductor film having a low density of defect states. In some cases, an oxygen vacancy in the oxide semiconductor film serves as a carrier trap or a carrier generation source when hydrogen is captured therein.

The state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources and thus can have a low carrier density. Therefore, a transistor including the oxide semiconductor film rarely has negative threshold voltage (is rarely normally on). In addition, the highly purified intrinsic or substantially highly purified intrinsic oxide semiconductor film has few carrier traps. Accordingly, the transistor including the oxide semiconductor film has little variation in electrical characteristics and is highly reliable. Charge captured in the carrier trap in the oxide semiconductor film takes a long time to be released and might behave like fixed charge. Thus, the transistor which includes the oxide semiconductor film with a high impurity concentration and a high density of defect states has unstable electrical characteristics in some cases.

In the transistor including the CAAC-OS film, the variation in electrical characteristics due to irradiation with visible light or ultraviolet light is small.

Next, a microcrystalline oxide semiconductor film will be described.

A high-resolution TEM image of a microcrystalline oxide semiconductor film has a region in which a crystal part is observed and a region in which a crystal part is not clearly observed. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or greater than or equal to 1 nm and less than or equal to 3 nm is specifically referred to as a nanocrystal (nc). An oxide semiconductor film including a nanocrystal is referred to as a nanocrystalline oxide semiconductor (nc-OS) film. In a high-resolution TEM image of the nc-OS film, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on the analysis method. For example, when the nc-OS film is subjected to structural analysis by an out-of-plane method with an XRD apparatus using an X-ray having a diameter larger than that of a crystal part, a peak indicating a crystal plane does not appear. Furthermore, a diffraction pattern like a halo pattern is observed in a selected-area electron diffraction pattern of the nc-OS film which is obtained using an electron beam with a probe diameter (e.g., 50 nm or larger) larger than the diameter of a crystal part. Meanwhile, spots are observed in a nanobeam electron diffraction pattern of the nc-OS film which is obtained using an electron beam with a probe diameter close to or smaller than the diameter of a crystal part. Furthermore, in a nanobeam electron diffraction pattern of the nc-OS film, regions with high luminance in a circular (ring) pattern are observed in some cases. In the nanobeam electron diffraction pattern of the nc-OS film, a plurality of spots is also observed in a ring-like region in some cases.

The nc-OS film is an oxide semiconductor film that has higher regularity than an amorphous oxide semiconductor film. Therefore, the nc-OS film has a lower density of defect states than an amorphous oxide semiconductor film. However, there is no regularity of crystal orientation between different crystal parts in the nc-OS film. Hence, the nc-OS film has a higher density of defect states than the CAAC-OS film.

Next, an amorphous oxide semiconductor film will be described.

An amorphous oxide semiconductor film has disordered atomic arrangement and no crystal part. For example, the amorphous oxide semiconductor film does not have a specific state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak indicating a crystal plane does not appear. A halo pattern is observed in an electron diffraction pattern of the amorphous oxide semiconductor film. Furthermore, a halo pattern is observed but no spot is observed in a nanobeam electron diffraction pattern of the amorphous oxide semiconductor film.

Note that an oxide semiconductor film may have a structure with physical properties between the nc-OS film and the amorphous oxide semiconductor film. The oxide semiconductor film with such a structure is specifically referred to as an amorphous-like oxide semiconductor (a-like OS) film.

In a high-resolution TEM image of the a-like OS film, a void may be observed. Furthermore, the high-resolution TEM image has a region in which a crystal part is clearly observed and a region in which no crystal part is observed. In some cases, the a-like OS film is crystallized by a slight amount of electron beam used for TEM observation, and the growth of the crystal part is observed. In contrast, crystallization by a slight amount of electron beam used for TEM observation is hardly observed in an nc-OS film having good quality.

Note that the size of a crystal part in the a-like OS film and that in the nc-OS film can be measured using high-resolution TEM images. For example, an InGaZnO$_4$ crystal has a layered structure in which two Ga—Zn—O layers are positioned between In—O layers. A unit cell of the InGaZnO$_4$ crystal has a structure in which nine layers, namely three In—O layers and six Ga—Zn—O layers, are stacked in the c-axis direction. Accordingly, the spacing between these adjacent layers is equivalent to the lattice spacing on the (009) plane (also referred to as d value). The value is calculated to 0.29 nm from crystal structure analysis. Thus, focusing on the lattice fringes in the high-resolution TEM image, each of the lattice fringes between which the spacing is greater than or equal to 0.28 nm and less than or equal to 0.30 nm corresponds to the a-b plane of the InGaZnO$_4$ crystal.

The density of an oxide semiconductor film varies depending on structure. For example, the structure of an oxide semiconductor film can be estimated by comparing the density of the oxide semiconductor film with the density of a single-crystal oxide semiconductor film having the same composition. For example, the density of the a-like OS film is higher than or equal to 78.6% and lower than 92.3% of the density of the single-crystal oxide semiconductor film having the same composition. For example, the density of the nc-OS film and the density of the CAAC-OS film are each higher than or equal to 92.3% and lower than 100% of the density of the single-crystal oxide semiconductor film having the same composition. Note that it is difficult to deposit an oxide semiconductor film whose density is lower than 78% of the density of the single-crystal oxide semiconductor film having the same composition.

Specific examples of the above description will be given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Accordingly, in the case of the oxide semiconductor film with an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film with an atomic ratio of In:Ga:Zn=1:1:1, the density of the nc-OS film and the density of the CAAC-OS film are each higher than or equal to 5.9 g/cm$^3$ and lower than 6.3 g/cm$^3$.

Note that there is a possibility that an oxide semiconductor film having a certain composition cannot exist in a single-crystal state. In this case, single-crystal oxide semiconductor films with different compositions are combined in an adequate ratio to calculate density equivalent to that of a single-crystal oxide semiconductor film with a desired composition. The density of the single-crystal oxide semiconductor film with a desired composition may be calculated using weighted average with respect to the combination ratio of the single-crystal oxide semiconductor films with different compositions. Note that it is preferable to combine as few kinds of single-crystal oxide semiconductor films as possible for density calculation.

Note that an oxide semiconductor film may be a stacked film including two or more of an amorphous oxide semiconductor film, an a-like OS film, a microcrystalline oxide semiconductor film, and a CAAC-OS film, for example.

As described above, the OS transistor can achieve very favorable off-state current characteristics.

[Substrate 30]

A variety of substrates can be used as the substrate 30 without limitation to a particular type of substrate. Examples of the substrate 30 include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper containing a fibrous material, and a base film. As examples of the glass substrate, a barium borosilicate glass substrate, an aluminoborosilicate glass substrate, and a soda lime glass substrate are given. Examples of the flexible substrate, the attachment film, the base film, and the like are substrates of plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper. In particular, a transistor formed using a semiconductor substrate, a single-crystal substrate, an SOI substrate, or the like can have little variation in characteristics, size, shape, or the like, high current capability, and a small size. Such a transistor can achieve lower power consumption or higher integration of a circuit.

A base insulating film may be formed over the substrate 30 before the gate electrodes GE1, GE2, and GE3 are formed. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. When silicon nitride, gallium oxide, hafnium oxide, yttrium oxide, aluminum oxide, or the like is used for the base insulating film, it is possible to suppress diffusion of impurities (typically, alkali metal, water, hydrogen, and the like) from the substrate 30 into the oxide semiconductor films OS1 to OS3.

[Gate Electrodes GE1, GE2, and GE3]

The gate electrodes GE1, GE2, and GE3 each have a single-layer structure of a conductive film or a multilayer structure in which two or more conductive films are stacked. The conductive film for the gate electrodes GE1, GE2, and GE3 can be formed using a metal element selected from aluminum, chromium, copper, tantalum, titanium, molybdenum, and tungsten, an alloy containing the metal element as a component, an alloy containing any of the metal elements in combination, or the like. Furthermore, at least one metal element selected from manganese and zirconium may be used. Alternatively, an alloy film or a nitride film in which aluminum and one or more elements selected from titanium, tantalum, tungsten, molybdenum, chromium, neodymium, and scandium are combined may be used. The conductive film can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide.

An aluminum film containing silicon can be formed as the gate electrodes GE1, GE2, and GE3, for example. The gate electrodes GE1, GE2, and GE3 may have a two-layer structure in which, for example, a titanium film is formed over an aluminum film, a titanium film is formed over a titanium nitride film, a tungsten film is formed over a titanium nitride film, or a tungsten film is formed over a tantalum nitride film or a tungsten nitride film. Alternatively, the gate electrodes GE1, GE2, and GE3 may have a three-layer structure in which, for example, a titanium film, an aluminum film, and another titanium film are stacked in this order.

The gate electrodes GE1, GE2, and GE3 are formed by a sputtering method, a vacuum evaporation method, a PLD method, a thermal CVD method, or the like.

Note that a tungsten film can be deposited with a deposition apparatus utilizing an ALD method. In this case, a $WF_6$ gas and a $B_2H_6$ gas are sequentially introduced plural times to form an initial tungsten film, and then, a $WF_6$ gas and an $H_2$ gas are introduced, so that a tungsten film is formed. Note that an $SiH_4$ gas may be used instead of a $B_2H_6$ gas.

The gate electrodes GE1 to GE3 can be formed by an electrolytic plating method, a printing method, an ink-jet method, or the like instead of by the above formation method.

[Insulating Film 34 (Gate Insulating Film)]

The insulating film 34 is formed to cover the gate electrodes GE1 to GE3. The insulating film 34 has a single insulating film or a multilayer insulating film including two or more layers. An oxide insulating film, a nitride insulating film, an oxynitride insulating film, a nitride oxide insulating film, or the like can be used as the insulating film 34. In this specification, an oxynitride refers to a material which contains more oxygen than nitrogen, and a nitride oxide refers to a material which contains more nitrogen than oxygen.

As the insulating film 34, for example, an insulating film containing silicon oxide, silicon oxynitride, silicon nitride oxide, silicon nitride, aluminum oxide, hafnium oxide, gallium oxide, or a Ga—Zn-based metal oxide can be formed. Such an insulating film can be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide. The use of a high-k material enables a reduction in gate leakage current of a transistor.

Since the insulating film 34 serves as a gate insulating film, regions of the insulating film 34 which are in contact with the oxide semiconductor films OS1, OS2, and OS3 are preferably formed using an oxide insulating film or an oxynitride insulating film in order to improve the characteristics of the interface between the oxide semiconductor films OS1, OS2, and OS3 and the gate insulating film. For example, the uppermost film of the insulating film 34 may be a silicon oxide film or a silicon oxynitride film.

The thickness of the insulating film 34 may be, for example, greater than or equal to 5 nm and less than or equal to 400 nm, preferably greater than or equal to 10 nm and less than or equal to 300 nm, further preferably greater than or equal to 50 nm and less than or equal to 250 nm.

In the case where the oxide semiconductor films OS1, OS2, and OS3 are formed by a sputtering method, an RF power supply device, an AC power supply device, a DC power supply device, or the like can be used as appropriate as a power supply device for generating plasma.

As a sputtering gas, a rare gas (typically argon), oxygen, or a mixed gas of a rare gas and oxygen is used as appropriate. In the mixed gas of a rare gas and oxygen, the proportion of oxygen to the rare gas is preferably increased.

Targets may be appropriately selected in accordance with the compositions of the oxide semiconductor films OS1, OS2, and OS3.

Note that the oxide semiconductor films OS1, OS2, and OS3 are formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., whereby CAAC-OS films can be formed as the oxide semiconductor films 31 and 32.

For the deposition of the CAAC-OS film, the following conditions are preferably used.

By suppressing entry of impurities during the deposition, the crystal state of the resulting film can be prevented from being disordered by the impurities. For example, the concentration of impurities (e.g., hydrogen, water, carbon dioxide, or nitrogen) which exist in a deposition chamber may be reduced. Furthermore, the impurity concentration in a deposition gas may be reduced. Specifically, a deposition gas with a dew point of −80° C. or lower, preferably −100° C. or lower is used.

Furthermore, it is preferable that the proportion of oxygen in the deposition gas be increased and the power be optimized in order to reduce plasma damage during the deposition. The proportion of oxygen in the deposition gas is preferably 30 vol % or higher, further preferably 100 vol %.

The oxide semiconductor film is deposited while being heated or heat treatment is performed after the formation of the oxide semiconductor film, whereby the hydrogen concentration in the oxide semiconductor film can be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

When the heat treatment is performed at a temperature higher than 350° C. and lower than or equal to 650° C., preferably higher than or equal to 450° C. and lower than or equal to 600° C., it is possible to obtain an oxide semiconductor film in which the proportion of CAAC described later is higher than or equal to 70% and lower than 100%, preferably higher than or equal to 80% and lower than 100%, further preferably higher than or equal to 90% and lower than 100%, still further preferably higher than or equal to 95% and lower than or equal to 98%. It is also possible to obtain an oxide semiconductor film having a low content of hydrogen, water, and the like. That is, an oxide semiconductor film with a low impurity concentration and a low density of defect states can be formed.

The oxide semiconductor film can be formed with a deposition apparatus utilizing an ALD method. For example, in the case where an InGaZnOx (X>0) film is deposited, an In(CH$_3$)$_3$ gas and an O$_3$ gas are sequentially introduced plural times to form an InO$_2$ layer, a Ga(CH$_3$)$_3$ gas and an O$_3$ gas are introduced to form a GaO layer, and then, a Zn(CH$_3$)$_2$ gas and an O$_3$ gas are introduced to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing these gases. Although an H$_2$O gas which is bubbled with an inert gas such as Ar may be used instead of an O$_3$ gas, it is preferable to use an O$_3$ gas, which does not contain H. Furthermore, instead of an In(CH$_3$)$_3$ gas, an In(C$_2$H$_5$)$_3$ gas may be used. In addition, instead of a Ga(CH$_3$)$_3$ gas, a Ga(C$_2$H$_5$)$_3$ gas may be used. Furthermore, a Zn(CH$_3$)$_2$ gas may be used.

The oxide semiconductor film 32 and the oxide semiconductor film 33 are each a film in which a channel of the transistor is formed and can each have a thickness greater than or equal to 3 nm and less than or equal to 200 nm, preferably greater than or equal to 3 nm and less than or equal to 100 nm, further preferably greater than or equal to 30 nm and less than or equal to 50 nm. The thickness of the oxide semiconductor film 31 can be, for example, greater than or equal to 3 nm and less than or equal to 100 nm, preferably greater than or equal to 3 nm and less than or equal to 30 nm, further preferably greater than or equal to 3 nm and less than or equal to 15 nm. The oxide semiconductor film 31 preferably has a smaller thickness than the oxide semiconductor film 32 and the oxide semiconductor film 33.

Here, In—Ga—Zn films are deposited as the oxide semiconductor films 31, 32, and 33 by a sputtering method. For example, the atomic ratio of metal elements (In:Ga:Zn) in a target for depositing the oxide semiconductor film 31 can be 1:3:6, that in a target for depositing the oxide semiconductor film 32 can be 3:1:2, and that in a target for depositing the oxide semiconductor film 33 can be 1:1:1.2 or 1:1:1. The thicknesses of the oxide semiconductor films 31, 32, and 33 can be 5 nm, 35 nm, and 35 nm, respectively.

[Source Electrode and Drain Electrode]

The electrodes SE1, DE1, SE2, DE2, SE3, and DE3 can be formed in a manner similar to that of the gate electrodes GE1, GE2, and GE3.

For example, a 50-nm-thick copper-manganese alloy film, a 400-nm-thick copper film, and a 100-nm-thick copper-manganese alloy film are stacked in this order by a sputtering method, so that three-layer electrodes SE1, DE1, SE2, DE2, SE3, and DE3 can be formed.

The channel length of a transistor which needs to operate at high speed, such as a transistor used for a driver circuit of a light-emitting device or the like, is preferably short as in the transistors TA1 and TA2 or transistors TA3, TA4, and TC1. The channel length of such a transistor is preferably less than 2.5 μm, for example, less than or equal to 2.2 μm. Since the channel length of each of the transistors of this embodiment is determined by the distance between the source electrode and the drain electrode, the minimum channel length is limited by the accuracy with which a conductive film to be the electrodes SE1, DE1, SE2, DE2, SE3, and DE3 is processed. The channel length of each of the transistors of this embodiment can be greater than or equal to 0.5 μm or greater than or equal to 1.0 μm, for example.

[Insulating Films 35 and 36]

An insulating film having a two-layer structure can be formed as "35", for example. Here, the first film of "35" is referred to as an insulating film 35a and the second film is referred to as an insulating film 35b.

As the insulating film 35a, for example, an oxide insulating film containing silicon oxide or the like, or an oxide insulating film containing nitrogen and having few defects can be formed. Typical examples of the oxide insulating film containing nitrogen and having few defects include a silicon oxynitride film and an aluminum oxynitride film.

In an ESR spectrum at 100 K or lower of an oxide insulating film having few defects, a first signal that appears at a g-factor greater than or equal to 2.037 and less than or equal to 2.039, a second signal that appears at a g-factor greater than or equal to 2.001 and less than or equal to 2.003, and a third signal that appears at a g-factor greater than or equal to 1.964 and less than or equal to 1.966 are observed. The split width of the first and second signals and the split width of the second and third signals which are obtained by ESR measurement using an X-band are each approximately 5 mT. The sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. Accordingly, the smaller the sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

When the insulating film 35a contains a small amount of nitrogen oxide, the number of carriers trapped at the interface between the insulating film 35a and the layers OS1, OS2, and OS3 can be reduced. As a result, a shift in the threshold voltages of the transistors can be reduced, which leads to reduced variation in the electrical characteristics of the transistors.

To improve the reliability of the transistors, the insulating film 35a preferably has a SIMS-measured nitrogen concentration of $6 \times 10^{20}$ atoms/cm$^3$ or lower. This is because nitrogen oxide is unlikely to be generated in the insulating film 35a in the manufacturing process of the transistors.

For example, a silicon oxynitride film formed by a CVD method, which is one of oxide insulating films containing nitrogen and having few defects, can be used as the insulating film 35a. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

An oxide insulating film containing nitrogen and having few defects can be formed as the insulating film 35a by a CVD method under the conditions that the flow rate of the oxidizing gas is more than 20 times and less than 100 times, preferably 40 times or more and 80 times or less of the flow rate of the deposition gas and that the pressure in a treatment chamber is lower than 100 Pa, preferably lower than or equal to 50 Pa.

The insulating film 35b can be formed using an oxide insulating film in which the oxygen content is higher than that in the stoichiometric composition. Part of oxygen is released by heating from the oxide insulating film in which the oxygen content is higher than that in the stoichiometric composition. The oxide insulating film in which the oxygen content is higher than that in the stoichiometric composition has the following feature: the amount of oxygen released from the oxide insulating film, which is converted into oxygen atoms, is greater than or equal to $1.0 \times 10^{18}$ atoms/cm$^3$, preferably greater than or equal to $3.0 \times 10^{20}$ atoms/cm$^3$ in TDS analysis. Note that the film surface temperature in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 35b. When the insulating film 35b is formed using the oxide insulating film in which the oxygen content is higher than that in the stoichiometric composition, a silicon oxynitride film can be formed as the oxide insulating film by a CVD method.

A silicon oxide film or a silicon oxynitride film used as the insulating film 35b can be formed under the following conditions. The substrate placed in a vacuum-evacuated treatment chamber of a plasma CVD apparatus is held at a temperature higher than or equal to 180° C. and lower than or equal to 280° C., preferably higher than or equal to 200° C. and lower than or equal to 240° C. The pressure in the treatment chamber, into which a source gas is introduced, is set higher than or equal to 100 Pa and lower than or equal to 250 Pa, preferably higher than or equal to 100 Pa and lower than or equal to 200 Pa. High-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the insulating film 36, a film having an effect of blocking at least hydrogen and oxygen is used. Preferably, a film having an effect of blocking oxygen, hydrogen, water, alkali metal, alkaline earth metal, and the like is used. Typically, a nitride insulating film such as a silicon nitride film may be formed. Besides the silicon nitride film, a silicon nitride oxide film, an aluminum nitride film, an aluminum nitride oxide film, or the like can also be used.

The insulating film 36 may include an oxide insulating film having an effect of blocking oxygen, hydrogen, water, and the like. As examples of such an oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film are given.

The thickness of the insulating film 36 may be greater than or equal to 50 nm and less than or equal to 300 nm, preferably greater than or equal to 100 nm and less than or equal to 200 nm. The insulating film 36 that has an effect of blocking oxygen, hydrogen, water, and the like can prevent oxygen diffusion from the oxide semiconductor films 31 to 33 to the outside and entry of hydrogen, water, and the like from the outside into the oxide semiconductor films 31 to 33.

In the case where a silicon nitride film is formed as the insulating film 36 by a plasma-enhanced chemical vapor deposition (PECVD) method, a deposition gas containing silicon, nitrogen, and ammonia are preferably used as a source gas. Thus, ammonia is dissociated in the plasma to generate active species. The active species cut a nitrogen triple bond and a silicon-hydrogen bond in the deposition gas containing silicon. Consequently, formation of silicon-nitrogen bonds is promoted, so that a dense silicon nitride film having few silicon-hydrogen bonds and few defects can be formed. In contrast, when the amount of ammonia with respect to nitrogen is large in the source gas, decomposition of the deposition gas containing silicon and decomposition of nitrogen are not promoted, so that a sparse silicon nitride film in which silicon-hydrogen bonds remain and the number of defects is increased is formed. Therefore, in the source gas, the flow ratio of nitrogen to ammonia is preferably greater than or equal to 5 and less than or equal to 50, further preferably greater than or equal to 10 and less than or equal to 50.

Heat treatment may be performed after the insulating film 35 is formed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By this heat treatment, oxygen contained in the oxide insulating film which is the second layer of the insulating film 35 can be moved to the oxide semiconductor films 31 to 33, so that the number of oxygen vacancies included in these oxide semiconductor films can be reduced. The heat treatment may be performed at a heating temperature of 350° C. in a mixed atmosphere containing nitrogen and oxygen for one hour.

Heat treatment for releasing hydrogen and the like from the oxide semiconductor films 31 to 33 may be performed after the insulating film 36 is formed. The heat treatment may be performed at a heating temperature of 350° C. in a mixed atmosphere containing nitrogen and oxygen for one hour.

[Backgate Electrode]

The backgate electrodes BGE1 and BGE2 can be formed in a manner similar to that of the gate electrodes GE1, GE2, and GE3.

Other structural examples of a transistor will be described below.

(Transistors TA3 and TA4)

Figure 26A:
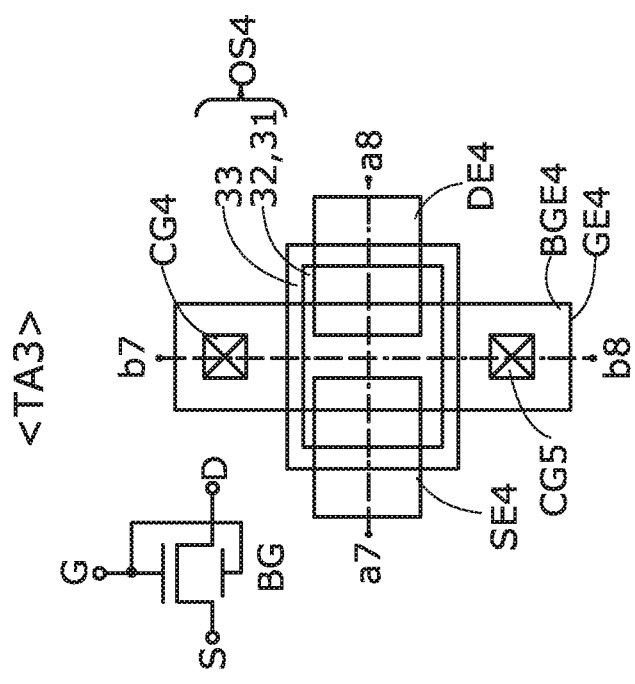
FIGS. 26A and 26B are each a top view for describing one embodiment of the present invention.
Figure 26B:
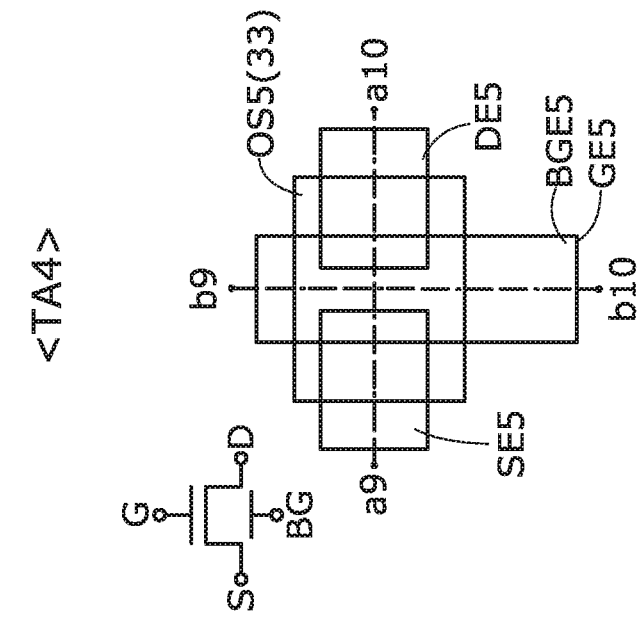

FIGS. 26A and 26B show top views (layouts) and circuit symbols of the transistor TA3 and the transistor TA4, respectively. FIGS. 27A and 27B show cross-sectional views of the transistor TA3 along line a7-a8 and line b7-b8 and cross-sectional views of the transistor TA4 along line a9-a10 and line b9-b10.

The transistor TA3 includes a gate electrode GE4, an oxide semiconductor film OS4, a source electrode SE4, a drain electrode DE4, and a backgate electrode BGE4. The transistor TA3 is a modification example of the transistor TA1 and is the same as the transistor TA1 except that the electrode BGE4 is in contact with the electrode GE4 through two openings CG4 and CG5. As illustrated in FIG. 27B, the film OS4 is surrounded by the electrode GE4 and the electrode BGE4 in the channel width direction, so that the strength of the transistor TA3 can be increased.

The transistor TA4 includes a gate electrode GE5, an oxide semiconductor film OS5, a source electrode SE5, a drain electrode DE5, and a backgate electrode BGE5. In the transistor TA4, which is a modification example of the transistor TA2, the electrode BGE5 is not connected to the electrode GE5, and thus, the electrode GE5 and the electrode BGE5 can be supplied with different signals or different potentials. For example, it is possible to input a signal for controlling the on/off of the transistor TA4 to the electrode GE5 and input a signal or a potential for correcting the threshold voltage of the transistor TA4 to the electrode BGE5.

(Transistors TC1, TB2, and TD1)

FIGS. 28A, 28B and 28C show top views (layouts) and circuit symbols of the transistor TC1, a transistor TB2, and a transistor TD1, respectively. FIGS. 29A and 29B show cross-sectional views of the transistor TC1 along line a11-a12 and line b11-b12, cross-sectional views of the transistor TB2 along line a13-a14 and line b13-b14, and cross-sectional views of the transistor TD1 along line a15-a16 and line b15-b16.

The transistor TC1 includes a gate electrode GE6, an oxide semiconductor film OS6, a source electrode SE6, a drain electrode DE6, and a backgate electrode BGE6. The electrode BGE6 is in contact with the electrode GE6 through an opening CG6. In the transistor TC1, which is a modification example of the transistor TA1, the film OS6 has a two-layer structure of "32" and "33". A channel formation region of the transistor TC1 is formed in "32" as in the transistor TA1. Therefore, the field-effect mobility of the transistor TC1 is as high as that of the transistor TA1, typically, higher than 10 cm$^2$/V·s and lower than 60 cm$^2$/V·s, preferably higher than or equal to 15 cm$^2$/V·s and lower than 50 cm$^2$/V·s. Thus, the transistor TC1 as well as the transistor TA1 is suitable as a transistor which needs to operate at high speed, such as the one in a driver circuit.

The transistor TB2 includes a gate electrode GE7, an oxide semiconductor film OS7, a source electrode SE7, a drain electrode DE7, and a backgate electrode BGE7. The electrode BGE7 is in contact with the electrode GE7 through an opening CG7. The transistor TB2 is a modification example of the transistor TB1 and is different from the transistor TB1 in that the electrode BGE7 is provided. The transistor TB2, which includes the electrode BGE7 connected to the electrode GE7, has higher on-state current and higher mechanical strength than the transistor TB1.

The transistor TD1 includes a gate electrode GE8, an oxide semiconductor film OS8, a source electrode SE8, and a drain electrode DE8. In the transistor TD1, which is a modification example of the transistor TB1, the entire film OS8 overlaps with the electrode GE8 and does not exist outside the end portion of the electrode GE8. With this structure, the transistor TD1 is suitable as a transistor in a pixel portion because the film OS8 is less exposed to light than the film OS3 in the transistor TB1.

Note that films included in the transistor TA1, the transistor TA2, and the transistor TB1 (e.g., an insulating film, an oxide semiconductor film, a metal oxide film, and a conductive film) can be formed by a sputtering method, a CVD method, a vacuum evaporation method, or a PLD method. Alternatively, a coating method or a printing method can also be used. Although a sputtering method and a PECVD method are typical deposition methods, a thermal CVD method may also be used. As a thermal CVD method, a metal organic chemical vapor deposition (MOCVD) method or an ALD method may be used, for example.

Deposition by a thermal CVD method is performed in the following manner: a source gas and an oxidizer are supplied at a time to a chamber in which the pressure is set to an atmospheric pressure or a reduced pressure, and the source gas and the oxidizer react with each other in the vicinity of the substrate or over the substrate and are then deposited thereon. Since no plasma is generated during deposition, a thermal CVD method has an advantage in that no defect due to plasma damage is caused.

Deposition by an ALD method is performed in the following manner: source gases for reaction are sequentially introduced into a chamber in which the pressure is set to an atmospheric pressure or a reduced pressure, and the sequence of the gas introduction is repeated. For example, two or more kinds of source gases are sequentially supplied to the chamber by switching respective switching valves (also referred to as high-speed valves). As an example, a first source gas is introduced, an inert gas (e.g., argon or nitrogen) or the like is introduced at the same time as or after the first gas so that the source gases are not mixed, and then, a second source gas is introduced. In the case where the first source gas and the inert gas are introduced at the same time, the inert gas serves as a carrier gas. In addition, the inert gas may also be introduced at the same time as the second source gas. Alternatively, the first source gas may be exhausted by vacuum evacuation instead of the introduction of the inert gas, and then, the second source gas may be introduced. The first source gas is adsorbed on the surface of the substrate to form a first single atomic layer; then, the second source gas is introduced to react with the first single atomic layer; as a result, a second single atomic layer is stacked on the first single atomic layer, so that a thin film is formed.

The sequence of the gas introduction is repeated plural times until a desired thickness is obtained, whereby a thin film with excellent step coverage can be formed. The thickness of the thin film can be precisely adjusted by the number of times the sequence of the gas introduction is repeated; therefore, an ALD method is suitable for manufacturing a minute transistor.

<Structural Example 2 of Transistor>

A transistor used in the display device of one embodiment of the present invention may include a channel formation region in a semiconductor film or a semiconductor substrate formed of silicon, germanium, or the like in an amorphous, microcrystalline, polycrystalline, or single-crystal state. In the case where the transistor is formed using a thin silicon film, any of the following materials can be used for the thin film: amorphous silicon formed by a sputtering method or a vapor deposition method such as a PECVD method, polycrystalline silicon obtained by crystallization of amorphous silicon by treatment such as laser annealing, single-crystal silicon obtained by separation of a surface portion of a single-crystal silicon wafer by implantation of hydrogen ions or the like into the silicon wafer, and the like.

Figure 30A:
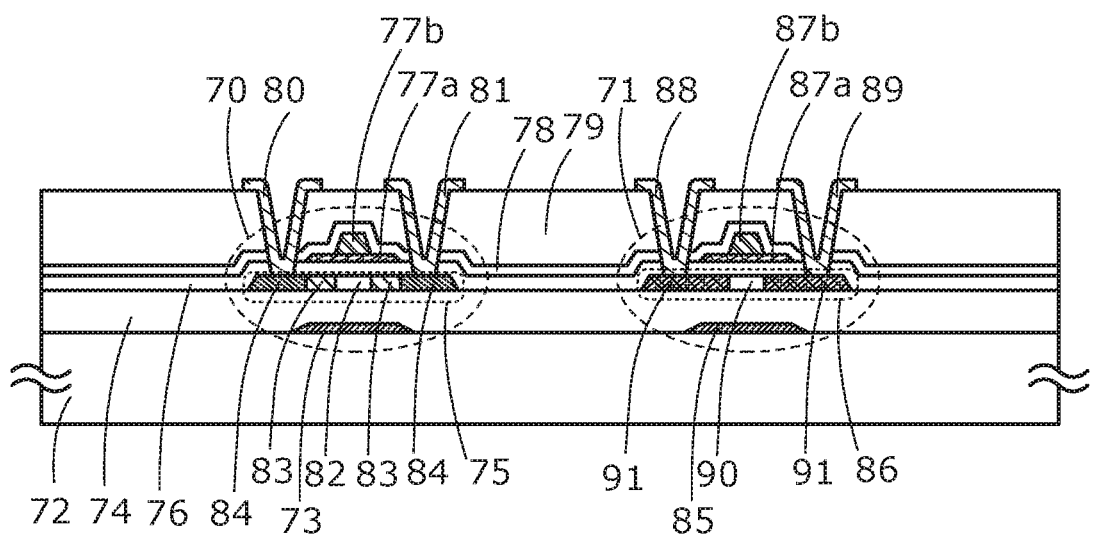
FIGS. 30A and 30B are each a cross-sectional view for describing one embodiment of the present invention.
Figure 30B:
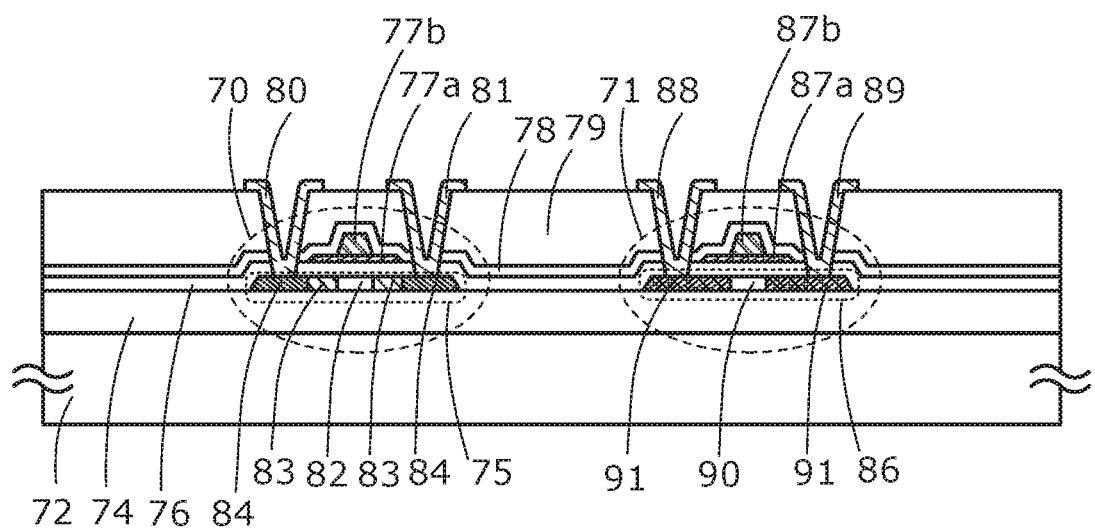

FIGS. 30A and 30B show examples of cross-sectional views of transistors; each of the transistors includes a thin silicon film and can be used for the display device of one embodiment of the present invention. FIGS. 30A and 30B illustrate an n-channel transistor 70 and a p-channel transistor 71.

The transistor 70 includes a conductive film 73 which is over a substrate 72 having an insulating surface and functions as a gate, an insulating film 74 over the conductive film 73, a semiconductor film 75 which overlaps with the conductive film 73 with the insulating film 74 positioned therebetween, an insulating film 76 over the semiconductor film 75, a conductive film 77a and a conductive film 77b which overlap with the semiconductor film 75 with the insulating film 76 positioned therebetween and function as a gate, an insulating film 78 over the conductive film 77a and the conductive film 77b, an insulating film 79 over the insulating film 78, and a conductive film 80 and a conductive film 81 which are electrically connected to the semiconductor film 75 through openings provided in the insulating film 76, the insulating film 78, and the insulating film 79 and function as a source and a drain.

The length of the conductive film 77b in the channel length direction is smaller than that of the conductive film 77a. The conductive film 77a and the conductive film 77b are stacked in this order from the insulating film 76 side. The semiconductor film 75 includes a channel formation region 82 overlapping with the conductive film 77b, a pair of lightly doped drain (LDD) regions 83 between which the channel formation region 82 is positioned, and a pair of impurity regions 84 between which the channel formation region 82 and the LDD regions 83 are positioned. The pair of impurity regions 84 functions as a source region and a drain region. An impurity element imparting n-type conductivity to the semiconductor film 75, such as phosphorus (P) or arsenic (As), is added to the LDD regions 83 and the impurity regions 84.

The transistor 71 includes a conductive film 85 which is over the substrate 72 having an insulating surface and functions as a gate, the insulating film 74 over the conductive film 85, a semiconductor film 86 which overlaps with the conductive film 85 with the insulating film 74 positioned therebetween, the insulating film 76 over the semiconductor film 86, a conductive film 87a and a conductive film 87b which overlap with the semiconductor film 86 with the insulating film 76 positioned therebetween and function as a gate, the insulating film 78 over the conductive film 87a and the conductive film 87b, the insulating film 79 over the insulating film 78, and a conductive film 88 and a conductive film 89 which are electrically connected to the semiconductor film 86 through openings provided in the insulating film 76, the insulating film 78, and the insulating film 79 and function as a source and a drain.

The length of the conductive film 87b in the channel length direction is smaller than that of the conductive film 87a. The conductive film 87a and the conductive film 87b are stacked in this order from the insulating film 76 side. The semiconductor film 86 includes a channel formation region 90 overlapping with the conductive film 87b, and a pair of impurity regions 91 between which the channel formation region 90 is positioned. The pair of impurity regions 91 functions as a source region and a drain region. An impurity element imparting p-type conductivity to the semiconductor film 86, such as boron (B), aluminum (Al), or gallium (Ga), is added to the impurity regions 91.

Note that the semiconductor film 75 or the semiconductor film 86 may be crystallized by various techniques. Examples of a crystallization method are a laser crystallization method using a laser beam and a crystallization method using a catalytic element. Alternatively, a crystallization method using a catalytic element and a laser crystallization method can be combined. In the case where a high heat resistant substrate such as a quartz substrate is used as the substrate 72, any of the following crystallization methods may be used in combination: a thermal crystallization method using an electrically-heated oven, a lamp annealing crystallization method using infrared light, a crystallization method using a catalytic element, and high-temperature annealing at approximately 950° C.

Although FIG. 30A illustrates a structure in which the conductive films 77a and 77b function as a gate and the conductive film 73 functions as a backgate electrode, another structure may be employed. For example, the conductive film 73 functioning as a backgate electrode may be omitted as illustrated in FIG. 30B. Although FIG. 30A illustrates a structure in which the conductive films 87a and 87b function as a gate and the conductive film 85 functions as a backgate electrode, another structure may be employed. For example, the conductive film 85 functioning as a backgate electrode may be omitted as illustrated in FIG. 30B. Note that the structure in FIG. 30B can be applied to an OS transistor.

Figure 51A:
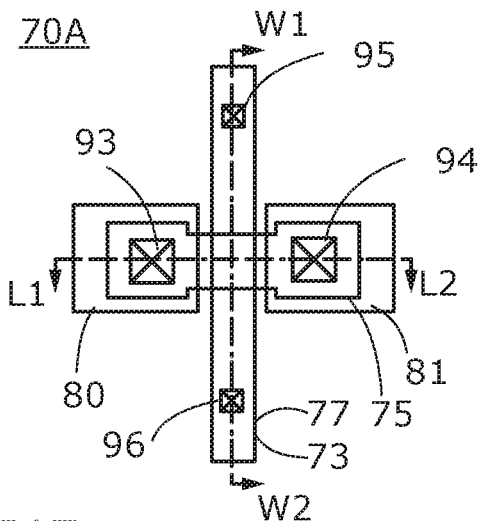
FIGS. 51A to 51C are a top view and cross-sectional views for describing one embodiment of the present invention.
Figure 51B:
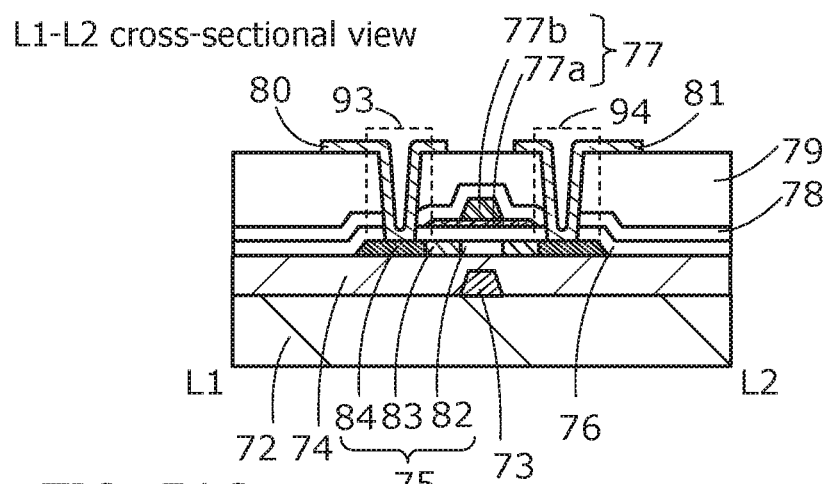
Figure 51C:
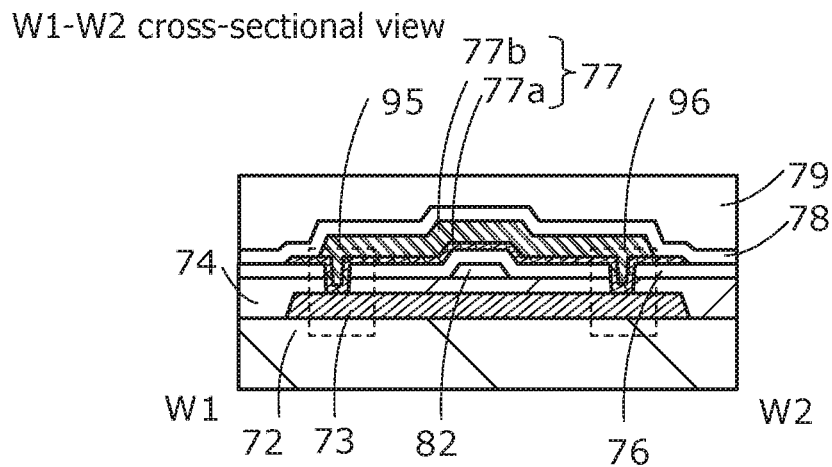

FIG. 51A shows a top view of a transistor 70A which corresponds to the n-channel transistor 70 in FIG. 30A. FIG. 51B is a cross-sectional view of the transistor 70A taken along line L1-L2 which indicates the channel length direction. FIG. 51C is a cross-sectional view of the transistor 70A taken along line W1-W2 which indicates the channel width direction.

FIG. 51A illustrates a conductive film 77, the conductive film 73, the semiconductor film 75, the conductive film 80, the conductive film 81, an opening 93, an opening 94, an opening 95, and an opening 96. The conductive film 77 functions as a gate. The conductive film 73 functions as a backgate. Details of the components denoted by the same reference numerals as those in FIG. 30A are omitted in the description of FIG. 51A. The openings 93 and 94 are openings for connecting the semiconductor film 75 to the conductive film 80 and the conductive film 81. The openings 95 and 96 are openings for electrically connecting the conductive film 77 to the conductive film 73.

In FIG. 51B, the following components are provided: the conductive film 73 and the insulating film 74 over the substrate 72, the semiconductor film 75 which overlaps with the conductive film 73 with the insulating film 74 positioned therebetween, the insulating film 76 over the semiconductor film 75, the conductive film 77a and the conductive film 77b which overlap with the semiconductor film 75 with the insulating film 76 positioned therebetween and function as a gate, the insulating film 78 over the conductive film 77a and the conductive film 77b, the insulating film 79 over the insulating film 78, and the conductive film 80 and the conductive film 81 which are electrically connected to the semiconductor film 75 through the openings 93 and 94 provided in the insulating film 76, the insulating film 78, and the insulating film 79 and function as a source and a drain. The semiconductor film 75 includes the channel formation region 82, the LDD regions 83, and the impurity regions 84. Details of the components denoted by the same reference numerals as those in FIG. 30A are omitted in the description of FIG. 51B.

In FIG. 51C, the following components are provided: the conductive film 73 and the insulating film 74 over the substrate 72, the channel formation region 82, the insulating film 76, the conductive film 77a and the conductive film 77b which are electrically connected to the conductive film 73 through the openings 95 and 96, the insulating film 78 over the conductive film 77a and the conductive film 77b, and the insulating film 79 over the insulating film 78. Details of the components denoted by the same reference numerals as those in FIG. 30A are omitted in the description of FIG. 51C.

In the structure illustrated in the top view and the cross-sectional views in FIGS. 51A to 51C, the conductive film 77 serving as a gate and the conductive film 73 electrically connected to the conductive film 77 and serving as a backgate electrically surround the channel formation region 82 of the semiconductor film 75 in the channel width direction. In other words, in this structure, the conductive films can wrap around the top surface, the bottom surface, and the side surfaces of the channel formation region. Such a structure can increase the on-state current and reduce the size in the channel width direction. Besides, the structure in which the channel formation region is surrounded by the conductive films can easily shield the channel formation region from light and thus can suppress photoexcitation caused by undesired light irradiation on the channel formation region.

In addition, the structure illustrated in the top view and the cross-sectional views in FIGS. 51A to 51C can prevent an electrical connection due to an undesired increase in conductivity at a side end portion of the semiconductor film 75 in the W1-W2 direction. Furthermore, the influence of non-uniform distribution of an impurity element added to the semiconductor film 75 can be reduced.

Although electrically connected to each other in the structure illustrated in the top view and the cross-sectional views in FIGS. 51A to 51C, the gate and the backgate may be supplied with different voltages. This structure is particularly effective in a circuit in which all transistors are n-channel transistors. Thus, the threshold voltage of the transistor can be controlled by the voltage applied to the backgate; accordingly, a logic circuit such as an inverter circuit can be formed using ED-MOS transistors having different threshold voltages. The use of such a logic circuit for a driver circuit for driving pixels can reduce the area occupied by the driver circuit, so that a display device having a narrower frame can be provided. The voltage of the backgate is set to a voltage at which the transistor is turned off, whereby the off-state current of the transistor can be further reduced. Therefore, even when the display device has a high refresh rate, a written voltage can be maintained. Accordingly, the number of times of writing can be reduced, leading to low power consumption of the display device.

The top view and the cross-sectional views in FIGS. 51A to 51C illustrate just an example, and another structure can be employed. As an example, FIGS. 52A to 52C show a top view and cross-sectional views which are different from those in FIGS. 51A to 51C.

Figure 52A:
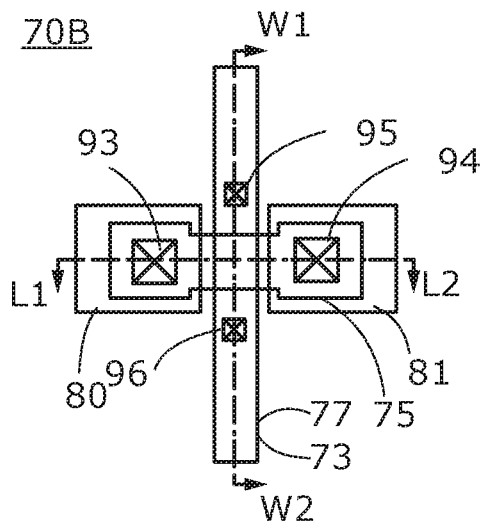
FIGS. 52A to 52C are a top view and cross-sectional views for describing one embodiment of the present invention.
Figure 52B:
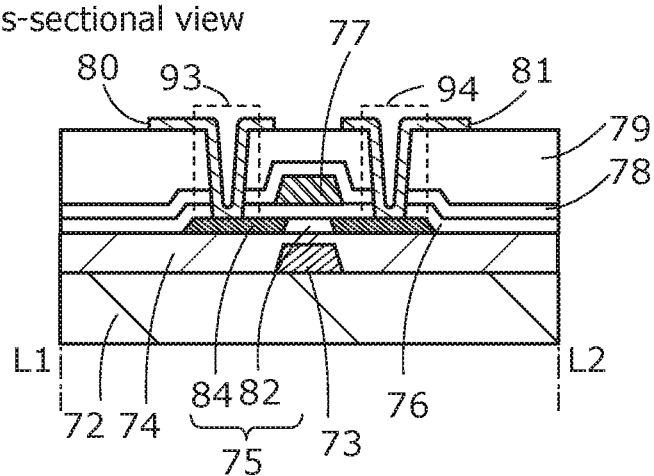
Figure 52C:
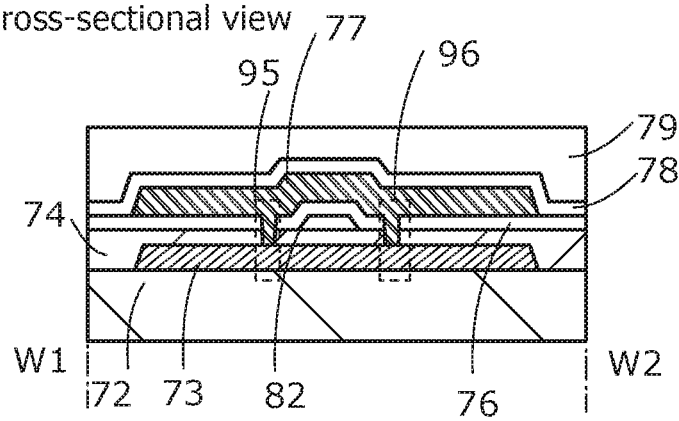

The structure in FIGS. 52A to 52C is different from the structure in FIGS. 51A to 51C in that the conductive film 77 serving as a gate has a single-layer structure and that the openings 95 and 96 are closer to the channel formation region 82. Such a structure can facilitate application of an electric field to the channel formation region from the top, bottom, and side surfaces thereof. This structure can have effects similar to those of the structure in FIGS. 51A to 51C.

Figure 53A:
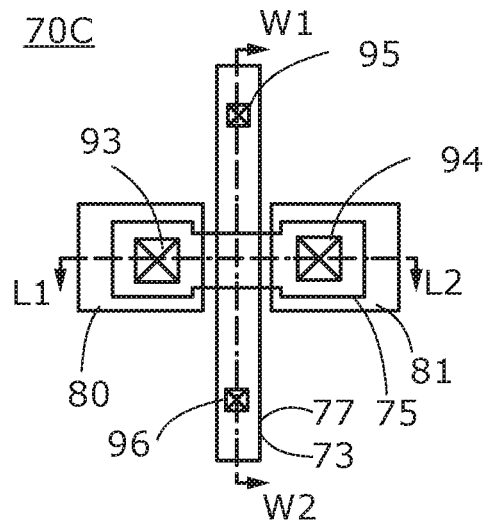
FIGS. 53A to 53C are a top view and cross-sectional views for describing one embodiment of the present invention.
Figure 53B:
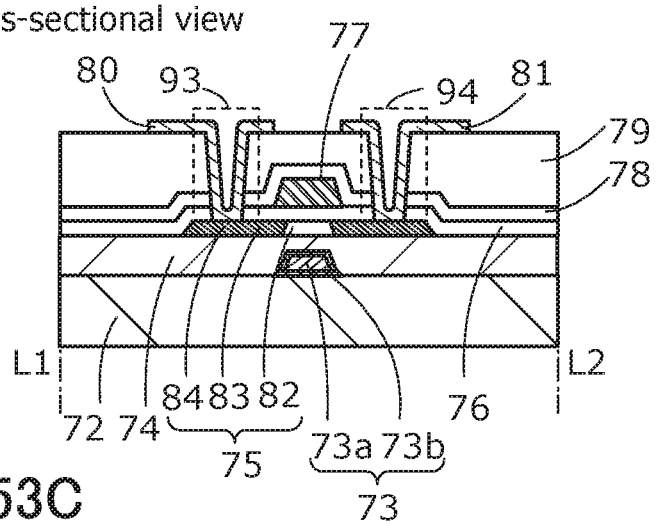
Figure 53C:
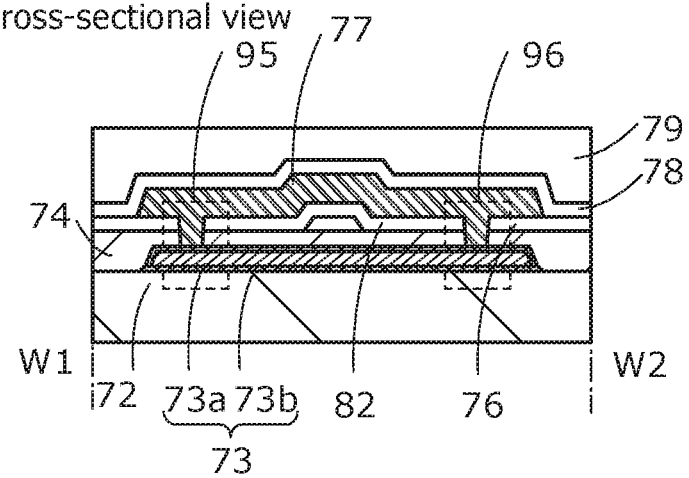

FIGS. 53A to 53C show a top view and cross-sectional views of a structure different from the structures in FIGS. 51A to 51C and FIGS. 52A to 52C.

The structure in FIGS. 53A to 53C is different from the structures in FIGS. 51A to 51C and FIGS. 52A to 52C in that the conductive film 73 serving as a backgate includes a conductive film 73a and a conductive film 73b which is surrounded by the conductive film 73a. This structure can have effects similar to those of the structure in FIGS. 51A to 51C.

In addition, even when the conductive film 73b is formed using a movable element (e.g., copper (Cu)), the structure in FIGS. 53A to 53C can prevent the movable element from entering the semiconductor film 75 and causing degradation of the semiconductor film 75.

As a material of the conductive film 73a which is on the wiring formation surface and functions as a barrier film, tungsten (W), molybdenum (Mo), chromium (Cr), titanium (Ti), or tantalum (Ta), which are high melting point materials, an alloy thereof (e.g., W—Mo, Mo—Cr, or Ta—Mo), a nitride thereof (e.g., tungsten nitride ($WN_x$), titanium nitride ($TiN_x$), tantalum nitride ($TaN_x$), or $TiSiN_x$), or the like can be used. A sputtering method, a CVD method, or the like can be employed as a formation method. As a material of the conductive film 73b, copper (Cu) is preferable;

however, there is no particular limitation as long as a low-resistance material is used. For example, silver (Ag), aluminum (Al), gold (Au), or an alloy thereof can be used. Although a sputtering method is preferable, the conductive film 73b can also be formed by a CVD method under conditions that do not damage a resist mask.

<Pixel Layout Including Transistor>

FIGS. 31A and 31B, FIGS. 32A to 32C, FIGS. 33A and 33B, FIGS. 34A and 34B, and FIGS. 35A to 35C show examples of a top view and a cross-sectional view of a pixel for which any of the above transistors can be used.

[Top View 1]

Figure 31A:
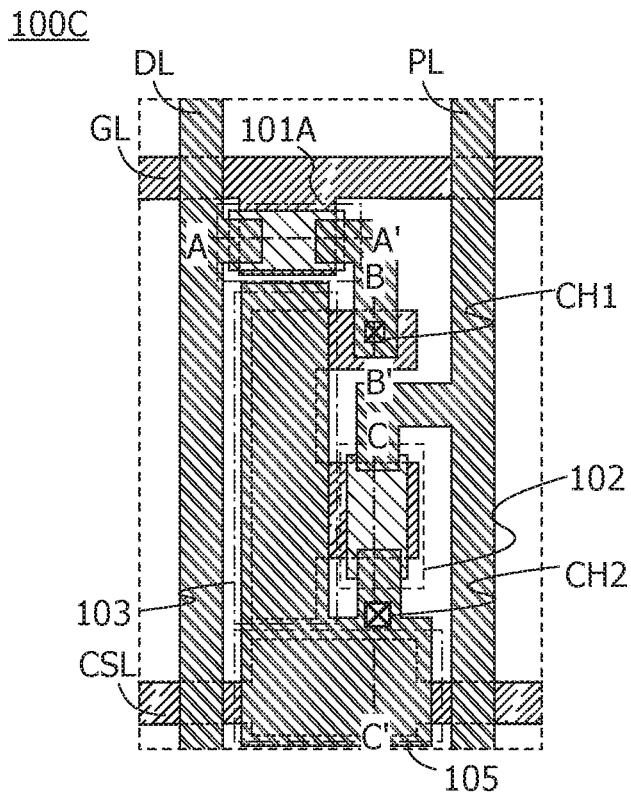
FIGS. 31A and 31B show layouts of one embodiment of the present invention.
Figure 31B:
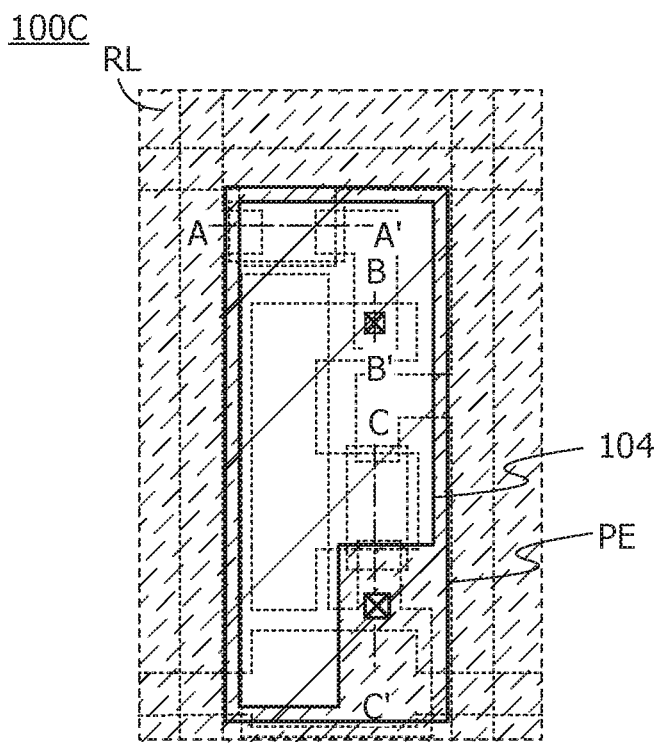

FIG. 31A shows an example of a top view of the pixel 100C in FIG. 8B. FIG. 31B illustrates the light-emitting element 104 which is stacked over the structure of the pixel 100C in FIG. 31A.

The top view in FIG. 31A illustrates the transistor 101A, the transistor 102, the capacitor 103, the capacitor 105, the gate line GL, the data line DL, the current supply line PL, the capacitor line CSL, an opening CH1, and an opening CH2.

The top view in FIG. 31B illustrates an electrode PE functioning as an anode of the light-emitting element and a partition layer RL. Although not illustrated, a light-emitting layer and an electrode functioning as a cathode of the light-emitting element are provided in an opening in the partition layer RL. Note that a region in which the electrode PE, the light-emitting layer, and the electrode functioning as a cathode of the light-emitting element overlap with each other corresponds to the light-emitting element 104.

Figure 32A:
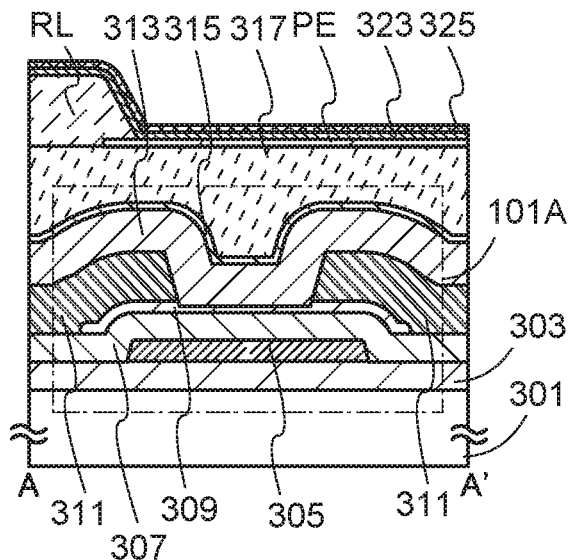
FIGS. 32A to 32C are schematic cross-sectional views for describing one embodiment of the present invention.
Figure 32B:
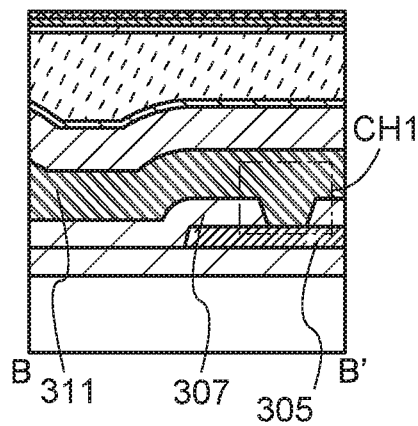
Figure 32C:
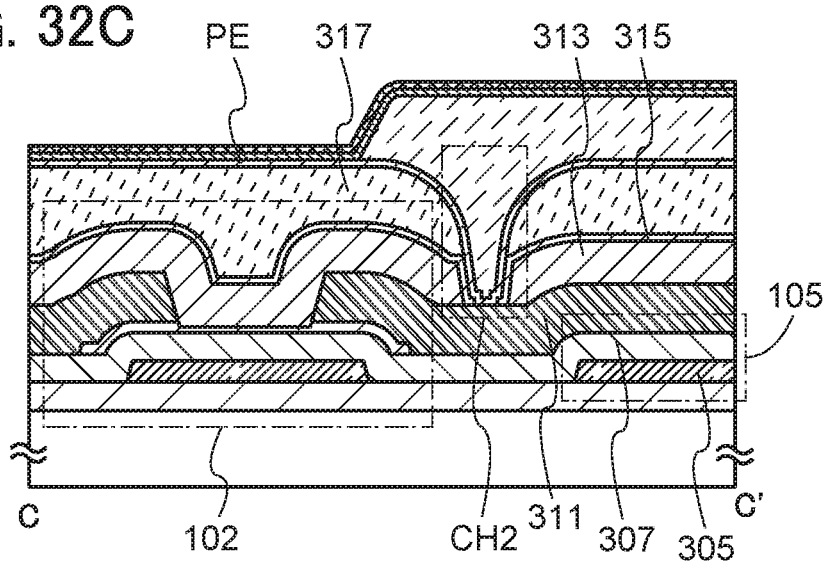

FIGS. 32A, 32B, and 32C show schematic cross-sectional views taken along dashed dotted line A-A', dashed dotted line B-B', and dashed dotted line C-C', respectively, in the top views in FIGS. 31A and 31B.

FIGS. 32A to 32C illustrate a substrate 301, an insulating film 303, a gate electrode 305, an insulating film 307, a semiconductor film 309, electrodes 311, an insulating film 313, an insulating film 315, an insulating film 317, the electrode PE, the partition layer RL, a light-emitting layer 323, an electrode 325, the opening CH1, and the opening CH2.

The insulating film 303 functions as a base film. The insulating film 307 functions as a gate insulating film. The electrodes 311 function as a source electrode and a drain electrode. The insulating film 317 functions as a planarization film. The electrode PE may function as a reflective electrode. Note that Structural Example 1 of Transistor may be referred to for the detailed structure of the transistor.

The opening CH1 is provided in the insulating film 307. The opening CH1 is an opening for connecting a layer including the gate electrode 305 to a layer including the electrode 311. The opening CH2 is provided in the insulating film 313, the insulating film 315, and the insulating film 317. The opening CH2 is an opening for connecting a layer including the electrode PE to the layer including the electrode 311.

Figure 33A:
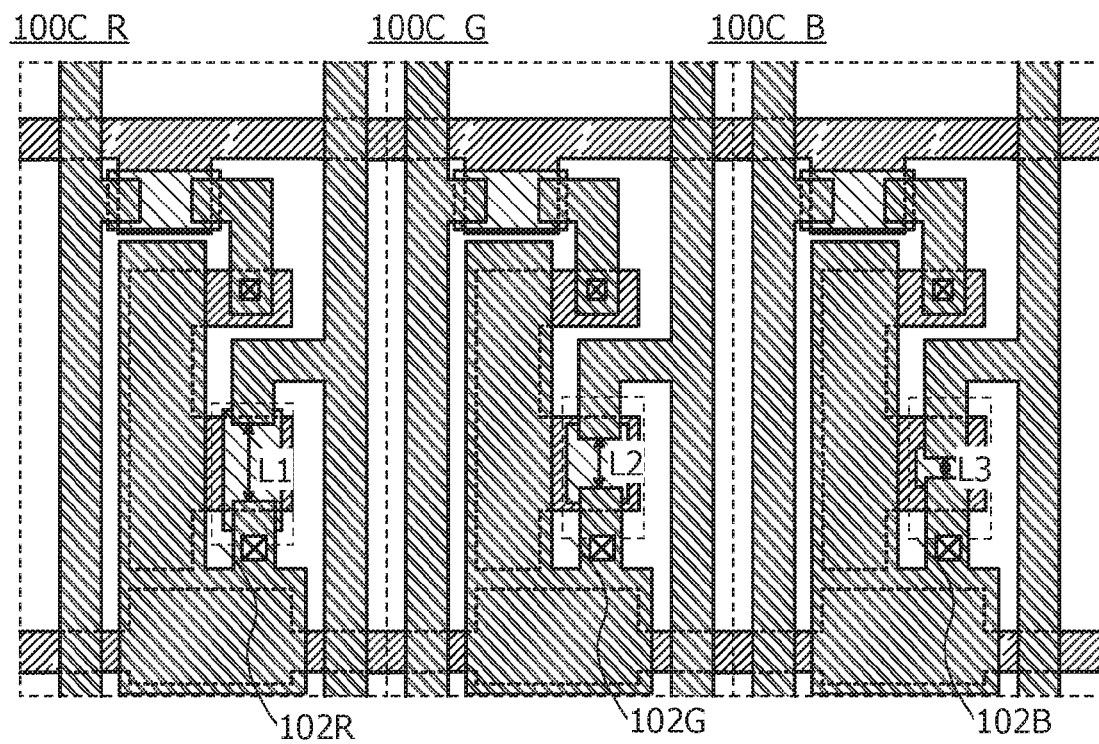
FIGS. 33A and 33B each show a layout of one embodiment of the present invention.

Note that the size of the semiconductor film may depend on the emission color of the light-emitting element. For example, FIG. 33A illustrates a pixel 100C_R emitting red light, a pixel 100C_G emitting green light, and a pixel 100C_B emitting blue light. The pixel 100C_R emitting red light includes a transistor 102R. The pixel 100C_G emitting green light includes a transistor 102G. The pixel 100C_B emitting blue light includes a transistor 102B. Other components may be the same or different between the pixels.

The transistor 102R, the transistor 102G, and the transistor 102B have respective different distances L1, L2, and L3 between the electrodes, in which case current flowing through the light-emitting element can be adjusted in the pixel for each color. Thus, a display device with high display quality can be obtained.

Note that the capacitance ratio of the capacitor 103 to the capacitor 105 may depend on the emission color of the light-emitting element. For example, FIG. 33B illustrates the pixel 100C_R emitting red light, the pixel 100C_G emitting green light, and the pixel 100C_B emitting blue light as in FIG. 33A.

The pixel 100C_R emitting red light includes a capacitor $C_{103R}$ in which the layer including the gate electrode 305 and the layer including the electrode 311 overlap with each other. The pixel 100C_R emitting red light includes a capacitor $C_{105R}$ in which the layer including the gate electrode 305 and the layer including the electrode 311 overlap with each other. In a similar manner, the pixel 100C_G emitting green light includes a capacitor $C_{103G}$ and a capacitor $C_{105G}$. In a similar manner, the pixel 100C_B emitting blue light includes a capacitor $C_{103B}$ and a capacitor $C_{105B}$.

Figure 33B:
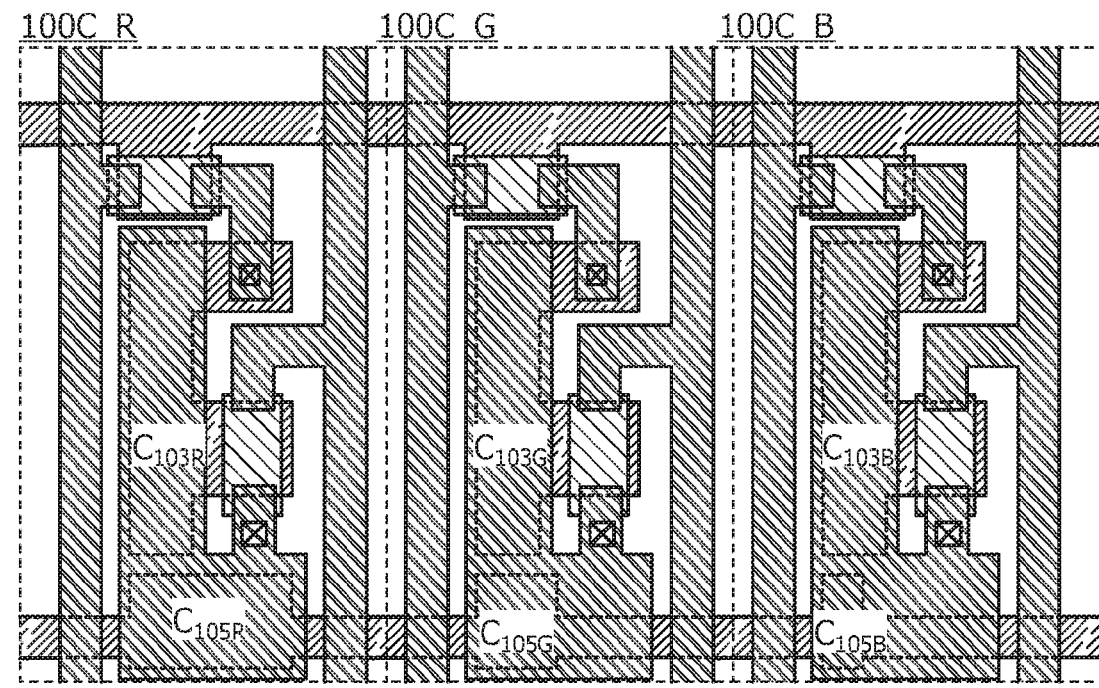

As illustrated in FIG. 33B, the ratio in area of the capacitor $C_{103R}$ to the capacitor $C_{105R}$, that of the capacitor $C_{103G}$ to the capacitor $C_{105G}$, and that of the capacitor $C_{103B}$ to the capacitor $C_{105B}$ are preferably different from each other. As a result, the potential rise on the anode side of the light-emitting element in the data voltage writing period, which depends on the capacitance ratio, can be adjusted in the pixel for each color. Thus, a display device with high display quality can be obtained.

[Top View 2]

Figure 34A:
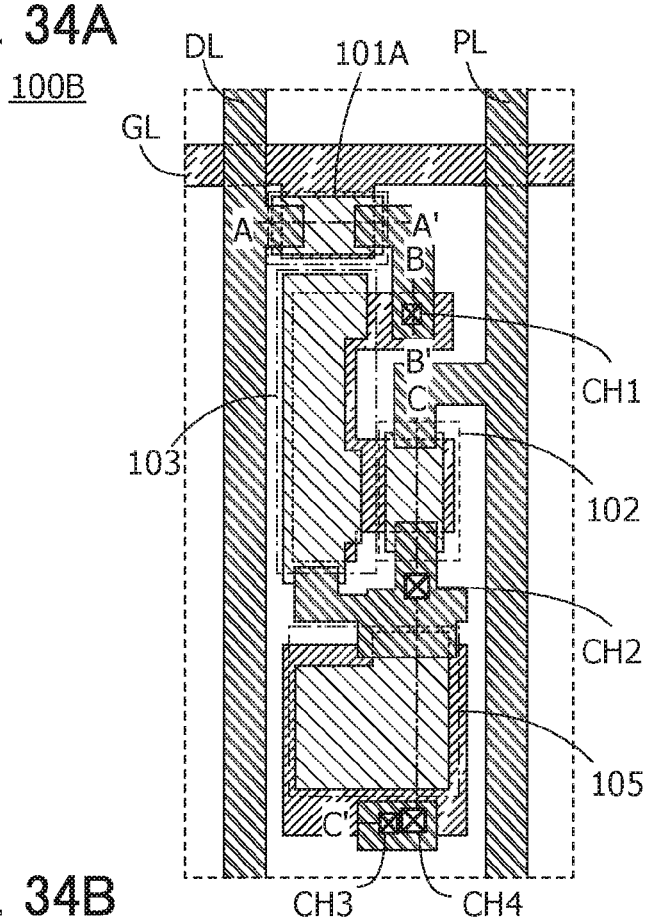
FIGS. 34A and 34B show layouts of one embodiment of the present invention.
Figure 34B:
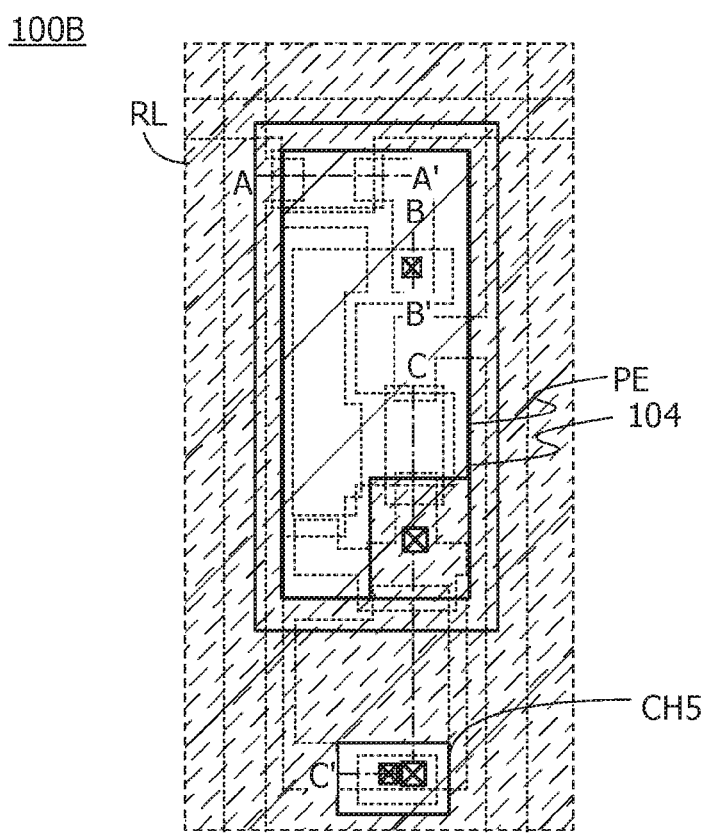

FIG. 34A shows an example of a top view of the pixel 100B in FIG. 8A. FIG. 34B illustrates the light-emitting element 104 which is stacked over the structure of the pixel 100B in FIG. 34A.

The top view in FIG. 34A illustrates the transistor 101A, the transistor 102, the capacitor 103, the capacitor 105, the gate line GL, the data line DL, the current supply line PL, the opening CH1, the opening CH2, an opening CH3, and an opening CH4.

The top view in FIG. 34B illustrates the electrode PE functioning as an anode of the light-emitting element and the partition layer RL. Although not illustrated, a light-emitting layer and an electrode functioning as a cathode of the light-emitting element are provided in an opening in the partition layer RL. Note that a region in which the electrode PE, the light-emitting layer, and the electrode functioning as a cathode of the light-emitting element overlap with each other corresponds to the light-emitting element 104. The top view in FIG. 34B also illustrates an opening CH5 provided in the partition layer RL.

Figure 35A:
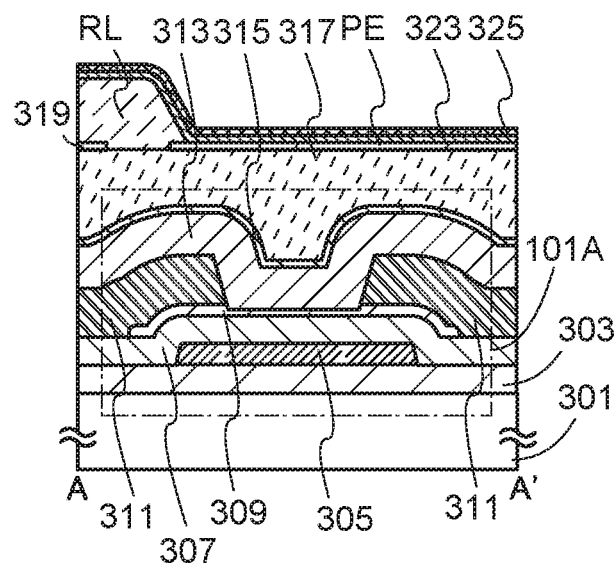
FIGS. 35A to 35C are schematic cross-sectional views for describing one embodiment of the present invention.
Figure 35B:
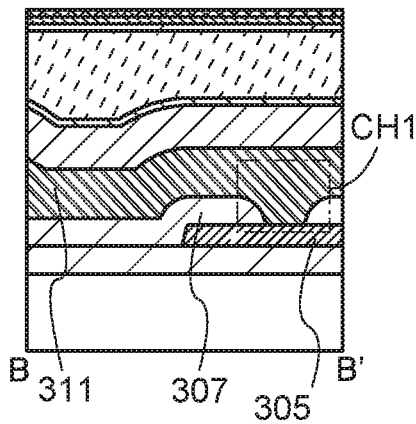
Figure 35C:
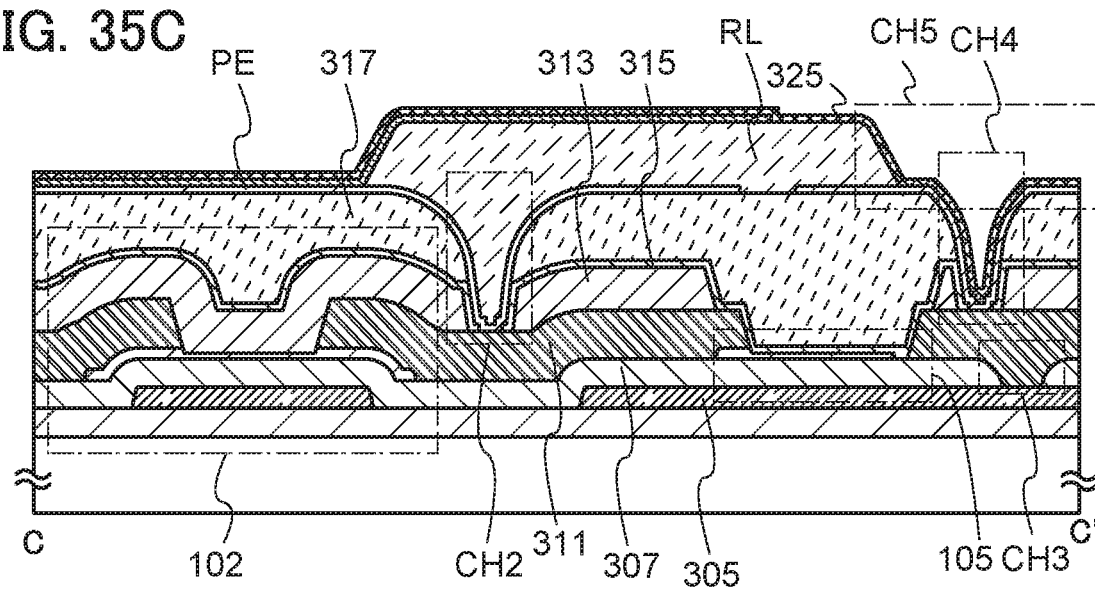

FIGS. 35A, 35B, and 35C show schematic cross-sectional views taken along dashed dotted line A-A', dashed dotted line B-B', and dashed dotted line C-C', respectively, in the top views in FIGS. 34A and 34B.

FIGS. 35A to 35C illustrate the substrate 301, the insulating film 303, the gate electrode 305, the insulating film 307, the semiconductor film 309, the electrodes 311, the insulating film 313, the insulating film 315, the insulating film 317, the electrode PE, an electrode 319, the partition layer RL, the light-emitting layer 323, the electrode 325, the opening CH1, the opening CH2, the opening CH3, the opening CH4, and the opening CH5.

The insulating film 303 functions as a base film. The insulating film 307 functions as a gate insulating film. The electrodes 311 function as a source electrode and a drain electrode. The insulating film 317 functions as a planarization film. The electrode PE may function as a reflective electrode. Note that Structural Example 1 of Transistor may be referred to for the detailed structure of the transistor.

The opening CH1 is provided in the insulating film 307. The opening CH1 is an opening for connecting a layer including the gate electrode 305 to a layer including the electrode 311. The opening CH2 is provided in the insulating film 313, the insulating film 315, and the insulating film 317. The opening CH2 is an opening for connecting a layer including the electrode PE to the layer including the electrode 311. The opening CH3 is provided in the insulating film 307. The opening CH3 is an opening for connecting the layer including the gate electrode 305 to the layer including the electrode 311. The opening CH4 is provided in the insulating film 313, the insulating film 315, and the insulating film 317. The opening CH4 is an opening for connecting the layer including the electrode PE to the layer including the electrode 311. The opening CH5 is provided in the partition layer RL. The opening CH5 is an opening for connecting the layer including the electrode PE to a layer including the electrode 325.

In the structure illustrated in the top views and the schematic cross-sectional views in FIGS. 34A and 34B and FIGS. 35A to 35C, the size of the semiconductor film may depend on the emission color of the light-emitting element as in FIG. 33A. In the structure illustrated in the top views and the schematic cross-sectional views in FIGS. 34A and 34B and FIGS. 35A to 35C, the ratio in area of the capacitor 103 to the capacitor 105 may depend on the emission color of the light-emitting element as in FIG. 33B.

Embodiment 3

In this embodiment, examples of a method for manufacturing a display device will be described with reference to FIGS. 36A to 36D, FIGS. 37A and 37B, and FIGS. 38A to 38D. Specifically, a method for manufacturing a flexible display device will be described in this embodiment.
<Method 1 for Manufacturing Display Device>

Figure 36A:
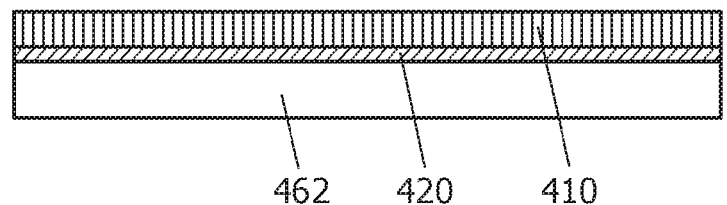
FIGS. 36A to 36D are cross-sectional views for describing one embodiment of the present invention.
Figure 36B:
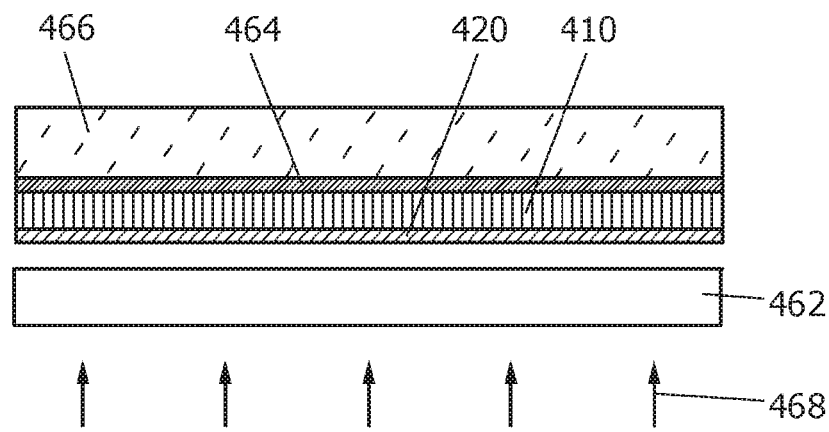

First, an insulating film 420 is formed over a substrate 462, and a first element layer 410 is formed over the insulating film 420 (see FIG. 36A). The first element layer 410 includes a semiconductor element. In addition to the semiconductor element, the first element layer 410 may include a display element or part of the display element, such as a pixel electrode.

It is necessary that the substrate 462 have at least heat resistance high enough to withstand heat treatment performed later. For example, a glass substrate, a ceramic substrate, a quartz substrate, or a sapphire substrate may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating film 420, in which case contamination from the glass substrate can be prevented.

As the insulating film 420, for example, an organic resin film formed of an epoxy resin, an aramid resin, an acrylic resin, a polyimide resin, a polyamide resin, a polyamide-imide resin, or the like can be used. It is particularly preferable to use a polyimide resin, which has high heat resistance. For example, in the case where a polyimide resin is used for the insulating film 420, the thickness of the polyimide resin is greater than or equal to 3 nm and less than or equal to 20 µm, preferably greater than or equal to 500 nm and less than or equal to 2 µm. The insulating film 420 formed of a polyimide resin can be obtained by a spin coating method, a dip coating method, a doctor blade method, or the like. For example, part of a film containing a polyimide resin is removed by a doctor blade method, whereby the insulating film 420 containing the polyimide resin and having a desired thickness can be obtained.

Note that temperatures during the process of forming the first element layer 410 are preferably higher than or equal to room temperature and lower than or equal to 300° C. For example, the deposition temperature of an insulating film or a conductive film which is included in the first element layer 410 and formed using an inorganic material is preferably higher than or equal to 150° C. and lower than or equal to 300° C., further preferably higher than or equal to 200° C. and lower than or equal to 270° C. An insulating film or the like which is included in the first element layer 410 and formed using an organic resin material is preferably formed at a deposition temperature higher than or equal to room temperature and lower than or equal to 100° C.

The above-described CAAC-OS is preferably used for an oxide semiconductor film of a transistor included in the first element layer 410. In the transistor in which the CAAC-OS is used for the oxide semiconductor film, for example, a crack or the like is less likely to be formed in a channel formation region when the display device is bent; thus, the resistance to bending can be increased.

Indium tin oxide to which silicon oxide is added is preferably used for the conductive film included in the first element layer 410 because a crack or the like is less likely to be formed in the conductive film when the display device is bent.

Next, the first element layer 410 and a temporary support substrate 466 are attached to each other with an adhesive 464 for separation, and then, the insulating film 420 and the first element layer 410 are separated from the substrate 462. In this manner, the insulating film 420 and the first element layer 410 are transferred to the temporary support substrate 466 (see FIG. 36B).

As the temporary support substrate 466, a glass substrate, a quartz substrate, a sapphire substrate, a ceramic substrate, a metal substrate, or the like can be used. Alternatively, a plastic substrate that can withstand processing temperatures of this embodiment or a flexible film-like substrate may also be used.

An adhesive with which the temporary support substrate 466 and the element layer 410 can be chemically or physically separated from each other when necessary, such as an adhesive that is soluble in water or a solvent or an adhesive that can be plasticized by irradiation with UV light or the like, is used as the adhesive 464 for separation.

A variety of methods can be used as appropriate in the process of transferring the components to the temporary support substrate 466. For example, the substrate 462 and the insulating film 420 can be separated from each other in such a manner that the insulating film 420 is embrittled by being irradiated with laser light 468 from a side of the substrate 462 on which the insulating film 420 is not formed, that is, from the bottom side in FIG. 36B. Furthermore, the substrate 462 and the insulating film 420 may be separated from each other after a region in which adhesion between the substrate 462 and the insulating film 420 is high and a region in which adhesion between the substrate 462 and the insulating film 420 is low are formed by controlling the irradiation energy density of the laser light 468.

One embodiment of the present invention is not limited to the method described in this embodiment, in which separation is caused at the interface between the substrate 462 and the insulating film 420. For example, separation may be caused at the interface between the insulating film 420 and the first element layer 410.

The insulating film 420 may be separated from the substrate 462 after the interface between the substrate 462 and the insulating film 420 is impregnated with a liquid. Alternatively, the first element layer 410 may be separated from the insulating film 420 after the interface between the insulating film 420 and the first element layer 410 is impregnated with a liquid. As the liquid, for example, water or a polar solvent can be used. The interface along which the insulating film 420 is separated, specifically the interface between the substrate 462 and the insulating film 420 or the interface between the insulating film 420 and the first element layer 410, is impregnated with a liquid, whereby static electricity or the like which is generated by the separation and affects the first element layer 410 can be reduced.

Figure 36C:
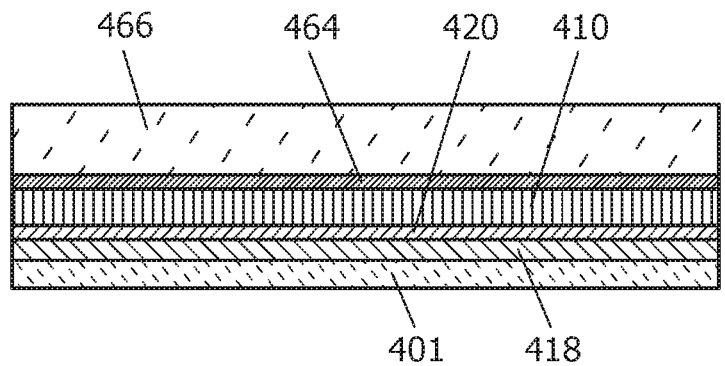

Next, a first substrate 401 is attached to the insulating film 420 with the use of an adhesive layer 418 (see FIG. 36C).

Figure 36D:
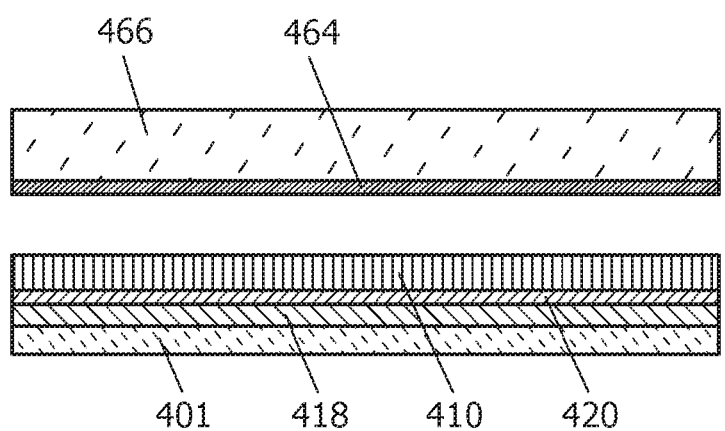

Then, the adhesive 464 for separation is dissolved or plasticized, so that the adhesive 464 for separation and the temporary support substrate 466 are removed from the first element layer 410 (see FIG. 36D).

Note that the adhesive 464 for separation is preferably removed by water, a solvent, or the like to expose the surface of the first element layer 410.

Through the above process, the first element layer 410 can be formed over the first substrate 401.

Figure 37A:
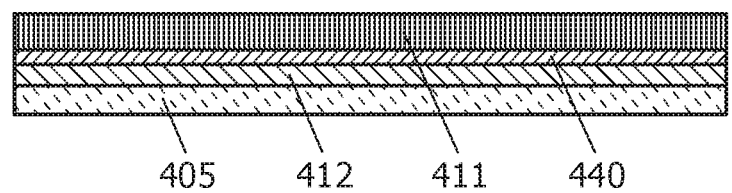
FIGS. 37A and 37B are cross-sectional views for describing one embodiment of the present invention.

Next, a second substrate 405, an adhesive layer 412 over the second substrate 405, an insulating film 440 over the adhesive layer 412, and a second element layer 411 are formed by a method including steps similar to those illustrated in FIGS. 36A to 36D (see FIG. 37A).

The insulating film 440 included in the second element layer 411 can be formed using a material similar to that of the insulating film 420, here, using an organic resin.

Figure 37B:
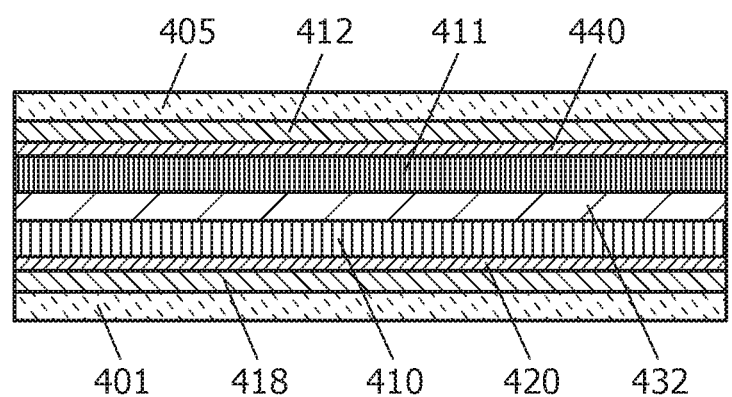

Next, a space between the first element layer 410 and the second element layer 411 is filled with a sealing layer 432 to attach the first element layer 410 and the second element layer 411 to each other (see FIG. 37B).

With the sealing layer 432, for example, solid sealing is possible. Note that the sealing layer 432 preferably has flexibility. For example, a glass material such as a glass frit or a resin material such as a resin that is curable at room temperature (e.g., a two-component resin), a photocurable resin, or a thermosetting resin can be used for the sealing layer 432.

Through the above process, the display device can be manufactured.

<Method 2 for Manufacturing Display Device>

Another method for manufacturing the display device of one embodiment of the present invention will be described with reference to FIGS. 38A to 38D. In the description of FIGS. 38A to 38D, an inorganic insulating film is used as the insulating films 420.

First, a separation layer 463 is formed over the substrate 462. Then, the insulating film 420 is formed over the separation layer 463, and the first element layer 410 is formed over the insulating film 420 (see FIG. 38A).

The separation layer 463 can have a single-layer structure or a stacked-layer structure including an element selected from tungsten, molybdenum, titanium, tantalum, niobium, nickel, cobalt, zirconium, zinc, ruthenium, rhodium, palladium, osmium, iridium, and silicon, an alloy material containing the element, or a compound material containing the element, for example. In the case the layer contains silicon, the layer containing silicon may have an amorphous, microcrystalline, polycrystalline, or single-crystal structure.

The separation layer 463 can be formed by a sputtering method, a PECVD method, a coating method, a printing method, or the like. Note that a coating method includes a spin coating method, a droplet discharge method, and a dispensing method.

In the case where the separation layer 463 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that an example of the mixture of tungsten and molybdenum is an alloy of tungsten and molybdenum.

In the case where the separation layer 463 has a stacked-layer structure including a layer containing tungsten and a layer containing a tungsten oxide, the layer containing a tungsten oxide may be formed as follows: the layer containing tungsten is formed and an oxide insulating layer is formed thereon, so that a layer containing a tungsten oxide is formed at the interface between the tungsten layer and the oxide insulating layer. Alternatively, the layer containing a tungsten oxide may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. The surface condition of the separation layer 463 is changed by the plasma treatment or the heat treatment, whereby adhesion between the separation layer 463 and the insulating film 420 formed later can be controlled.

The insulating film 420 can be formed using an inorganic insulating film with low moisture permeability, such as a silicon oxide film, a silicon nitride film, a silicon oxynitride film, a silicon nitride oxide film, or an aluminum oxide film. The inorganic insulating film can be formed by a sputtering method or a PECVD method, for example.

Next, the first element layer 410 and the temporary support substrate 466 are attached to each other with the adhesive 464 for separation, and then, the insulating film 420 and the first element layer 410 are separated from the separation layer 463. In this manner, the insulating film 420 and the first element layer 410 are transferred to the temporary support substrate 466 (see FIG. 38B).

A variety of methods can be used as appropriate in the process of transferring the components to the temporary support substrate 466. For example, the insulating film 420 can be separated from the separation layer 463 in the following manner: a layer including a metal oxide film is formed at the interface between the separation layer 463 and the insulating film 420, and then, the metal oxide film is embrittled by crystallization. Alternatively, in the case where the separation layer 463 is formed using a tungsten film, separation may be performed by etching the tungsten film with a mixed solution of ammonia water and hydrogen peroxide water.

The insulating film 420 may be separated from the separation layer 463 after the interface between the separation layer 463 and the insulating film 420 is impregnated with a liquid. As the liquid, for example, water or a polar solvent can be used. The interface along which the insulating film 420 is separated, specifically the interface between the separation layer 463 and the insulating film 420, is impregnated with a liquid, whereby static electricity or the like which is generated by the separation and affects the first element layer 410 can be reduced.

Figure 38A:
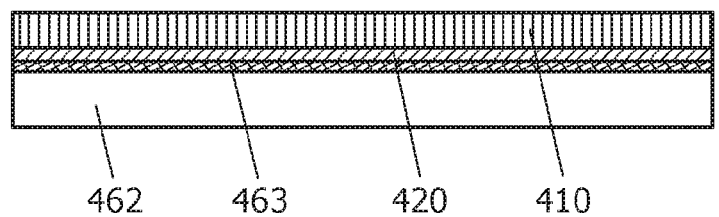
FIGS. 38A to 38D are cross-sectional views for describing one embodiment of the present invention.
Figure 38B:
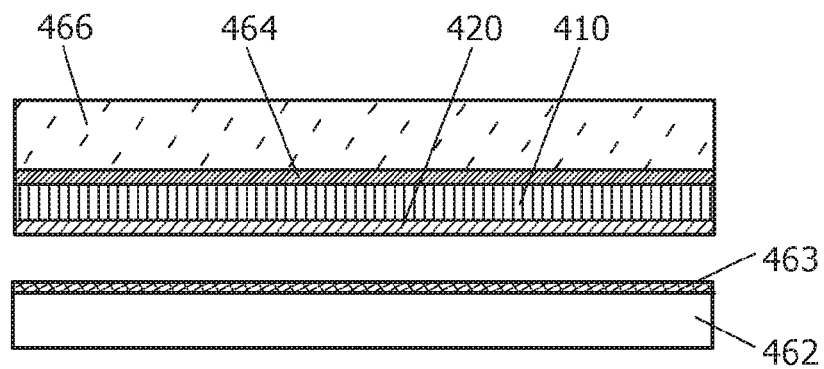
Figure 38C:
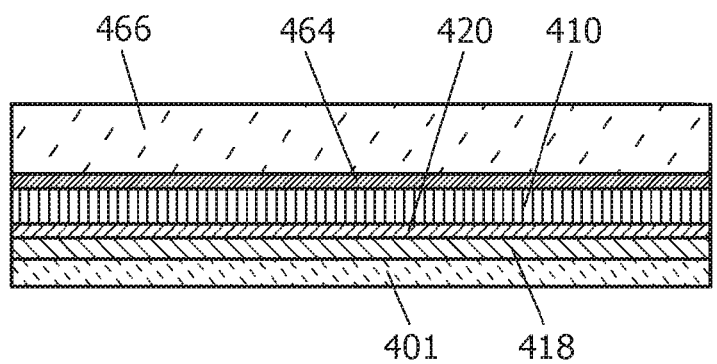

Next, the first substrate 401 is attached to the insulating film 420 with the use of the adhesive layer 418 (see FIG. 38C).

Figure 38D:
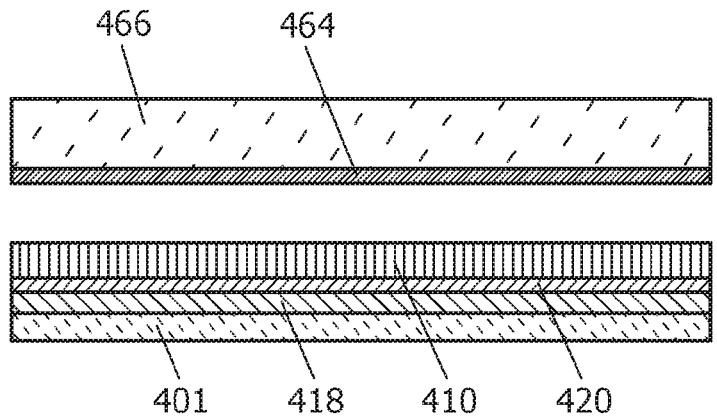

Then, the adhesive 464 for separation is dissolved or plasticized, so that the adhesive 464 for separation and the temporary support substrate 466 are removed from the first element layer 410 (see FIG. 38D).

Note that the adhesive 464 for separation is preferably removed by water, a solvent, or the like to expose the surface of the first element layer 410.

Through the above process, the first element layer 410 can be formed over the first substrate 401.

Next, the second substrate 405, the adhesive layer 412 over the second substrate 405, the insulating film 440 over the adhesive layer 412, and the second element layer 411 are formed by a method including steps similar to those illustrated in FIGS. 38A to 38D. After that, a space between the first element layer 410 and the second element layer 411 is filled with the sealing layer 432 to attach the first element layer 410 and the second element layer 411 to each other.

Finally, an anisotropic conductive film and an FPC are attached to an exposed connection electrode. An IC chip or the like may be mounted if necessary.

Through the above process, the display device can be manufactured.

Embodiment 4

In this embodiment, a display device of one embodiment of the present invention and an electronic device which includes the display device provided with an input device will be described with reference to FIGS. 39A and 39B, FIGS. 40A and 40B, FIG. 41, FIGS. 42A and 42B, FIGS. 43A and 43B, and FIG. 44.

<Touch Panel>

In this embodiment, a touch panel 2000 including a display device and an input device will be described as an example of an electronic device. In the example described below, a touch sensor is used as an input device.

Figure 39A:
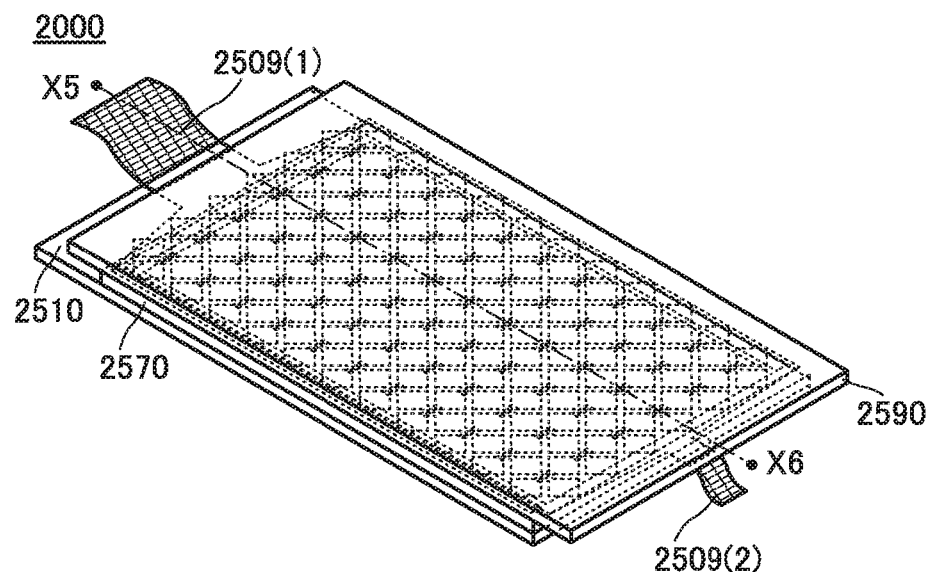
FIGS. 39A and 39B are perspective views for describing one embodiment of the present invention.
Figure 39B:
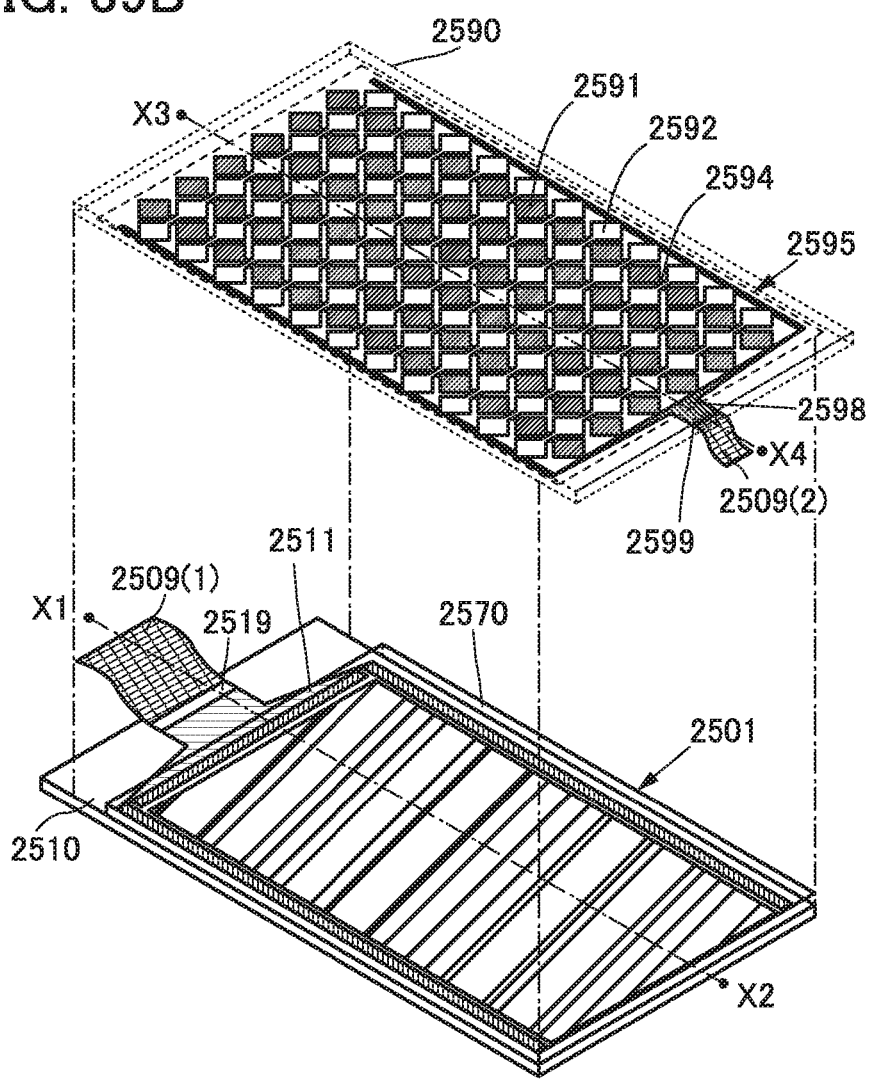

FIGS. 39A and 39B are perspective views of the touch panel 2000. Note that FIGS. 39A and 39B illustrate typical components of the touch panel 2000 for clarity.

The touch panel 2000 includes a display device 2501 and a touch sensor 2595 (see FIG. 39B). Furthermore, the touch panel 2000 includes a substrate 2510, a substrate 2570, and a substrate 2590. The substrate 2510, the substrate 2570, and the substrate 2590 each have flexibility. Note that at least one of the substrates 2510, 2570, and 2590 may be inflexible.

The display device 2501 includes a plurality of pixels over the substrate 2510 and a plurality of wirings 2511 through which signals can be supplied to the pixels. The plurality of wirings 2511 is led to a peripheral portion of the substrate 2510, and some of the wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 is led to a peripheral portion of the substrate 2590, and some of the wirings 2598 form a terminal. The terminal is electrically connected to an FPC 2509(2). In FIG. 39B, electrodes, wirings, and the like of the touch sensor 2595 provided on the back side of the substrate 2590 (the side facing the substrate 2510) are shown by solid lines for clarity.

As the touch sensor 2595, a capacitive touch sensor can be used, for example. Examples of the capacitive touch sensor are a surface capacitive touch sensor and a projected capacitive touch sensor.

Examples of the projected capacitive touch sensor are a self-capacitive touch sensor and a mutual capacitive touch sensor, which differ mainly in the driving method. A mutual capacitive touch sensor is preferably used because multiple points can be sensed simultaneously.

Note that the touch sensor 2595 in FIG. 39B is a projected capacitive touch sensor.

Note that a variety of sensors that can sense approach or contact of an object such as a finger can be used as the touch sensor 2595.

The projected capacitive touch sensor 2595 includes electrodes 2591 and electrodes 2592. The electrodes 2591 are electrically connected to respective wirings of the plurality of wirings 2598, and the electrodes 2592 are electrically connected to respective wirings of the other wirings 2598.

As illustrated in FIGS. 39A and 39B, each of the electrodes 2592 has a shape in which a plurality of quadrangles connected at their corners is repeatedly arranged in one direction.

Each of the electrodes 2591 has a shape in which quadrangles are repeatedly arranged in the direction intersecting with the direction in which the electrodes 2592 extend.

A wiring 2594 electrically connects two electrodes 2591 between which the electrode 2592 is positioned. The area of the intersection of the electrode 2592 and the wiring 2594 is preferably as small as possible. Such a structure allows a reduction in the area of a region in which no electrode is provided, reducing variation in transmittance. As a result, variation in the luminance of light passing through the touch sensor 2595 can be reduced.

Note that the shapes of the electrodes 2591 and the electrodes 2592 are not limited thereto and can be a variety of shapes. For example, the following structure may be employed: the plurality of electrodes 2591 is arranged as tightly as possible, an insulating layer is provided between the electrodes 2591 and the electrodes 2592, and the plurality of electrodes 2592 is spaced apart from each other to have regions not overlapping with the electrodes 2591. In this case, between two adjacent electrodes 2592, a dummy electrode which is electrically insulated from these electrodes is preferably provided, whereby the area of a region having a different transmittance can be reduced.

As an example of a conductive film for the electrodes 2591, the electrodes 2592, the wirings 2598, and the like, that is, wirings and electrodes forming the touch panel, a transparent conductive film containing indium oxide, tin oxide, zinc oxide, or the like (e.g., ITO) can be given. For example, a low-resistance material is preferably used for the wirings and electrodes forming the touch panel. For example, silver, copper, aluminum, a carbon nanotube, graphene, or a metal halide (e.g., a silver halide) may be used. Alternatively, a metal nanowire including a plurality of conductors with an extremely small width (e.g., a diameter of several nanometers) may be used. Further alternatively, a metal mesh, which is a net-like conductor, may be used. For example, an Ag nanowire, a Cu nanowire, an Al nanowire, an Ag mesh, a Cu mesh, or an Al mesh may be used. For example, a touch panel in which Ag nanowires are used as wirings and electrodes can have a visible light transmittance higher than or equal to 89% and a sheet resistance higher than or equal to 40 Ω/cm² and lower than or equal to 100 Ω/cm². Since the above-described metal nanowire, metal mesh, carbon nanotube, graphene, and the like, which are examples of the material that can be used for the wirings and electrodes forming the touch panel, have high visible light transmittance, they may be used for an electrode of a display element (e.g., a pixel electrode or a common electrode).

<Display Device>

Figure 40A:
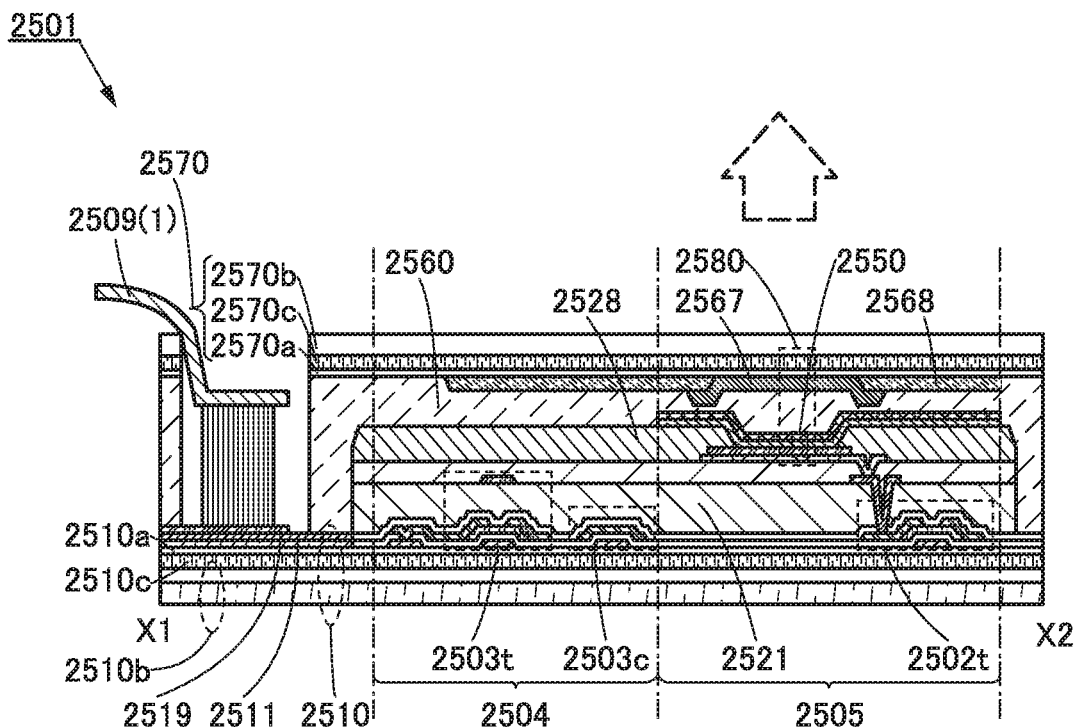
FIGS. 40A and 40B are each a cross-sectional view for describing one embodiment of the present invention.
Figure 40B:
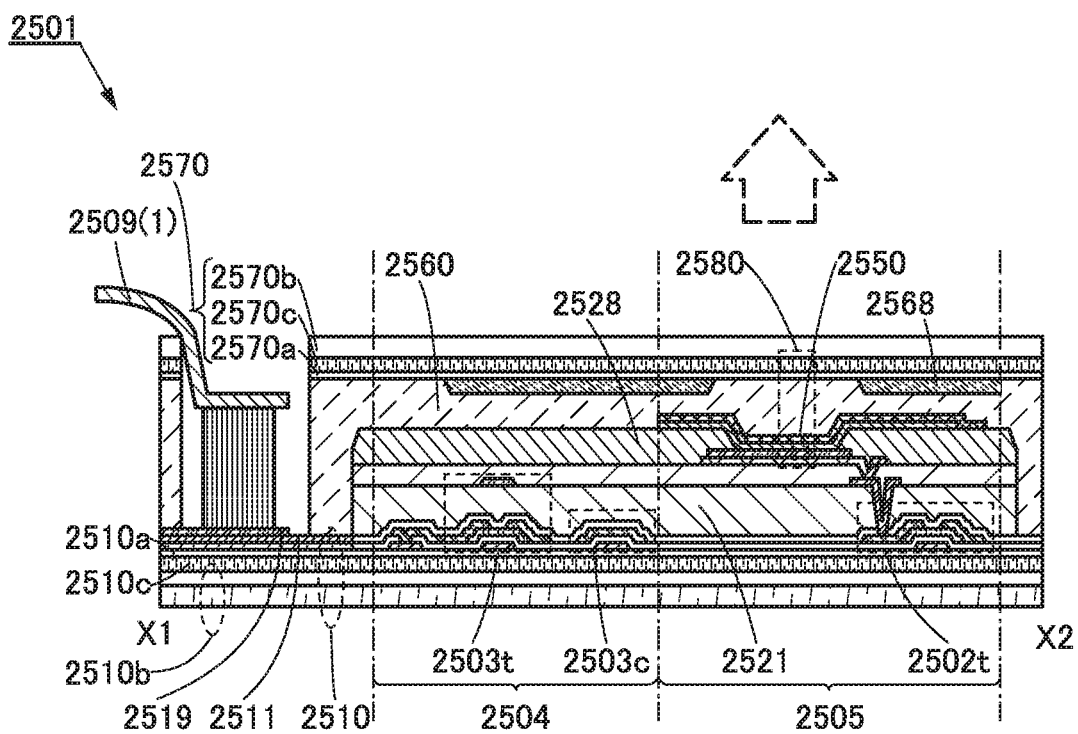

Next, the display device 2501 will be described in detail with reference to FIGS. 40A and 40B. FIGS. 40A and 40B are cross-sectional views taken along dashed-dotted line X1-X2 in FIG. 39B.

The display device 2501 includes a plurality of pixels arranged in a matrix. Each of the pixels includes a display element and a pixel circuit for driving the display element.

In the cross-sectional view in FIG. 40A, an EL element that emits white light is used as a display element; the EL element does not necessarily have such a structure. For example, as illustrated in FIG. 40B, EL elements that emit light in different colors may be provided so that light emitted from adjacent pixels differs in color. In the example described below, an EL element that emits white light is used as a display element.

For the substrate 2510 and the substrate 2570, for example, a flexible material with a vapor permeability lower than or equal to $10^{-5}$ g/(m²·day), preferably lower than or equal to $10^{-6}$ g/(m²·day) can be favorably used. Note that materials are preferably selected such that the substrate 2510 and the substrate 2570 have substantially equal thermal expansion coefficients. For example, the coefficients of linear expansion of the materials are preferably lower than or equal to $1\times10^{-3}$/K, further preferably lower than or equal to $5\times10^{-5}$/K, still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, a material that contains polyester, polyolefin, polyamide (e.g., nylon or aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a higher refractive index than the air. In the case where light is extracted to the sealing layer 2560 side as illustrated in FIG. 40A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (e.g., nitrogen or argon) may be used instead of the sealing layer 2560. A drying agent may be provided in the inert gas so as to adsorb moisture or the like. For example, an epoxy-based resin or a glass frit is preferably used as the sealant. For the sealant, a material which is impermeable to moisture or oxygen is preferably used.

The display device 2501 in FIG. 40A includes a pixel 2505. The pixel 2505 includes a light-emitting module 2580 including the EL element 2550, and a transistor 2502t that can supply power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567. In the case where the emission color of the EL element differs between pixels, the coloring layer 2567 can be omitted as illustrated in FIG. 40B.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 40A.

The display device 2501 includes a light-blocking layer 2568 on the light extraction side. The light-blocking layer 2568 is provided so as to surround the coloring layer 2567.

The coloring layer 2567 may have a function of transmitting light in a particular wavelength range. For example, a color filter that transmits light in a red wavelength range, a color filter that transmits light in a green wavelength range, a color filter that transmits light in a blue wavelength range, a color filter that transmits light in a yellow wavelength range, or the like can be used. Each color filter can be formed using a variety of materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering unevenness caused by the pixel circuit. The insulating layer 2521 may also have a function of suppressing impurity diffusion. This can prevent the reliability of the transistor 2502t or the like from being decreased by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A gate driver circuit 2504 includes a transistor 2503t and a capacitor 2503c. Note that the driver circuit and the pixel circuit can be formed in the same process over the same substrate.

The wiring 2511 through which a signal can be supplied is provided over the substrate 2510. The terminal 2519 is provided over the wiring 2511. The FPC 2509(1) is electrically connected to the terminal 2519. The FPC 2509(1) has a function of supplying a video signal, a clock signal, a start signal, a reset signal, or the like. Note that a printed wiring board (PWB) may be attached to the FPC 2509(1).

The transistor described in the above embodiment may be used as the transistor 2502t and/or the transistor 2503t. The transistor used in this embodiment includes an oxide semiconductor film which is highly purified and has high crystallinity. In the transistor, the current in an off state (off-state current) can be reduced. Accordingly, an electrical signal such as an image signal can be held for a long period, and a long writing interval can be set in an on state. Accordingly, the frequency of refresh operation can be reduced, which suppresses power consumption. Note that the detail of the refresh operation will be described later.

In addition, the transistor used in this embodiment can have relatively high field-effect mobility and thus is capable of high speed operation. For example, when such transistors capable of high-speed operation are used for the display device 2501, a switching transistor in a pixel circuit and a driver transistor in a driver circuit can be formed over one substrate. That is, no additional semiconductor device formed using a silicon wafer or the like is needed as a driver circuit; therefore, the number of components of the semiconductor device can be reduced. In addition, the transistor capable of high-speed operation can also be used for the pixel portion, whereby a high-quality image can be provided.

<Touch Sensor>

Figure 41:
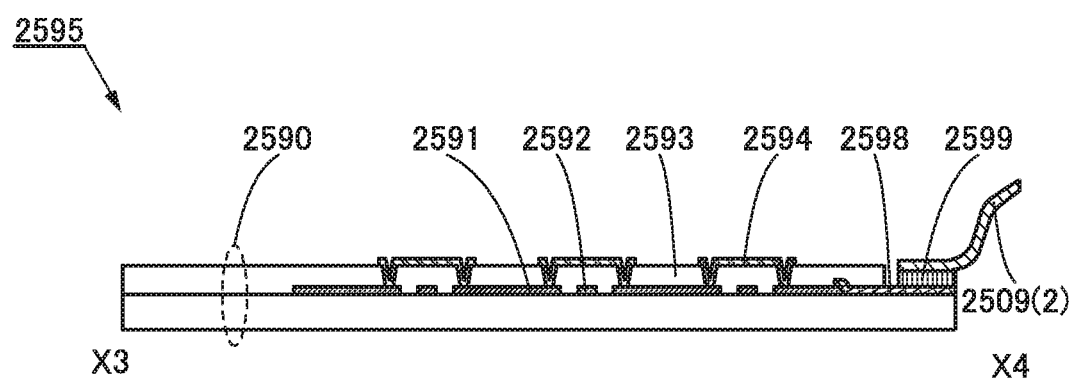
FIG. 41 is a cross-sectional view for describing one embodiment of the present invention.

Next, the touch sensor 2595 will be described in detail with reference to FIG. 41. FIG. 41 is a cross-sectional view taken along dashed-dotted line X3-X4 in FIG. 39B.

The touch sensor 2595 includes the electrodes 2591 and the electrodes 2592 which are provided in a staggered arrangement on the substrate 2590, an insulating layer 2593 covering the electrodes 2591 and the electrodes 2592, and the wiring 2594 which electrically connects the adjacent electrodes 2591.

The electrodes 2591 and the electrodes 2592 are formed using a light-transmitting conductive material. As the light-transmitting conductive material, a conductive oxide such as indium oxide, indium tin oxide, indium zinc oxide, zinc oxide, or zinc oxide to which gallium is added can be used. Note that a film containing graphene can be used as well. The film containing graphene can be formed, for example, by reducing a film containing graphene oxide. As a reducing method, heating or the like can be employed.

For example, the electrodes 2591 and the electrodes 2592 can be formed in the following manner: a light-transmitting conductive material is deposited on the substrate 2590 by a sputtering method, and then, an unnecessary portion is removed by a variety of patterning techniques such as photolithography.

Examples of a material of the insulating layer 2593 are an acrylic resin, an epoxy resin, a resin having a siloxane bond, and an inorganic insulating material such as silicon oxide, silicon oxynitride, or aluminum oxide.

Furthermore, openings reaching the electrodes 2591 are provided in the insulating layer 2593, and the wiring 2594 electrically connects the adjacent electrodes 2591. A light-transmitting conductive material can be favorably used for the wiring 2594 because the aperture ratio of the touch panel can be increased. Moreover, a material having higher conductivity than the electrodes 2591 and the electrodes 2592 can be favorably used for the wiring 2594 because electric resistance can be reduced.

Each of the electrodes 2592 extends in one direction, and the plurality of electrodes 2592 is provided in the form of stripes. The wiring 2594 intersects with the electrode 2592.

One electrode 2592 is positioned between adjacent two electrodes 2591. The wiring 2594 electrically connects the adjacent two electrodes 2591.

Note that the plurality of electrodes 2591 is not necessarily arranged in the direction orthogonal to one electrode 2592 and may be arranged to intersect with one electrode 2592 at an angle greater than 0° and less than 90°.

The wiring 2598 is electrically connected to any of the electrodes 2591 and 2592. Part of the wiring 2598 functions as a terminal. For the wiring 2598, for example, a metal material such as aluminum, gold, platinum, silver, nickel, titanium, tungsten, chromium, molybdenum, iron, cobalt, copper, or palladium or an alloy material containing the metal material can be used.

Note that an insulating layer that covers the insulating layer 2593 and the wiring 2594 may be provided to protect the touch sensor 2595.

Furthermore, a connection layer 2599 electrically connects the wiring 2598 to the FPC 2509(2).

As the connection layer 2599, an anisotropic conductive film (ACF), an anisotropic conductive paste (ACP), or the like can be used.

<Cross-Sectional Structure of Touch Panel>

Figure 42A:
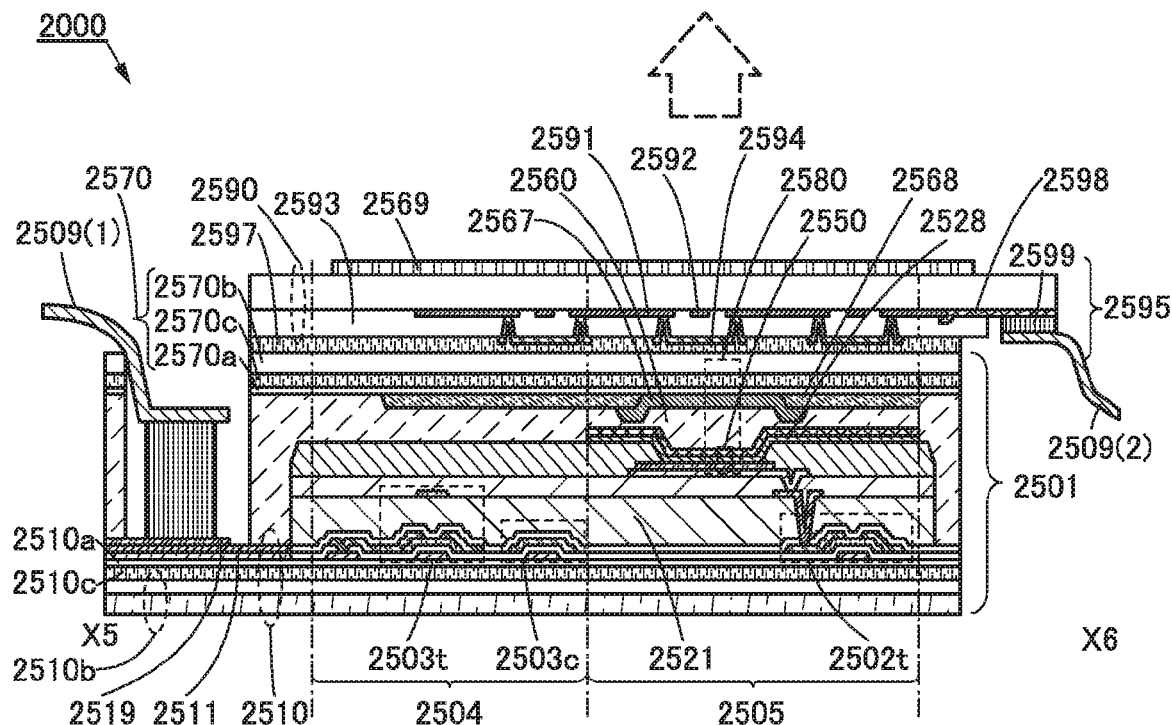
FIGS. 42A and 42B are each a cross-sectional view for describing one embodiment of the present invention.

Next, the touch panel 2000 will be described in detail with reference to FIG. 42A. FIG. 42A is a cross-sectional view taken along dashed-dotted line X5-X6 in FIG. 39A.

In the touch panel 2000 in FIG. 42A, the display device 2501 described with reference to FIG. 40A and the touch sensor 2595 described with reference to FIG. 41 are attached to each other.

The touch panel 2000 in FIG. 42A includes an adhesive layer 2597 and an anti-reflective layer 2569 in addition to the components described with reference to FIG. 40A.

The adhesive layer 2597 is provided in contact with the wiring 2594. Note that the adhesive layer 2597 attaches the substrate 2590 to the substrate 2570 such that the touch sensor 2595 overlaps with the display device 2501. The adhesive layer 2597 preferably has a light-transmitting property. A thermosetting resin or an ultraviolet curable resin can be used for the adhesive layer 2597. For example, an acrylic-based resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that in FIG. 42A will be described with reference to FIG. 42B.

Figure 42B:
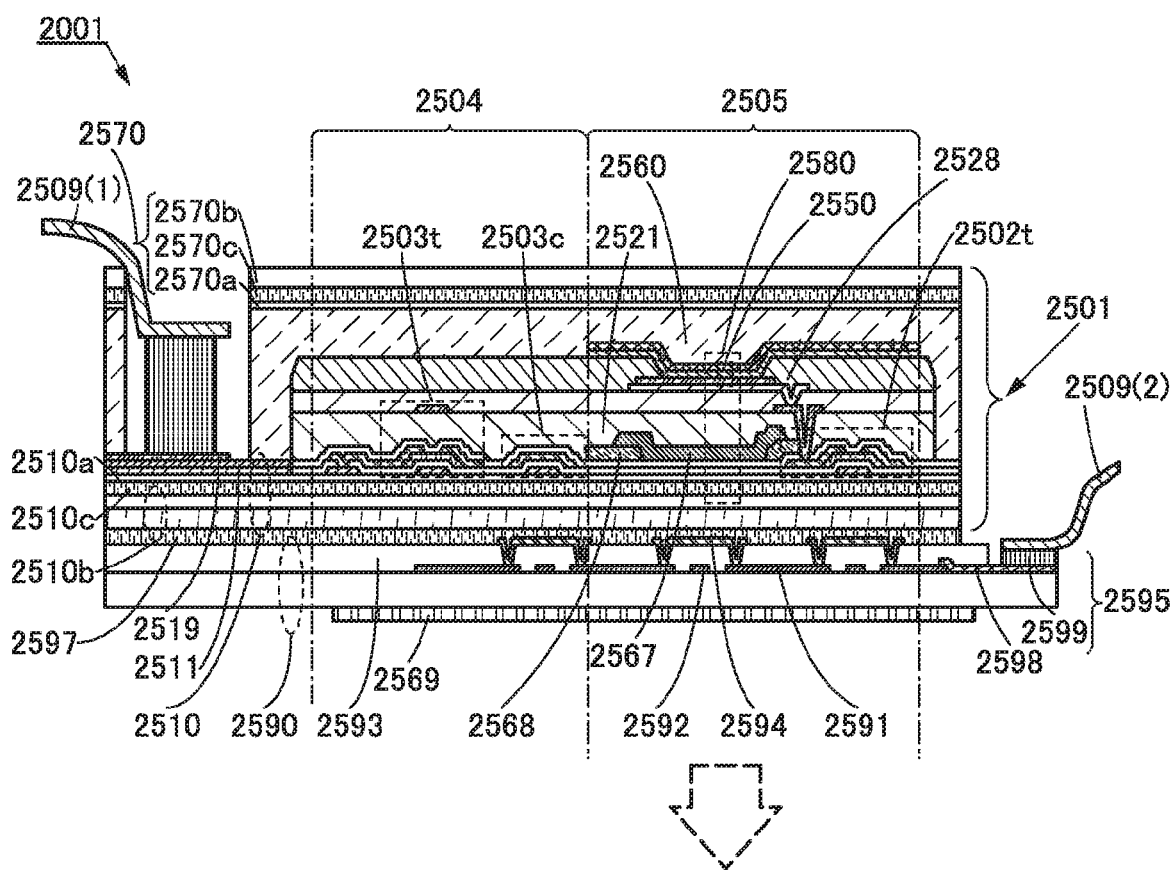

FIG. 42B is a cross-sectional view of a touch panel 2001. The touch panel 2001 in FIG. 42B is different from the touch panel 2000 in FIG. 42A in the position of the touch sensor 2595 relative to the display device 2501. Different parts will be described in detail below, and the above description of the touch panel 2000 is referred to for similar parts.

The coloring layer 2567 is positioned under the EL element 2550. The EL element 2550 in FIG. 42B emits light to the side on which the transistor 2502t is provided. Accordingly, part of light emitted from the EL element 2550 passes through the coloring layer 2567 and is emitted to the outside of the light-emitting module 2580 as indicated by an arrow in FIG. 42B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIGS. 42A and 42B, light emitted from the light-emitting element may be extracted through the substrate 2510 and/or the substrate 2570.

<Method for Driving Touch Panel>

Next, an example of a method for driving a touch panel will be described with reference to FIGS. 43A and 43B.

Figure 43A:
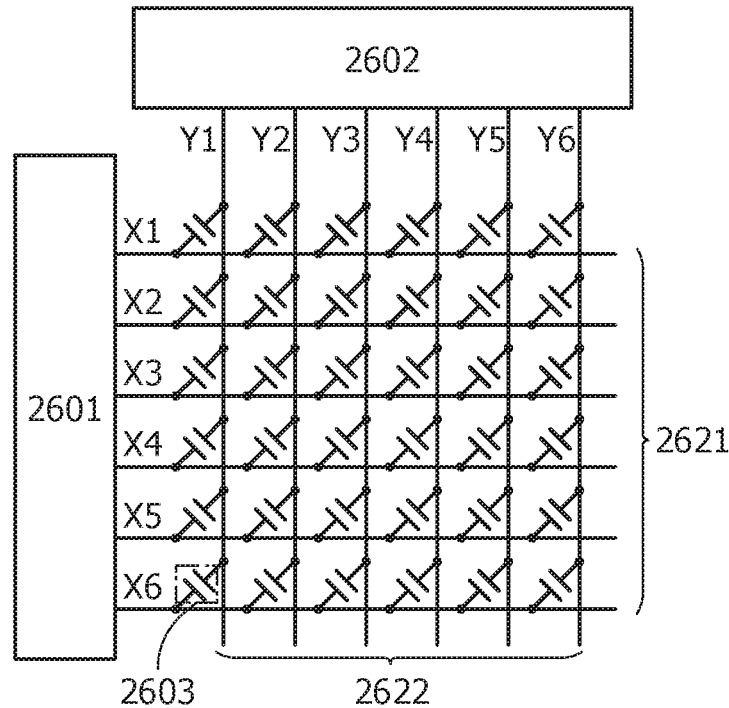
FIGS. 43A and 43B are a block diagram and a timing chart for describing one embodiment of the present invention.

FIG. 43A is a block diagram illustrating the configuration of a mutual capacitive touch sensor. FIG. 43A illustrates a pulse voltage output circuit 2601 and a current sensing circuit 2602. In FIG. 43A, six wirings X1 to X6 represent electrodes 2621 to which a pulse voltage is applied, and six wirings Y1 to Y6 represent electrodes 2622 which sense changes in current. FIG. 43A also illustrates capacitors 2603 which are each formed of the electrode 2621 and the electrode 2622 overlapping with each other. Note that functional replacement between the electrode 2621 and the electrode 2622 is possible.

The pulse voltage output circuit 2601 is a circuit for sequentially applying a pulse voltage to the wirings X1 to X6. By application of the pulse voltage to the wirings X1 to X6, an electric field is generated between the electrode 2621 and the electrode 2622 of the capacitor 2603. For example, when the electric field between the electrodes is shielded, a change occurs in the mutual capacitance of the capacitor 2603. The approach or contact of an object can be sensed by utilizing this change.

The current sensing circuit 2602 is a circuit for sensing a change in current flowing through the wirings Y1 to Y6, which is caused by the change in mutual capacitance in the capacitor 2603. No change in current value is sensed in the wirings Y1 to Y6 when there is no approach or contact of an object, whereas a decrease in current value is sensed when the mutual capacitance is decreased owing to approach or contact of an object. Note that an integrator circuit or the like is used for sensing of current.

Figure 43B:
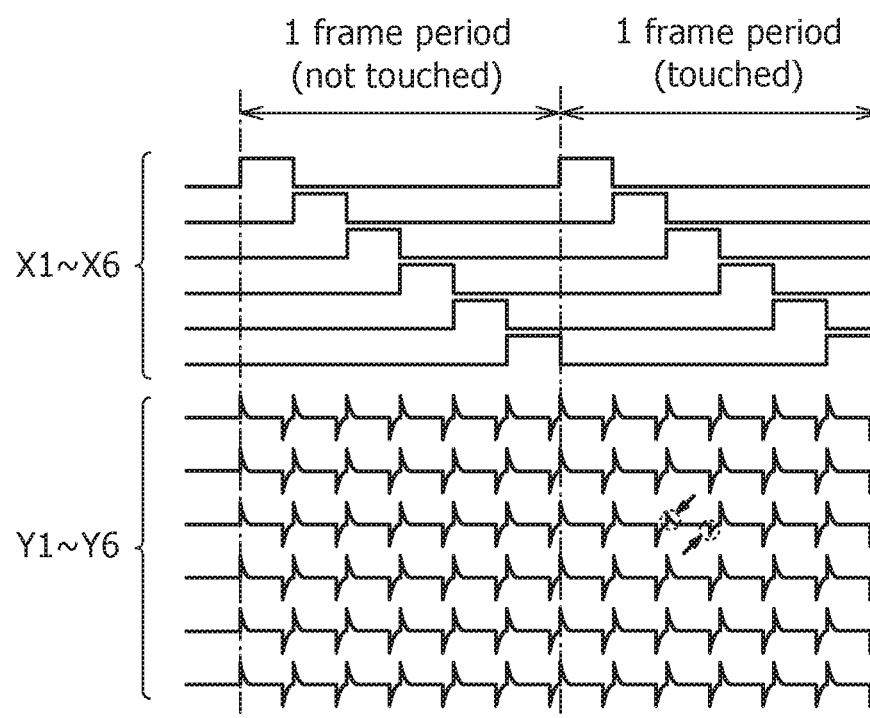

FIG. 43B is a timing chart illustrating input and output waveforms in the mutual capacitive touch sensor in FIG. 43A. In FIG. 43B, sensing of an object is performed in all the rows and columns in one frame period. FIG. 43B illustrates a period in which no object is sensed (not touched) and a period in which an object is sensed (touched). Sensed current values of the wirings Y1 to Y6 are shown as voltage waveforms.

A pulse voltage is sequentially applied to the wirings X1 to X6, and waveforms of the wirings Y1 to Y6 change in accordance with the pulse voltage. When there is no approach or contact of an object, the waveforms of the wirings Y1 to Y6 uniformly change in accordance with changes in the voltage of the wirings X1 to X6. The current value decreases at the point of the approach or contact of the object; accordingly, the waveform of the voltage value also changes.

By sensing a change in mutual capacitance in this manner, approach or contact of an object can be sensed.

<Sensor Circuit>

Figure 44:
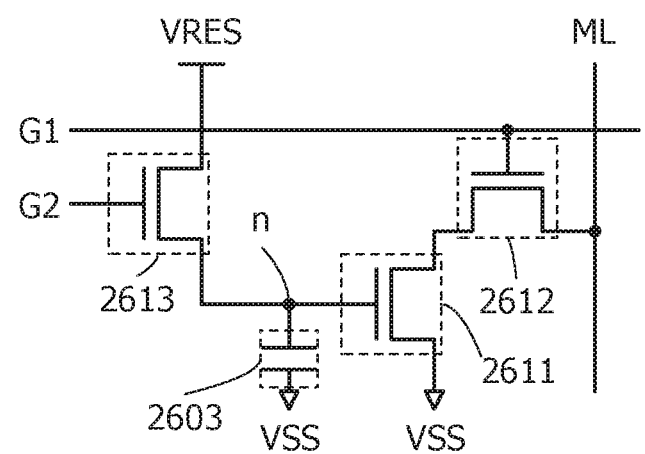
FIG. 44 is a circuit diagram for describing one embodiment of the present invention.

Although FIG. 43A illustrates a passive touch sensor in which only the capacitor 2603 is provided at the intersection of wirings as a touch sensor, an active touch sensor including a transistor and a capacitor may also be used. FIG. 44 illustrates an example of a sensor circuit included in an active touch sensor.

The sensor circuit in FIG. 44 includes the capacitor 2603, a transistor 2611, a transistor 2612, and a transistor 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 44 will be described. First, a potential for turning on the transistor 2613 is supplied as the signal G2, and a potential corresponding to the voltage VRES is supplied to a node n connected to the gate of the transistor 2611. Then, a potential for turning off the transistor 2613 is supplied as the signal G2, whereby the potential of the node n is held.

Then, the mutual capacitance of the capacitor 2603 changes owing to the approach or contact of an object such as a finger, and accordingly, the potential of the node n changes from VRES.

In a reading operation, a potential for turning on the transistor 2612 is supplied as the signal G1. Current flowing through the transistor 2611, that is, current flowing through the wiring ML changes in accordance with the potential of the node n. By sensing this current, the approach or contact of an object can be sensed.

As each of the transistors 2611, 2612, and 2613, the transistor described in the above embodiment can be used. In particular, by using the transistor described in the above embodiment as the transistor 2613, the potential of the node n can be held for a long time and the frequency of operation of resupplying VRES to the node n (refresh operation) can be reduced.

Embodiment 5

In this embodiment, a display method which the display device of one embodiment of the present invention can employ will be described with reference to FIGS. 45A and 45B, FIGS. 46A and 46B, FIGS. 47A to 47E, and FIGS. 48A to 48E.

Note that the display device of one embodiment of the present invention may include an information processing portion, an arithmetic portion, a memory portion, a display portion, an input portion, and the like.

The power consumption of the display device of one embodiment of the present invention can be reduced by reducing the number of times of writing signals of the same image (still image) that is displayed continuously (also referred to as refresh operation). Note that the frequency of refresh operation is referred to as a refresh rate (or scan frequency or vertical synchronization frequency). A display device in which the refresh rate is reduced and which causes little eye fatigue will be described below.

The eye fatigue is classified into two categories: nervous fatigue and muscle fatigue. The nervous fatigue is caused by prolonged looking at light emitted from a display device or blinking images, whose brightness stimulates and fatigues the retina, the optic nerve, and the brain. The muscle fatigue is caused by overuse of a ciliary muscle which works for adjusting the focus.

Figure 45A:
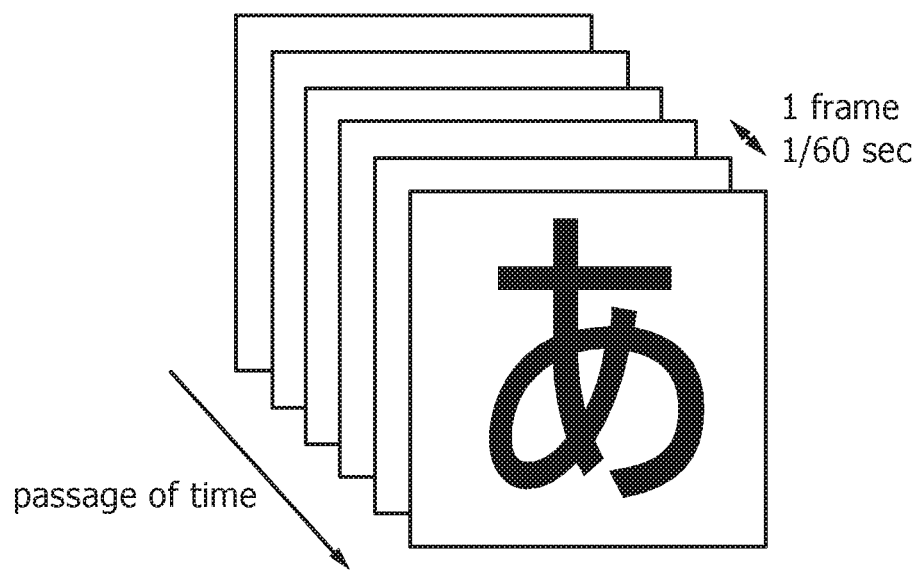
FIGS. 45A and 45B are schematic views for describing one embodiment of the present invention.

FIG. 45A schematically illustrates a display method of a conventional display device. As illustrated in FIG. 45A, in the conventional display device, image rewriting is performed 60 times per second. A prolonged looking at such a screen might stimulate the retina, the optic nerve, and the brain of the user and lead to eye fatigue.

In the display device of one embodiment of the present invention, a transistor including an oxide semiconductor, for example, a transistor including a CAAC-OS is used for a pixel portion. The off-state current of the transistor is extremely low. Thus, the luminance of the display device can be maintained even when the refresh rate is lowered.

Figure 45B:
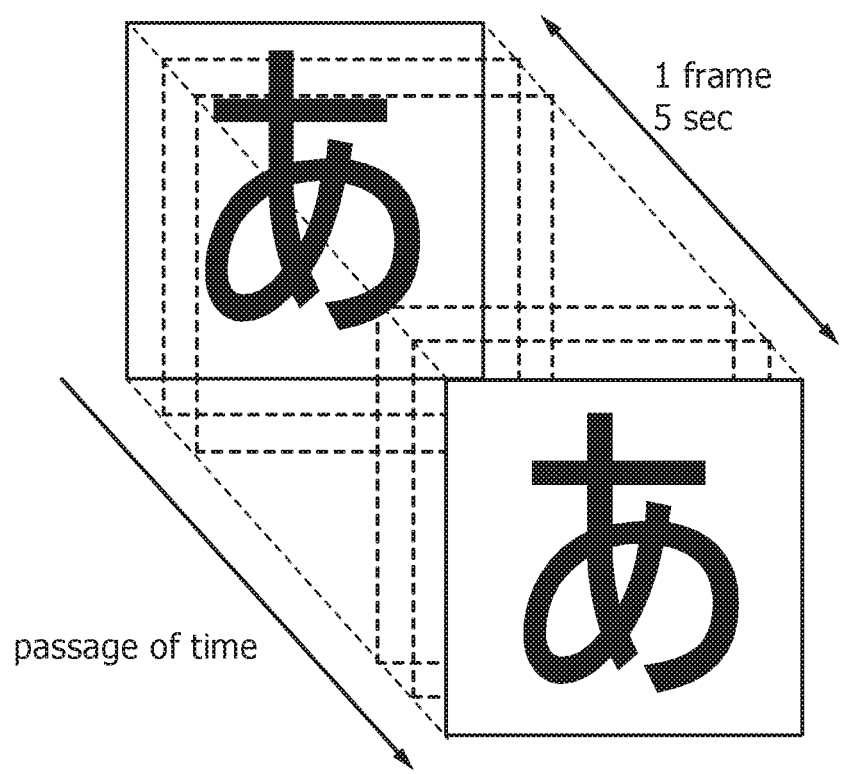

Thus, for example, the number of times of image rewriting can be reduced to once every five seconds as illustrated in FIG. 45B. This enables the user to see the same one image as long as possible, so that flickers on the screen perceived by the user are reduced. Consequently, a stimulus to the retina, the optic nerve, and the brain of the user is reduced, resulting in less nervous fatigue.

Figure 46A:
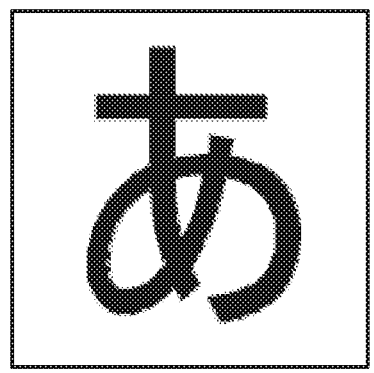
FIGS. 46A and 46B are schematic views for describing one embodiment of the present invention.

In the case where the size of each pixel is large (e.g., the resolution is lower than 150 ppi), a blurred character is displayed on the display device as illustrated in FIG. 46A. When the user looks at the blurred character displayed on the display device for a long time, the ciliary muscle keeps working to adjust the focus with difficulty, which might lead to eye strain.

Figure 46B:
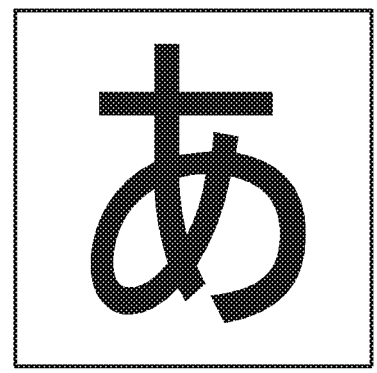

In contrast, as illustrated in FIG. 46B, the display device of one embodiment of the present invention is capable of high-resolution display because the size of each pixel is small; thus, precise and smooth display can be achieved. In this case, the ciliary muscle can easily adjust the focus, so that the muscle fatigue of the user is reduced. When the resolution of the display device is 150 ppi or higher, preferably 200 ppi or higher, further preferably 300 ppi or higher, the muscle fatigue of the user can be effectively reduced.

Methods for quantifying eye fatigue have been studied. For example, critical flicker (fusion) frequency (CFF) is known as an indicator for evaluating nervous fatigue. Furthermore, accommodation time, near point distance, and the like are known as indicators for evaluating muscle fatigue.

Examples of other methods for evaluating eye fatigue include electroencephalography, thermography, counting the number of times of blinking, measuring the amount of tears, measuring the speed of contractile response of the pupil, and questionnaires for surveying subjective symptoms.

For example, the method for driving the display device of one embodiment of the present invention can be examined by any of the variety of methods above.

<Display Method of Display Device>

A display method of the display device of one embodiment of the present invention will be described with reference to FIGS. 47A to 47E.

[Display Example of Image Information]

An example in which two images including different image information are displayed while being moved will be described below.

Figure 47A:
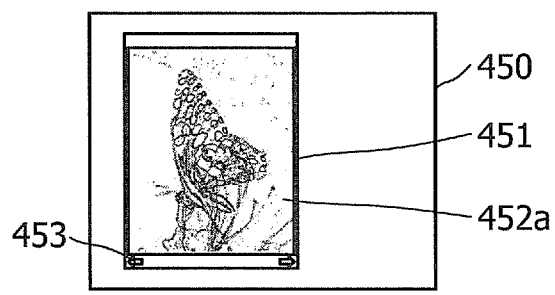
FIGS. 47A to 47E are schematic views for describing one embodiment of the present invention.

In an example illustrated in FIG. 47A, a window 451 and a first image 452a which is a still image displayed in the window 451 are displayed on a display portion 450.

At this time, display is preferably performed at a first refresh rate. Note that the first refresh rate can be higher than or equal to $1.16 \times 10^{-5}$ Hz (about once a day) and lower than or equal to 1 Hz, higher than or equal to $2.78 \times 10^{-4}$ Hz (about once an hour) and lower than or equal to 0.5 Hz, or higher than or equal to $1.67 \times 10^{-2}$ Hz (about once a minute) and lower than or equal to 0.1 Hz.

When the frequency of rewriting the screen is reduced by setting the first refresh rate to an extremely small value, display with substantially no flicker can be achieved and eye fatigue of the user can be more effectively reduced.

The window 451 is displayed by, for example, executing application software for image display and includes a display region in which an image is displayed.

Furthermore, in a lower part of the window 451, a button 453 for switching displayed image information from one to another. When the user selects the button 453, an instruction for moving an image can be supplied to the information processing portion of the display device.

Note that the way the user operates the display device may be determined in accordance with an input unit. For example, in the case where a touch panel provided to overlap with the display portion 450 is used as an input unit, it is possible to perform touch operation of the button 453 with a finger, a stylus, or the like or input operation by a gesture to slide an image. In the case where the input operation is performed by a gesture or sound, the button 453 is not necessarily displayed.

Figure 47B:
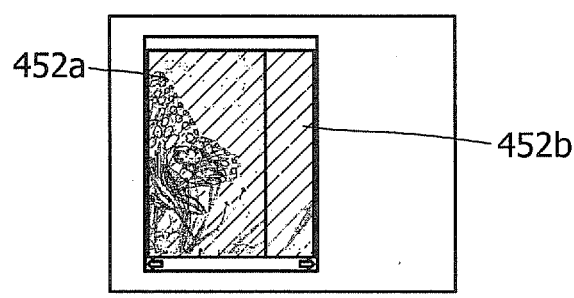

When the information processing portion of the display device receives the instruction for moving an image, movement of the image displayed in the window 451 starts (FIG. 47B).

In the case where display is performed at the first refresh rate in the state in FIG. 47A, the refresh rate is preferably changed to a second refresh rate before the image is moved. The second refresh rate is a value necessary for displaying a moving image. For example, the second refresh rate can be higher than or equal to 30 Hz and lower than or equal to 960 Hz, preferably higher than or equal to 60 Hz and lower than or equal to 960 Hz, further preferably higher than or equal to 75 Hz and lower than or equal to 960 Hz, still further preferably higher than or equal to 120 Hz and lower than or equal to 960 Hz, yet still further preferably higher than or equal to 240 Hz and lower than or equal to 960 Hz.

When the second refresh rate is set to a value larger than that of the first refresh rate, a moving image can be displayed more smoothly and naturally. In addition, a flicker which accompanies rewriting is less likely to be perceived by the user, so that eye fatigue of the user can be reduced.

At this time, an image in which the first image 452a and a second image 452b that is to be displayed next are combined is displayed in the window 451. Part of the combined image is displayed in the window 451 while being moved in one direction (leftward in this case).

As the combined image is moved, the luminance of the image displayed in the window 451 is gradually decreased from the initial luminance (the luminance in the state in FIG. 47A).

Figure 47C:
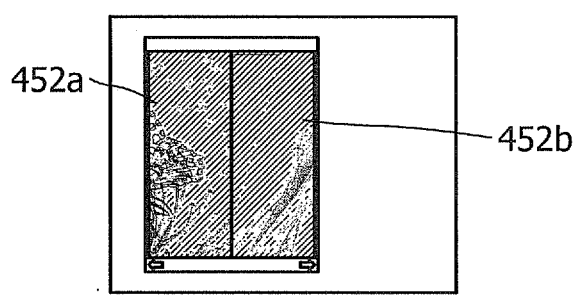

FIG. 47C illustrates a state in which the image displayed in the window 451 reaches predetermined coordinates. Thus, the luminance of the image displayed in the window 451 is lowest at this time.

The predetermined coordinates in FIG. 47C are set to, but not limited to, coordinates where half of the first image 452a and half of the second image 452b are displayed; it is preferable that the user be able to set the predetermined coordinates freely.

For example, the predetermined coordinates may be set such that the ratio of the distance from the initial coordinates of the image to the distance between the initial coordinates and the final coordinates is greater than 0 and less than 1.

It is also preferable that the user be able to freely set the luminance at the time when the image reaches the predetermined coordinates. For example, the ratio of the luminance at the time when the image reaches the predetermined coordinates to the initial luminance may be greater than or equal to 0 and less than 1, preferably greater than or equal to 0 and less than or equal to 0.8, further preferably greater than or equal to 0 and less than or equal to 0.5.

Figure 47D:
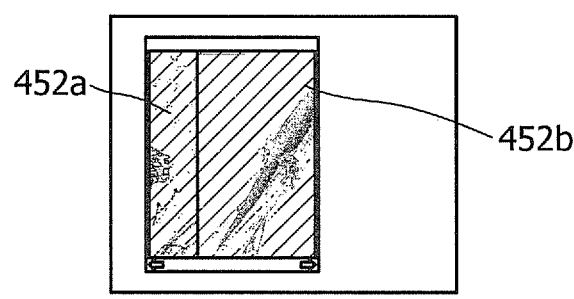

Next, the combined image displayed in the window 451 is moved while the luminance is gradually increased (FIG. 47D)

Figure 47E:
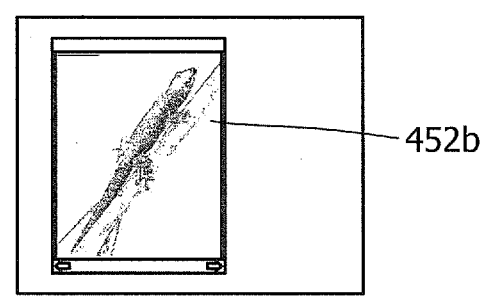

FIG. 47E illustrates a state in which the combined image reaches the final coordinates. In the window 451, only the second image 452b is displayed at a luminance equal to the initial luminance.

After the movement of the image is completed, the refresh rate is preferably changed from the second refresh rate to the first refresh rate.

Since the luminance of an image is lowered in this display mode, the user's eyes are less likely to suffer from fatigue even when following the movement of the image. Thus, such a driving method can achieve eye-friendly display.

[Display Example of Document Information]

Next, an example in which document information whose dimension is larger than that of a display window is displayed while being scrolled will be described below.

Figure 48A:
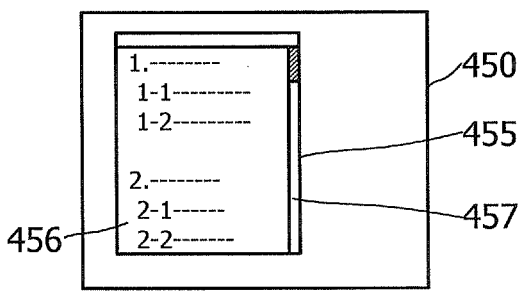
FIGS. 48A to 48E are schematic views for describing one embodiment of the present invention.

In an example illustrated in FIG. 48A, a window 455 and part of document information 456 which is a still image displayed in the window 455 are displayed on the display portion 450.

At this time, display is preferably performed at the first refresh rate.

The window 455 is displayed by, for example, executing application software for document display, application software for document preparation, or the like and includes a display region in which document information is displayed.

The dimension of an image of the document information 456 is larger than that of the display region of the window 455 in the longitudinal direction. Therefore, only part of the document information 456 is displayed in the window 455. As illustrated in FIG. 48A, the window 455 may be further provided with a scroll bar 457 indicating which part of the document information 456 is displayed.

Figure 48B:
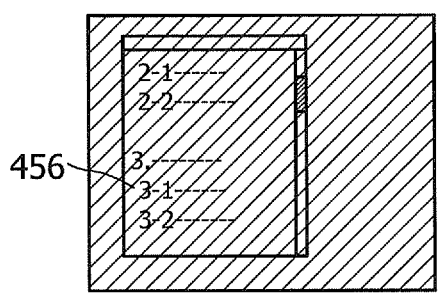

When an instruction for moving an image (here, also referred to as a scroll instruction) is supplied from the input portion to the display device, movement of the document information 456 starts (FIG. 48B). In addition, the luminance of the displayed image is gradually lowered.

In the case where display is performed at the first refresh rate in the state in FIG. 48A, the refresh rate is preferably changed to the second refresh rate before the document information 456 is moved.

In this state, not only the luminance of the image displayed in the window 455 but also the luminance of the whole image displayed on the display portion 450 is lowered.

Figure 48C:
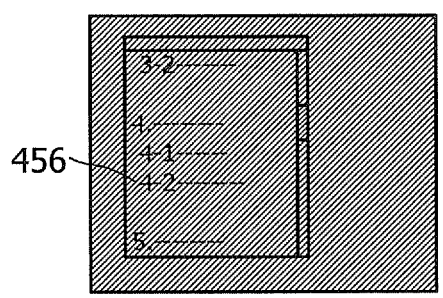

FIG. 48C illustrates a state in which the document information 456 reaches predetermined coordinates. At this time, the luminance of the whole image displayed on the display portion 450 is lowest.

Figure 48D:
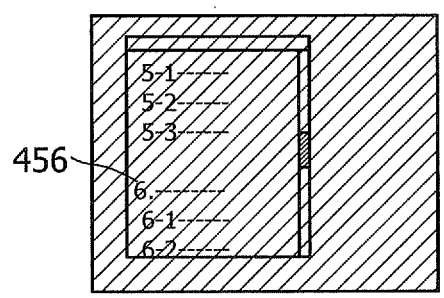

Next, the document information 456 is displayed in the window 455 while being moved (FIG. 48D). Under this condition, the luminance of the whole image displayed on the display portion 450 is gradually increased.

Figure 48E:
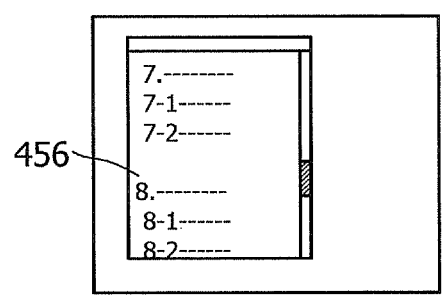

FIG. 48E illustrates a state in which the document information 456 reaches final coordinates. In the window 455, a region of the document information 456, which is different from the region displayed in the initial state, is displayed at a luminance equal to the initial luminance.

After the movement of the document information 456 is completed, the refresh rate is preferably changed to the first refresh rate.

Since the luminance of an image is lowered in this display mode, the user's eyes are less likely to suffer from fatigue even when following the movement of the image. Thus, such a driving method can achieve eye-friendly display.

In particular, display of document information or the like, which has high contrast, can cause serious eye fatigue of the user; thus, it is preferable to apply such a driving method to the display of document information.

Embodiment 6

In this embodiment, an external view of a display device including the pixel described in the above embodiment and examples of electronic devices each including the display device will be described.

<External View of Display Device>

Figure 49A:
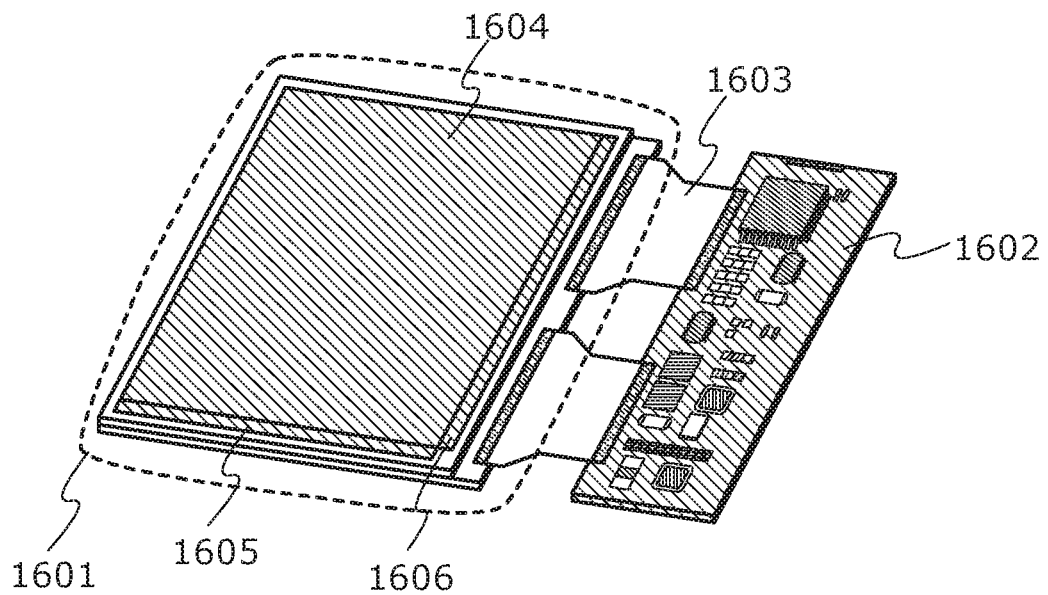
FIGS. 49A and 49B are each a perspective view for describing one embodiment of the present invention.

FIG. 49A is a perspective view illustrating an example of an external view of a display device. The display device in FIG. 49A includes a panel 1601, a circuit board 1602 provided with a controller, a power supply circuit, an image processing circuit, an image memory, a CPU, and the like, and a connection portion 1603. The panel 1601 includes a pixel portion 1604 including a plurality of pixels, a driver circuit 1605 that selects pixels row by row, and a driver circuit 1606 that controls input of a data voltage to the pixels in a selected row.

A variety of signals and power supply potentials are input from the circuit board 1602 to the panel 1601 through the connection portion 1603. As the connection portion 1603, a flexible printed circuit (FPC) or the like can be used. The chip-mounted FPC is referred to as a COF tape, which achieves higher-density packaging in a smaller area. In the case where a COF tape is used for the connection portion 1603, some circuits in the circuit board 1602 or part of the driver circuit 1605 or part of the driver circuit 1606 included in the panel 1601, or the like may be formed on a chip separately prepared, and the chip may be connected to the COF tape by a chip on film (COF) method.

Figure 49B:
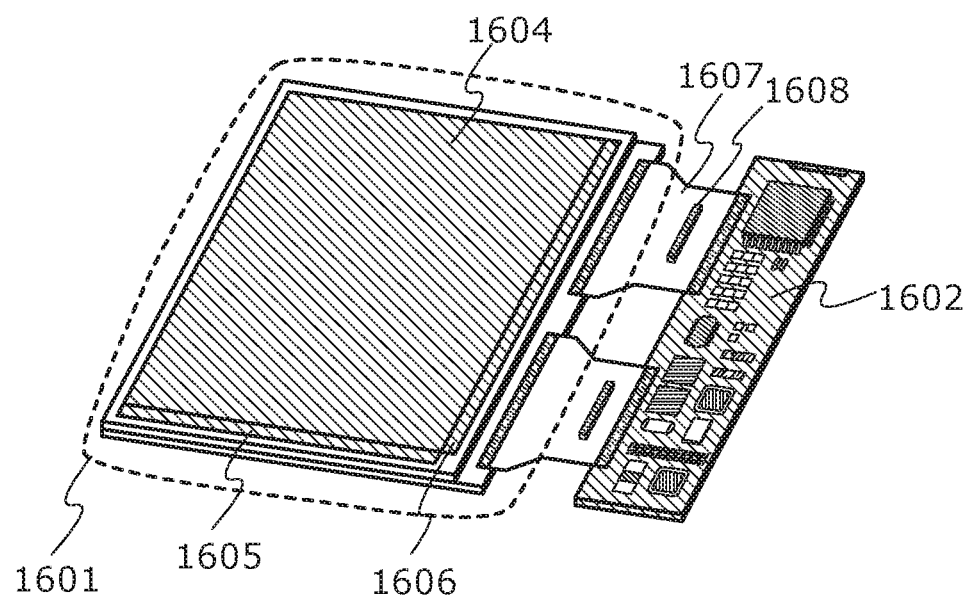

FIG. 49B is a perspective view illustrating an example of an external view of a display device using a COF tape 1607.

A chip 1608 is a semiconductor bare chip (e.g., IC or LSI) having a terminal such as a bump on its surface. Furthermore, CR components can be mounted on the COF tape 1607, so that the area of the circuit board 1602 can be reduced. A flexible substrate has a plurality of wiring patterns corresponding to terminals of the chip to be mounted. The chip 1608 is placed at a predetermined position on the flexible substrate having wiring patterns and then mounted by thermocompression bonding with a bonding apparatus or the like.

One embodiment of the present invention is not particularly limited to the example in FIG. 49B, in which one chip 1608 is mounted on one COF tape 1607. Although a plurality of lines of chips can be mounted on one or both sides of one COF tape 1607, the number of mounted chips is desirably reduced for cost reduction; specifically, the number of lines is preferably one, and further preferably, the number of chips is one.

<Structural Example of Electronic Device>

Next, electronic devices each including the display device will be described.

The display device of one embodiment of the present invention can be used for display devices, laptop computers, and image reproducing devices provided with recording media (typically, devices which reproduce the content of recording media such as digital versatile discs (DVDs) and have displays for displaying the reproduced images). Other examples of an electronic device that can include the display device of one embodiment of the present invention are mobile phones, portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 50A to 50F illustrate specific examples of these electronic devices.

Figure 50A:
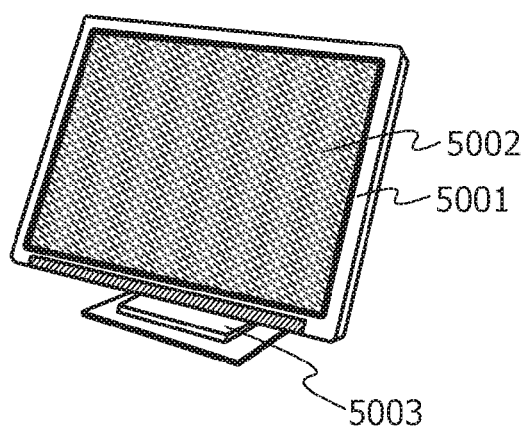
FIGS. 50A to 50F each illustrate an electronic device of one embodiment of the present invention.

FIG. 50A illustrates a display device including a housing 5001, a display portion 5002, a supporting base 5003, and the like. The display device of one embodiment of the present invention can be used for the display portion 5002.

Note that the category of the display device includes all display devices for displaying information, such as display devices for a personal computer, TV broadcast reception, and advertisement display.

Figure 50B:
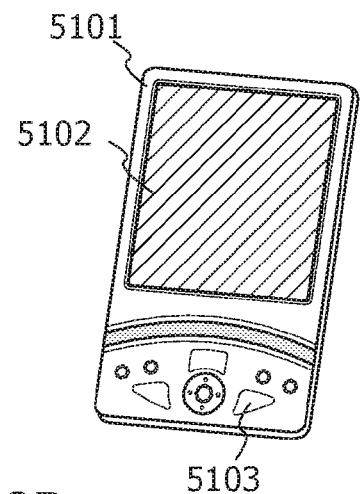

FIG. 50B illustrates a portable information terminal including a housing 5101, a display portion 5102, an operation key 5103, and the like. The display device of one embodiment of the present invention can be used for the display portion 5102.

Figure 50C:
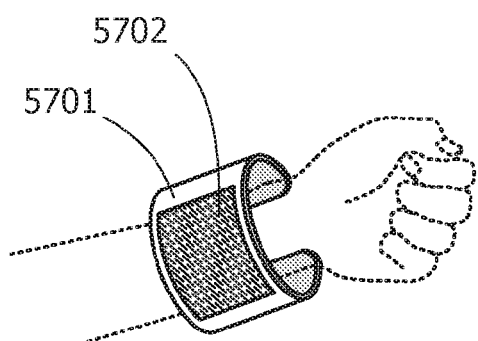

FIG. 50C illustrates a display device including a housing 5701 having a curved surface, a display portion 5702, and the like. When a flexible substrate is used for the display device of one embodiment of the present invention, the display device can be used for the display portion 5702 supported by the housing 5701 having a curved surface; thus, a user-friendly display device that is flexible and lightweight can be provided.

Figure 50D:
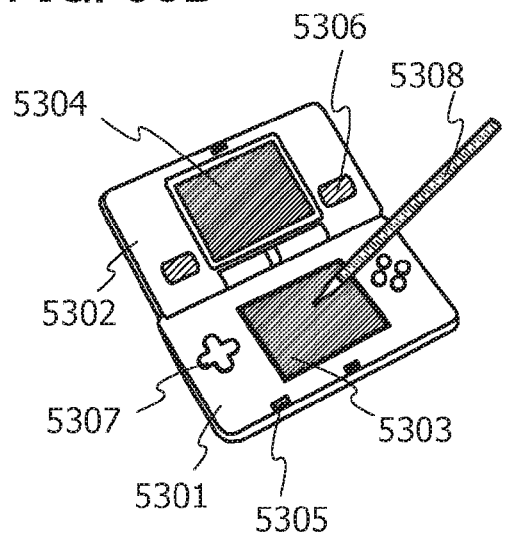

FIG. 50D illustrates a portable game console including a housing 5301, a housing 5302, a display portion 5303, a display portion 5304, a microphone 5305, a speaker 5306, an operation key 5307, a stylus 5308, and the like. The display device of one embodiment of the present invention can be used for the display portion 5303 or the display portion 5304. When the display device of one embodiment of the present invention is used for the display portion 5303 or the display portion 5304, a user-friendly portable game console whose quality hardly deteriorates can be provided. Although the portable game console in FIG. 50D includes two display portions 5303 and 5304, the number of display portions included in the portable game console is not limited to two.

Figure 50E:
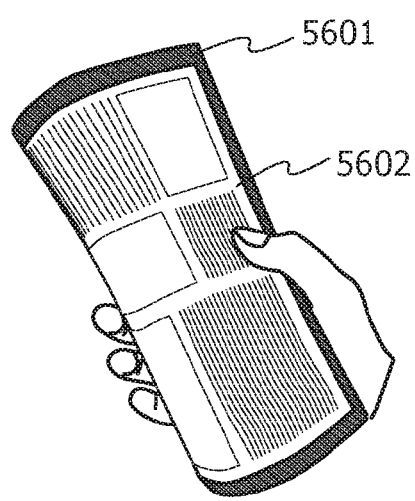

FIG. 50E illustrates an e-book reader including a housing 5601, a display portion 5602, and the like. The display device of one embodiment of the present invention can be used for the display portion 5602. The use of a flexible substrate can give flexibility to the display device; thus, a flexible and lightweight e-book reader can be provided.

Figure 50F:
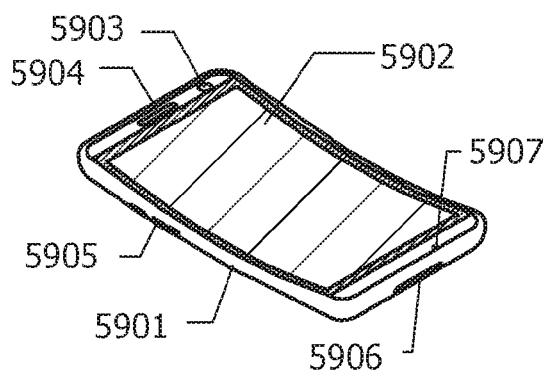

FIG. 50F illustrates a mobile phone including a housing 5901 provided with a display portion 5902, a microphone 5907, a speaker 5904, a camera 5903, an external connection portion 5906, and an operation button 5905. The display device of one embodiment of the present invention can be used for the display portion 5902. When the display device of one embodiment of the present invention is formed over a flexible substrate, the display device can be used for the display portion 5902 having a curved surface as illustrated in FIG. 50F.

(Notes on the Description of the Specification and the Like)

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structural examples is described in one embodiment, some of the structural examples can be combined as appropriate.

Note that a content (or part of the content) described in an embodiment can be applied to, combined with, or replaced by a different content (or part of the different content) described in the embodiment and/or a content (or part of the content) described in another embodiment.

In each embodiment, a content described in the embodiment is a content described with reference to a variety of diagrams or a content described with text in the specification.

By combining a diagram (or part thereof) illustrated in one embodiment with another part of the diagram, a different diagram (or part thereof) illustrated in the embodiment, and/or a diagram (or part thereof) illustrated in another embodiment, much more diagrams can be created.

One embodiment of the present invention is not limited to the embodiments described in Embodiments 1 to 6. For example, one embodiment of the present invention is not limited to the example described as one embodiment of the present invention in Embodiment 2, in which a channel formation region of a transistor such as the transistor 102 includes an oxide semiconductor or silicon. Depending on circumstances or conditions, various transistors or a channel formation region, a source region, a drain region, or the like of a transistor of one embodiment of the present invention may include various semiconductors. For example, at least one of silicon, germanium, silicon germanium, silicon carbide, gallium arsenide, aluminum gallium arsenide, indium phosphide, gallium nitride, and an organic semiconductor may be used.

Notes on the Description of Drawings

In this specification and the like, terms for describing arrangement, such as "over" and "under", are used for convenience to describe a positional relation between components with reference to drawings. The positional relation between components is changed as appropriate in accordance with the direction in which the components are described. Therefore, terms for describing arrangement are not limited to those used in the specification and can be appropriately reworded depending on the situation.

The term "over" or "under" does not necessarily mean that a component is placed directly above or directly below and directly in contact with another component. For example, the expression "an electrode B over an insulating layer A" does not necessarily mean that the electrode B is above and in direct contact with the insulating layer A and can mean the case where another component is provided between the insulating layer A and the electrode B.

In a block diagram in this specification and the like, components are classified into independent blocks in accordance with their functions. In an actual circuit or the like, however, it may be difficult to separate components in accordance with their functions; thus, one circuit may be associated with a plurality of functions or several circuits may be associated with one function. Therefore, the segmentation of blocks in a block diagram is not limited by components described in the specification and can be differently determined as appropriate depending on the situation.

In the drawings, the size, the layer thickness, or the region is determined arbitrarily for description convenience. Therefore, one embodiment of the present invention is not limited to such a scale. Note that the drawings are schematically illustrated for clarity, and shapes or values are not limited to those illustrated in the drawings. For example, the following can be included: variation in signal, voltage, or current due to noise or difference in timing.

In drawings such as a top view (also referred to as a plan view or a layout view) and a perspective view, some components are not illustrated for clarity of the drawings in some cases.

Notes on Expressions that can be Rephrased

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Furthermore, the term "electrode" or "wiring" can also mean a combination of a plurality of "electrodes" or "wirings".

In this specification and the like, "voltage" and "potential" can be replaced with each other as appropriate. A voltage refers to a potential difference from a reference potential. When the reference potential is a ground voltage, for example, the term "voltage" can be replaced with the term "potential". The ground potential does not necessarily mean 0 V. Since a potential is a relative value, a potential supplied to a wiring or the like is changed depending on the reference potential in some cases.

In this specification and the like, the terms "film" and "layer" can be interchanged with each other depending on the situation or circumstances. For example, in some cases, the term "conductive film" can be used instead of the term "conductive layer," and the term "insulating layer" can be used instead of the term "insulating film".

In this specification and the like, a 2T1C circuit configuration in which each pixel includes two transistors and one capacitor is described; however, one embodiment of the present invention is not limited to thereto. A circuit configuration in which each pixel includes three or more transistors and two or more capacitors may also be employed. A variety of circuit configurations including an additional wiring may also be used.

Notes on Definitions of Terms

The following are definitions of the terms mentioned in the above embodiments.

[Switch]

In this specification and the like, a switch is turned on or off (brought into an on state or an off state) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, the "on state" of the transistor refers to a state in which a source and a drain of the transistor are electrically short-circuited. The "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes a mechanically movable electrode whose movement controls the on/off of the switch.

[Channel Length]

The channel length in this specification and the like refers to, for example, in a top view of a transistor, the distance between a source and a drain in a region in which a semiconductor (or a portion of the semiconductor in which current flows when the transistor is in an on state) and a gate electrode overlap with each other or in a region in which a channel is formed.

The channel length of a transistor is not necessarily constant in all regions. In other words, the channel length of a transistor is not limited to one value in some cases. Therefore, in this specification, the channel length is any one value, the maximum value, the minimum value, or the average value in a region in which a channel is formed.

[Channel Width]

The channel width in this specification and the like refers to, for example, the length of a portion where a source and a drain face each other in a region in which a semiconductor (or a portion of the semiconductor in which current flows when a transistor is in an on state) and a gate electrode overlap with each other or in a region in which a channel is formed.

The channel width of a transistor is not necessarily constant in all regions. In other words, the channel width of a transistor is not limited to one value in some cases. Therefore, in this specification, the channel width is any one value, the maximum value, the minimum value, or the average value in a region in which a channel is formed.

Depending on the transistor structure, the channel width in a region in which a channel is actually formed (hereinafter referred to as an effective channel width) is different from the channel width shown in a top view of the transistor (hereinafter referred to as an apparent channel width) in some cases. For example, in a transistor with a three-dimensional structure, the effective channel width is larger than the apparent channel width shown in a top view of the transistor, and an influence of the effective channel width cannot be ignored in some cases. For example, in a miniaturized transistor with a three-dimensional structure, the proportion of a channel region formed on a side surface of a semiconductor is high in some cases. In this case, the effective channel width, that is, the width of an actually formed channel is larger than the apparent channel width shown in a top view.

In some cases, the effective channel width of a transistor with a three-dimensional structure is difficult to estimate on the basis of measurement. For example, estimation of the effective channel width from a design value requires an assumption that the shape of a semiconductor is known. Therefore, in the case where the shape of the semiconductor is uncertain, it is difficult to measure the effective channel width accurately.

Therefore, in this specification, in a top view of a transistor, an apparent channel width that is the length of a portion where a source and a drain face each other in a region in which a semiconductor and a gate electrode overlap with each other may be referred to as a surrounded channel width (SCW). In this specification, the simple term "channel width" may denote the surrounded channel width or the apparent channel width. Alternatively, in this specification, the simple term "channel width" may denote the effective channel width. Note that the values of the channel length, the channel width, the effective channel width, the apparent channel width, the surrounded channel width, and the like can be determined by obtaining and analyzing a cross-sectional TEM image or the like.

Note that the surrounded channel width may be used to calculate the field-effect mobility, the current value per channel width, and the like of a transistor. In this case, the values may be different from those calculated using the effective channel width.

[Pixel]

In this specification and the like, one pixel refers to one element whose brightness can be controlled, for example. Therefore, for example, one pixel expresses one color element by which brightness is expressed. Accordingly, in a color display device including color elements of R (red), G (green), and B (blue), the smallest unit of an image is formed of three pixels: an R pixel, a G pixel, and a B pixel.

Note that the number of color elements is not limited to three and may be larger than three. For example, RGBW (W: white) may be employed, or yellow, cyan, or magenta may be added to RGB.

[Display Element]

In this specification and the like, a display element like the light-emitting element 104 includes a display medium whose contrast, luminance, reflectivity, transmittance, or the like is changed by electrical or magnetic effect. Examples of the display element include an electroluminescent (EL) element, an LED chip (e.g., a white LED chip, a red LED chip, a green LED chip, or a blue LED chip), a transistor (a transistor that emits light depending on current), an electron emitter, a display element including a carbon nanotube, a liquid crystal element, electronic ink, an electrowetting element, an electrophoretic element, a plasma display panel (PDP), a display element using micro electro mechanical systems (MEMS) (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), and quantum dots. An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including electronic ink, Electronic Liquid Powder (registered trademark), or an electrophoretic element is electronic paper. An example of a display device including quantum dots in each pixel is a quantum dot display. Note that quantum dots may also be provided not as display elements but as part of a backlight. The use of quantum dots enables display with high color purity. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption. In the case where an LED chip is used, graphene or graphite may be provided under an electrode or a nitride semiconductor of the LED chip. Graphene or graphite may be a multilayer film in which a plurality of layers is stacked. The provision of graphene or graphite enables easy deposition of a nitride semiconductor thereover, such as an n-type GaN semiconductor layer including crystals. Furthermore, a p-type GaN semiconductor layer including crystals or the like can be provided thereover, and thus, the LED chip can be formed. Note that an AlN layer may be provided between the n-type GaN semiconductor layer including crystals and graphene or graphite. The GaN semiconductor layers included in the LED chip may be deposited by MOCVD. When graphene is provided, the GaN semiconductor layers included in the LED chip can also be deposited by a sputtering method. In a display element using micro electro mechanical systems (MEMS), a drying agent may be provided in a space in which the display element is sealed (e.g., between an element substrate provided with the display element and a counter substrate facing the element substrate). The drying agent can prevent moisture from inhibiting the operation of MEMS or the like or causing the deterioration thereof.

[Connection]

In this specification and the like, the expression "A and B are connected" means the case where A and B are electrically connected to each other in addition to the case where A and B are directly connected to each other. Here, the expression "A and B are electrically connected" indicates that electric signals can be transmitted and received between A and B when an object having any electrical function exists between A and B.

Any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expression include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to these examples, a source (or a first terminal or the like) and a drain (or a second terminal or the like) of a transistor can be distinguished from each other to determine the technical scope.

Other examples of the expression include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least Z1 on a first connection path, the first connection path does not include a second connection path, the second connection path includes a connection path on which the transistor is provided, a drain (or a second terminal or the like) of the transistor is electrically connected to Y at least through Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to these examples, a source (or a first terminal or the like) and a drain (or a second terminal or the like) of a transistor can be distinguished from each other to determine the technical scope.

Note that one embodiment of the present invention is not limited to these expressions which are just examples. Here, X, Y, Z1, and Z2 each denote an object (e.g., a device, an element, a circuit, a wiring, an electrode, a terminal, a conductive film, or a layer).

This application is based on Japanese Patent Application serial No. 2015-083860 filed with Japan Patent Office on Apr. 16, 2015, the entire contents of which are hereby incorporated by reference.

What is claimed is:
1. A display device comprising:
a first switch;
a second switch;
a third switch;
a first transistor;
a capacitor;
a light-emitting element;
a first wiring electrically connected to one terminal of the second switch; and
a second wiring electrically connected to one terminal of the third switch,
wherein a first electrode of the capacitor is electrically connected to a gate of the first transistor,
wherein a second electrode of the capacitor is electrically connected to one of a source and a drain of the first transistor and a first electrode of the light-emitting element,
wherein the other of the source and the drain of the first transistor is electrically connected to the other terminal of the second switch and the other terminal of the third switch,
wherein the first wiring is configured to supply current to the light-emitting element,
wherein the second wiring is configured to supply a potential of the other of the source and the drain of the first transistor that becomes lower than a potential supplied to a second electrode of the light-emitting element,
wherein the gate of the first transistor is configured to be supplied with a data voltage by turning on the first switch, and
wherein the other of the source and the drain of the first transistor is configured to be brought into an electrically floating state by turning off the second switch and the third switch in a period in which the data voltage is applied to the gate of the first transistor.

2. The display device according to claim 1, wherein a channel formation region of the first transistor comprises an oxide semiconductor.

3. An electronic device comprising:
the display device according to claim 1; and
an operation portion.

4. The display device according to claim 1, wherein the first switch, the first transistor, the capacitor, and the light-emitting element are included in a pixel.

5. The display device according to claim 1,
wherein the first switch is a second transistor,
wherein the second switch is a third transistor,
wherein the third switch is a fourth transistor, and
wherein a channel formation region of each of the second transistor, the third transistor, and the fourth transistor comprises an oxide semiconductor.

6. A method for driving a display device, the display device comprising:
a first switch;
a second switch;
a third switch;
a first transistor;
a capacitor;
a light-emitting element;
a first wiring electrically connected to one terminal of the second switch; and
a second wiring electrically connected to one terminal of the third switch,
wherein a first electrode of the capacitor is electrically connected to a gate of the first transistor,
wherein a second electrode of the capacitor is electrically connected to one of a source and a drain of the first transistor and a first electrode of the light-emitting element,
wherein the other of the source and the drain of the first transistor is electrically connected to the other terminal of the second switch and the other terminal of the third switch,
wherein the first wiring is configured to supply current to the light-emitting element, and
wherein the second wiring is configured to supply a potential of the other of the source and the drain of the first transistor that becomes lower than a potential supplied to a second electrode of the light-emitting element,
the method comprising the steps of:
holding a threshold voltage of the first transistor by the capacitor in a first period;

holding a sum of the threshold voltage and a voltage corresponding to a data voltage by the capacitor in a second period; and driving the light-emitting element in a third period, wherein, in the first period, the second switch and the third switch are turned off so that the other of the source and the drain of the first transistor is brought into an electrically floating state.

7. The method for driving a display device, according to claim 6, wherein the second switch is turned on so that a potential of the other of the source and the drain of the first transistor becomes higher than a potential supplied to the second electrode of the light-emitting element in the third period.

8. The method for driving a display device, according to claim 6, wherein the first switch, the first transistor, the capacitor, and the light-emitting element are included in a pixel.

9. The method for driving a display device, according to claim 6, wherein a channel formation region of the first transistor comprises an oxide semiconductor.

10. The method for driving a display device, according to claim 6, wherein the first switch is a second transistor,
wherein the second switch is a third transistor,
wherein the third switch is a fourth transistor, and
wherein a channel formation region of each of the second transistor, the third transistor, and the fourth transistor comprises an oxide semiconductor.

11. The method for driving a display device, according to claim 6, wherein the third switch is turned on so that a potential of the other of the source and the drain of the first transistor becomes lower than a potential supplied to the second electrode of the light-emitting element in the first period.

12. A method for driving a display device, the display device comprising:

a first switch;
a second switch;
a first transistor;
a capacitor;
a light-emitting element; and
a wiring electrically connected to one terminal of the second switch,
wherein a first electrode of the capacitor is electrically connected to a gate of the first transistor,
wherein a second electrode of the capacitor is electrically connected to one of a source and a drain of the first transistor and a first electrode of the light-emitting element,
wherein the other of the source and the drain of the first transistor is electrically connected to the other terminal of the second switch, and
wherein the wiring is configured to supply current to the light-emitting element, the method comprising the steps of:

holding a threshold voltage of the first transistor by the capacitor in a first period;
holding the threshold voltage and a voltage corresponding to a data voltage by the capacitor in a second period; and
driving the light-emitting element in a third period,
wherein, in the first period, the second switch is turned on so that a potential of the other of the source and the drain of the first transistor becomes lower than a potential supplied to a second electrode of the light-emitting element, and
wherein, in the second period, the second switch is turned off so that the other of the source and the drain of the first transistor is brought into an electrically floating state.

13. The method for driving a display device, according to claim 12, wherein, in the third period, the second switch is turned on, so that the potential of the other of the source and the drain of the first transistor becomes higher than the potential supplied to the second electrode of the light-emitting element.

14. The method for driving a display device, according to claim 12, wherein the first switch, the first transistor, the capacitor, and the light-emitting element are included in a pixel.

15. The method for driving a display device, according to claim 12, wherein a channel formation region of the first transistor comprises an oxide semiconductor.

16. The method for driving a display device, according to claim 12, wherein the first switch is a second transistor,
wherein the second switch is a third transistor, and
wherein a channel formation region of each of the second transistor and the third transistor comprises an oxide semiconductor.

\* \* \* \* \*